(12) United States Patent
Ooishi et al.

(10) Patent No.: US 6,731,535 B1
(45) Date of Patent: May 4, 2004

(54) NONVOLATILE SEMICONDUCTOR MEMORY DEVICE

(75) Inventors: Tsukasa Ooishi, Hyogo (JP); Shuichi Ueno, Hyogo (JP); Shigehiro Kuge, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/455,523

(22) Filed: Jun. 6, 2003

(30) Foreign Application Priority Data

Dec. 10, 2002 (JP) ........................................ 2000-358560

(51) Int. Cl.⁷ ............................................... G11C 11/14
(52) U.S. Cl. ........................ 365/171; 365/173; 365/51; 365/161; 365/175
(58) Field of Search ................................ 365/171, 173, 365/51, 161, 175

(56) References Cited

U.S. PATENT DOCUMENTS

| 5,439,833 | A | 8/1995 | Hebert et al. |
| 5,640,343 | A | 6/1997 | Gallagher et al. |
| 6,215,140 | B1 * | 4/2001 | Reisinger et al. ............ 257/296 |
| 6,339,544 | B1 | 1/2002 | Chiang et al. |
| 6,552,926 | B2 * | 4/2003 | Komori ....................... 365/158 |
| 6,597,031 | B2 | 7/2003 | Kuge |
| 2003/0076703 | A1 * | 4/2003 | Kim et al. ................... 365/105 |

FOREIGN PATENT DOCUMENTS

| JP | 7-176772 A | 7/1995 |
| JP | 2000-196030 A | 7/2000 |

* cited by examiner

*Primary Examiner*—Van Thu Nguyen
*Assistant Examiner*—Toan Le
(74) *Attorney, Agent, or Firm*—McDermott, Will & Emery

(57) ABSTRACT

A nonvolatile semiconductor memory device includes a silicon substrate, bit lines, word lines, and memory cells. The bit line is positioned above the main surface of the silicon substrate and the word line is provided to intersect the bit line. The memory cell is positioned at a region where the bit line and the word line intersect and has one end electrically connected to the bit line and the other end electrically connected to the word line. The memory cell includes a TMR element and an access diode electrically connected in series. The access diode includes an n-type silicon layer and a p-type silicon layer recrystallized by melting-recrystallization and has a pn junction at the interface between the n-type silicon layer and the p-type silicon layer. As a result, a nonvolatile semiconductor memory device reduced in size and having high performance can be manufactured inexpensively.

8 Claims, 50 Drawing Sheets

NONVOLATILE SEMICONDUCTOR MEMORY DEVICE

BACKGROUND OF THE INVENTION

Field of the Invention

The present invention relates to a nonvolatile semiconductor memory device using a diode as an access element.

Description of the Background Art

Recently, Magnetic Random Access Memory (MRAM) has drawn attention as a next-generation semiconductor memory device in place of Dynamic Random Access Memory (DRAM) or Statistic Random Access Memory (SRAM). This MRAM receives attention as such a nonvolatile semiconductor memory device in that, in theory, a high speed operation comparable to SRAM and a high integration comparable to DRAM can be realized at the same time, and data can be rewritten unlimitedly with low power consumption.

In MRAM, Tunneling Magnetoresistive (TMR) element has been proposed as a memory element storing data. This TMR element includes a Magnetic Tunneling Junction (MTJ) made of two ferromagnetic layers and a thin tunnel insulator layer therebetween, and an antiferromagnetic layer in contact with one of the ferromagnetic layers.

Predominantly, that one of ferromagnetic layers which is in contact with the antiferromagnetic layer is exchange coupled to the antiferromagnetic layer and has a fixed magnetic moment. This ferromagnetic layer is called a fixed layer. On the other hand, that one of ferromagnetic layers which is not in contact with the antiferromagnetic layer has its magnetization direction changed easily by externally applying a magnetic field. These characteristics are utilized to rewrite data into a memory cell. The ferromagnetic layer having a magnetization direction inverted by an external magnetic field is called a free layer.

In the TMR element having the structure described above, the magnetization direction of the free layer with respect to the magnetization direction of the fixed layer is controlled in parallel/antiparallel to vary the resistance value because of the tunneling magneto-resistance effect. In MRAM, this tunneling magneto-resistance effect is utilized to read out data.

Generally, in a nonvolatile semiconductor memory device using TMR elements, memory cells are arranged in rows and columns. The Reference concerning a nonvolatile semiconductor memory device having memory cells arranged in rows and columns includes U.S. Pat. No. 5,640,343. In the nonvolatile semiconductor memory device disclosed in this publication, in a manner corresponding to memory cells arranged in rows and columns, a bit line as a first conductive line is arranged for each column and a word line as a second conductive line is arranged for each row. In an intersection region with a bit line and a word line, a memory cell formed of a TMR element and a diode connected in series is arranged. Here, a diode connected in series to a TMR element is an access diode that functions as an access element to a memory cell.

In the nonvolatile semiconductor memory device having the structure described above, a composite magnetic field formed of magnetic fields in two directions is created by passing current through a bit line and a word line that are selected from a plurality of word lines and bit lines crossing each other. This composite magnetic field is used to rewrite the magnetization direction of the free layer.

On the other hand, in reading data, a word line corresponding to a selected memory cell is set to a low voltage (for example a ground voltage VSS) state. At this point, a bit line is precharged to a high voltage (for example a power supply voltage VCC) state to allow a diode to be rendered conductive and to allow a sense current to flow in the selected MTJ. The data can thus be read. It is noted that in the non-selected memory cell, since the word line is set to a high voltage state to maintain the corresponding diode in a non-conductive state, a sense current does not flow in the non-selected MTJ.

As described above, a so-called one-MTJ+ one-diode type nonvolatile semiconductor memory device having a memory cell formed of one TMR element and one access diode allows the memory cell array area to be smaller than a so-called one-MTJ+ one-transistor type nonvolatile semiconductor memory device using a transistor as an access element, whereby the integration may be improved drastically. Therefore, the nonvolatile semiconductor memory device of one-MTJ+ one-diode type has been developed intensively.

When this one-MTJ+ one-diode type nonvolatile semiconductor memory device is actually formed on a semiconductor substrate, the structural restriction and the process restriction impose limitations on the freedom of its design. Among others, some structures as illustrated below have been proposed.

A first structure has a word line of a metal material formed on a silicon substrate, an n-type silicon layer and a p-type silicon layer successively deposited on the word line, a TMR element formed thereon, and a bit line of a metal material deposited thereon (see for example FIG. 1C of U.S. Pat. No. 5,640,343). In this structure, the n-type silicon layer and the p-type silicon layer form an access diode and an pn junction is formed at their interface. It is noted that a polysilicon layer or an amorphous silicon layer is used as the n-type silicon layer and the p-type silicon layer.

A second structure has a p-type diffusion region and an n-type diffusion region formed on a main surface of a p-type silicon substrate, a TMR element formed on the p-type diffusion region, and a bit line of a metal material deposited thereon (see for example FIGS. 10A–10C of U.S. Pat. No. 5,640,343). In this structure, a word line is formed with the n-type diffusion region, an access diode is formed of the p-type diffusion region and the n-type diffusion region, and a pn junction is formed at their interface.

A third structure has a word line of a metal material formed on a silicon substrate, a TMR element formed on the word line, an n-type silicon layer doped with phosphorus (P) formed thereon, an aluminum layer deposited thereon, and a bit line formed thereon (see for example FIG. 8 of Japanese Patent Laying-Open No. 2000-196030). In this structure, the n-type silicon layer doped with phosphorus and the aluminum layer form a shot key diode. It is noted that a polysilicon layer or an amorphous silicon layer is used as the n-type silicon layer doped with phosphorus.

Although, in the foregoing, MRAM using a magneto-resistance effect element as a memory element applied to a memory cell has been described, a nonvolatile semiconductor memory device having a capacitive memory element applied to a memory cell is known as an alternative nonvolatile semiconductor memory device (see for example FIG. 4 of Japanese Patent Laying-Open No. 7-176772). The nonvolatile semiconductor memory device described in Japanese Patent Laying-Open No. 7-176772 uses an anti-fuse that is a kind of capacitive memory elements, as a memory element, and further uses a diode connected in series to this anti-fuse, as an access element.

In the nonvolatile semiconductor memory device described above, the electric characteristics of the diode employed as an access element is extremely important. For example, in MRAM, the value of the read current in reading data is decided by the relation between a potential difference between a word line and bit line and an resistance value of an access diode and a TMR element. Therefore, the variations in internal resistance of the diode prevents information stored in the TMR element from being read out correctly. The reverse direction characteristics of the individual diode is also important, and variations in leak current may cause an error. In other words, in order to implement a nonvolatile semiconductor memory device using a diode as an access element, it is essential to fabricate an access diode having good electric characteristics with a high production yield.

However, the nonvolatile semiconductor memory device having the first structure described above uses a polysilicon layer or amorphous silicon layer as a semiconductor layer forming an access diode, which leads to a wide range of variations in the electric characteristics of the access diode. The variations in the electric characteristics result from a great number of grains mainly present in these layers and prevent the access diode from fully functioning. Therefore, with the first structure, a nonvolatile semiconductor memory device with high performance is hardly realized.

The nonvolatile semiconductor memory device having the second structure described above uses a diffusion region formed in a semiconductor substrate that is a single-crystal silicon layer as a semiconductor layer forming an access diode, thereby resulting in its excellent electric characteristics. However, since the word line is formed in the diffusion region, it is difficult to pass a sufficient amount of current and to ensure a large S/N ratio. Therefore, with the second structure, a nonvolatile semiconductor memory device with high performance is hardly realized.

The nonvolatile semiconductor memory device having the third structure described above has a shot key diode formed as an access diode, which may be relatively excellent in its electric characteristics as compared with a pn junction diode. However, since the access diode includes a polysilicon layer, a wide range of variations still occurs in the electric characteristics. Therefore, with the third structure, nonvolatile semiconductor memory devices with high performance are hardly fabricated with a high production yield.

Therefore, it has been very difficult to manufacture nonvolatile semiconductor memory devices having reduced memory cell array areas and good characteristics with a high production yield, and the development of the technique that satisfies all of these conditions has been long waited.

SUMMARY OF THE INVENTION

An object of the present invention is to provide a high-performance miniaturized nonvolatile semiconductor memory device that can be manufactured inexpensively.

In accordance with one aspect of the present invention, a nonvolatile semiconductor memory device includes a semiconductor substrate, a first conductive line, a second conductive line, and a memory cell. The semiconductor substrate has a main surface. The first conductive line is positioned above the main surface of the semiconductor substrate. The second conductive line is provided to intersect the first conductive line. The memory cell is positioned at or in proximity to a region where the first conductive line and the second conductive line intersect, and has one end electrically connected to the first conductive line and the other end electrically connected to the second conductive line. The memory cell includes a memory element and an access diode electrically connected in series. The access diode includes a semiconductor layer recrystallized by melting-recrystallization and has a pn junction inside the semiconductor layer.

In accordance with another aspect of the present invention, a nonvolatile semiconductor memory device includes a semiconductor substrate, a first conductive line, a second conductive line, and a memory cell. The semiconductor substrate has a main surface. The first conductive line is positioned above the main surface of the semiconductor substrate. The second conductive line is provided to intersect the first conductive line. The memory cell is positioned at or in proximity to a region where the first conductive line and the second conductive line intersect, and has one end electrically connected to the first conductive line and the other end electrically connected to the second conductive line. The memory cell includes a memory element and an access diode electrically connected in series. The access diode has a first semiconductor layer selectively grown on the main surface of the semiconductor substrate by epitaxial growth and has a pn junction within the first semiconductor layer or at an interface between the first semiconductor layer and the semiconductor substrate.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 6–17 are schematic cross sectional views showing a method of manufacturing a nonvolatile semiconductor memory device in accordance with the first embodiment of the present invention, in which FIGS. 6, 8, 10, 12, 14, and 16 are schematic cross sectional views along the bit line extending direction showing the first step, the second step, the third step, the fourth step, the fifth step, and the sixth step, respectively, and FIGS. 7, 9, 11, 13, 15, and 17 are schematic cross sectional views along the word line extending direction showing the first, the second, the third, the fourth, the fifth, and the sixth step, respectively.

FIGS. 28–42 are schematic cross sectional views showing a method of manufacturing a nonvolatile semiconductor memory device in accordance with the fifth embodiment of the present invention, in which FIGS. 28, 30, 32, 33, 35, 37, 39, and 41 are schematic cross sectional views along the bit line extending direction showing the first step, the second step, the third step, the fourth step, the fifth step, the sixth step, the seventh step, and the eighth step, respectively, and FIGS. 29, 31, 34, 36, 38, 40, and 42 are schematic cross sectional views along the word line extending direction showing the first, the second, the fourth, the fifth, the sixth step, the seventh step, and the eighth step, respectively.

DESCRIPTION OF THE PREFERRED EMBODIMENTS

Figure 1:
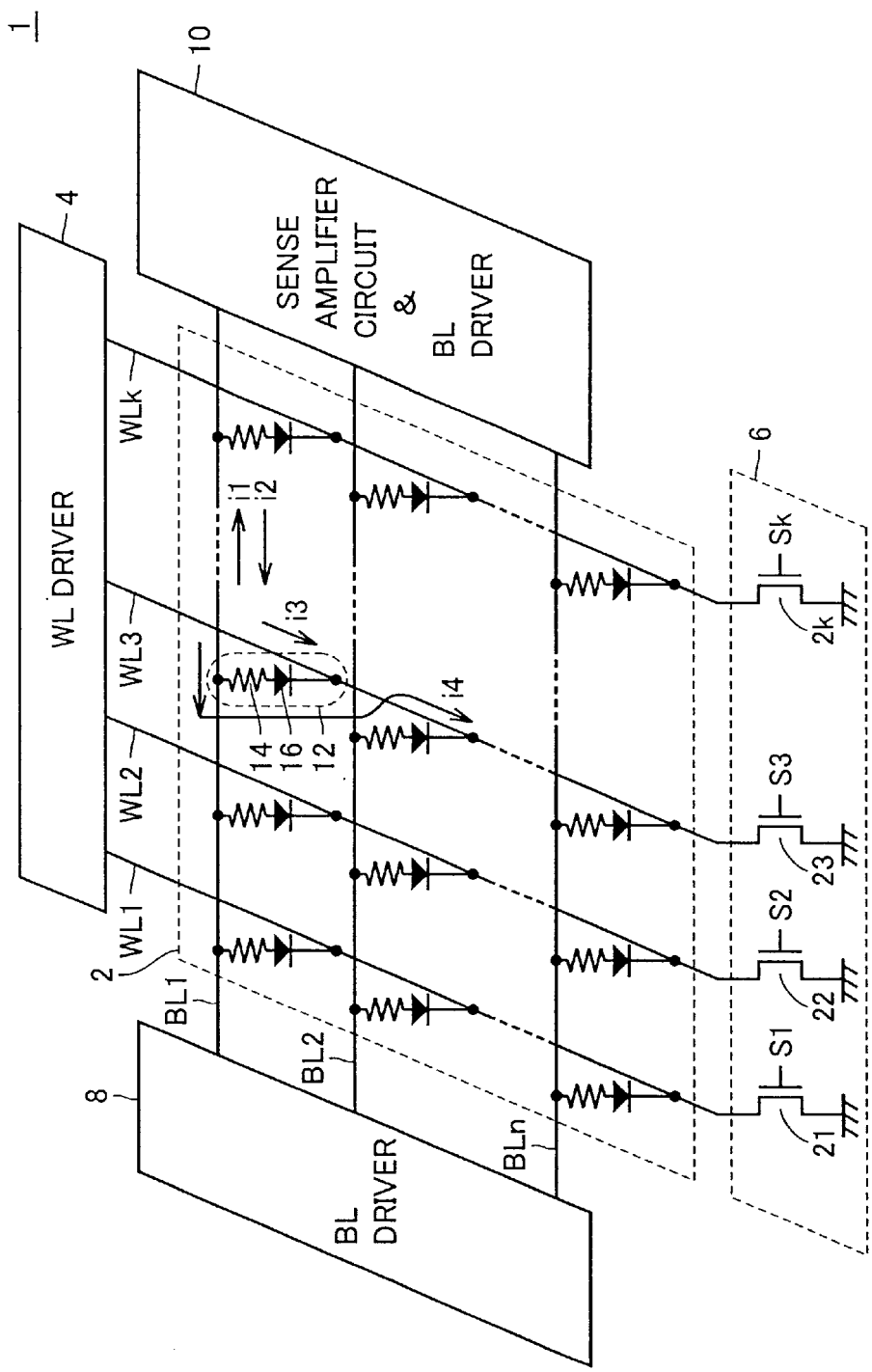
FIG. 1 is a circuit diagram illustrating a main part of a nonvolatile semiconductor memory device in a first embodiment of the present invention.

In the following, embodiments of the present invention will be described in detail with reference to the figures. It is noted that in the figures the same reference characters refer to the same or corresponding components.

First Embodiment

Referring to FIG. 1, a nonvolatile semiconductor memory device 1 includes a memory cell array 2, WL drivers 4 and 6, a BL driver 8, and a sense amplifier circuit & BL driver 10.

Memory cell array 2 includes bit lines BL1–BLn, word lines WL1–WLk provided to intersect bit lines BL1–BLn, and memory cells each provided at each of n×k intersection regions of bit lines BL1–BLn and word lines WL1–WLk.

A memory cell includes a TMR element connected in series between a corresponding bit line and a corresponding word line, and a diode connected to have the forward direction in the direction from the bit line to the word line.

In FIG. 1, a configuration of a memory cell will be described with reference to a memory cell connected in series between bit line BL1 and word line WL3, denoted with a reference numeral 12, by way of representation. Memory cell 12 includes a TMR element 14 and a diode 16 connected in series between bit line BL1 and word line WL3. Diode 16 is connected to have the forward direction in the direction from bit line BL1 toward word line WL3.

The use of diode 16 as an access element can largely reduce a memory cell area as compared with the use of a transistor as an access element. In addition, since the element having a stable pn junction as described later is used as diode 16, the current flowing in the memory cell can be stabilized.

WL driver 6 includes n-channel MOS transistor 21–2$k$ corresponding to word lines WL1–WLk, respectively, and n-channel MOS transistors 21–2$k$ receive respective control signals S1–Sk at their gates.

A data write to memory cell 12 will be described. When data is written into memory cell 12, WL driver 4 activates word line WL3 and inactivates the other word lines to the ground potential. In WL driver 6, control signal S3 is activated and control signals S1, S2, S4–Sk are inactivated. As a result current i3 flows in word line WL3. This current i3 generates a magnetic field in a magnetization hard axis direction of TMR element 14.

Simultaneously, BL driver 8 and sense amplifier circuit & BL driver 10 allow write current i1 or i2 to flow in bit line BL1. Sense amplifier circuit & BL driver 10 operates as a BL driver in writing. Whether write current i1 or write current i2 flows in bit line BL1 depends on data to be written. The write current flowing in bit line BL1 generates a magnetic field in a magnetization easy axis direction of TMR element 14. The direction of the current flowing in bit line BL1 changes the resistance value of TMR element. The changed resistance value allows memory cell 12 to hold data nonvolatally.

A data read from memory cell 12 will now be described.

In reading data, WL driver 4 is not in connection with word line WL3 and BL driver 8 is not in connection with BL1. Sense amplifier circuit & BL driver 10 operates as a sense amplifier and applies a prescribed potential to bit line BL1 so that read current i4 flows into bit line BL1. Read current i4 flows into word line WL3 via memory cell 12 and further into a ground node via an n-channel MOS transistor 23. By determining a magnitude of read current i4 in comparison with a reference value in sense amplifier circuit & BL driver 10, data held in the memory cell is read.

At this time, WL driver 4 sets the word lines other than word line WL3 to a potential equal to or higher than a potential on bit line BL1 so that current does not flow in the other memory cells connected to bit line BL1. Control signals S1, S2, S4–Sk are then inactivated such that current does not flow from the word lines other than word line WS3 toward the ground node.

The structure of the nonvolatile semiconductor memory device having the circuit configuration described above which is actually formed on a semiconductor substrate will be described.

Figure 2:
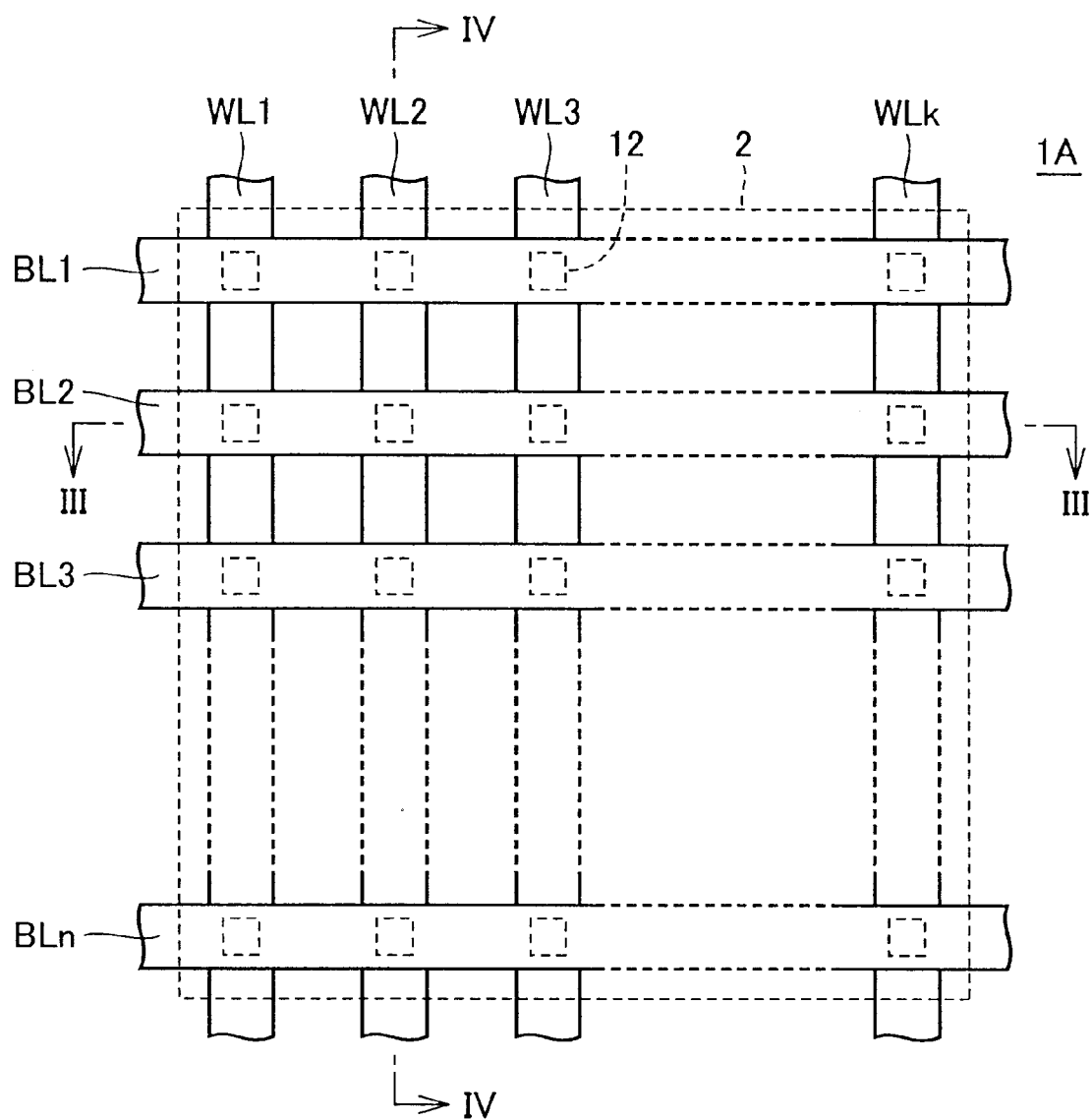
FIG. 2 is a schematic top view of a memory cell array of the nonvolatile semiconductor memory device in the first embodiment of the present invention.

As shown in FIG. 2, in memory cell array 2 of nonvolatile semiconductor memory device 1A in accordance with the present embodiment, corresponding to n×k memory cells 12 arranged in rows and columns, n bit lines BL1–BLn as first conductive lines are arranged approximately parallel for respective rows, and k word lines WL1–WLk as second conductive lines are arranged approximately parallel for respective columns. Therefore, memory cell 12 is arranged at or in proximity to each intersection region of each bit line and each word line. It is noted that in FIG. 2, only word lines, bit lines and memory cells are shown and the other parts are not shown.

Now, referring to FIGS. 3 and 4, the structure of the nonvolatile semiconductor memory device 1A in accordance with the present embodiment will be described in detail.

Figure 3:
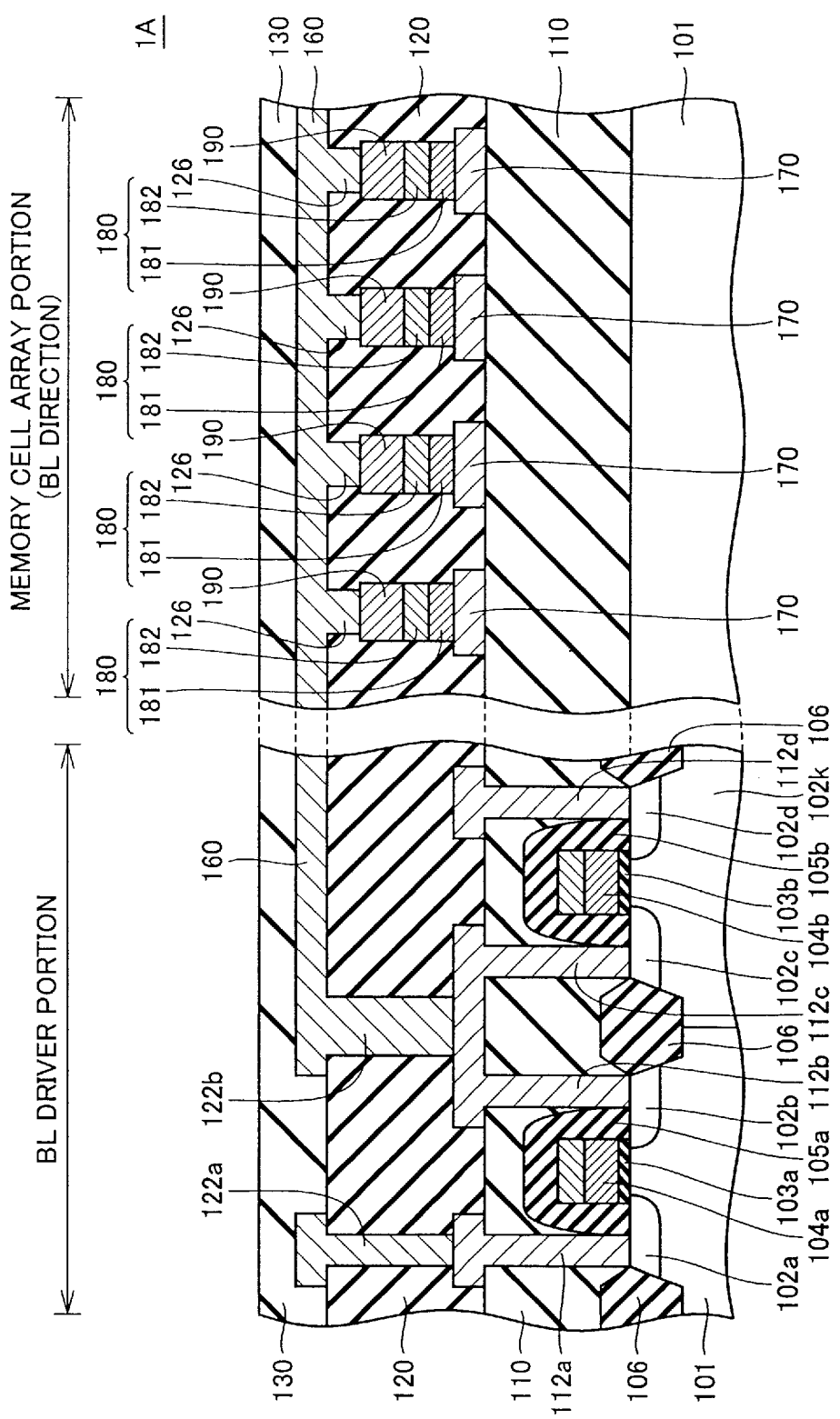
FIG. 3 is a schematic cross sectional view along a bit line extending direction in the nonvolatile semiconductor memory device in the first embodiment of the present invention.
Figure 4:
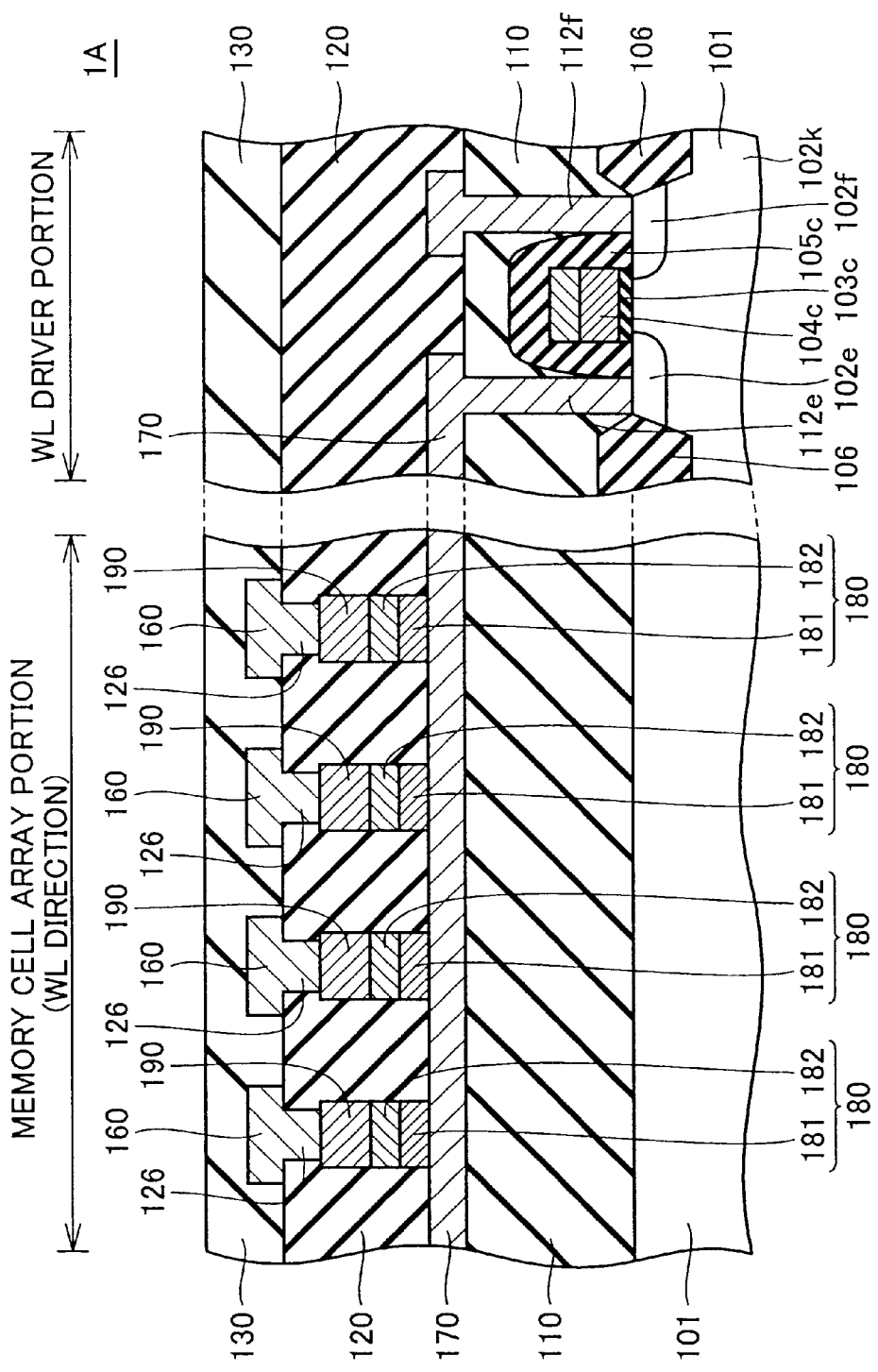
FIG. 4 is a schematic cross sectional view along a word line extending direction in the nonvolatile semiconductor memory device in the first embodiment of the present invention.

First, as shown in FIGS. 3 and 4, nonvolatile semiconductor memory device 1A in the present embodiment includes a memory cell array portion, a BL driver portion, and a WL driver portion. It is noted that the BL driver portion is a portion corresponding to a region where BL driver 8 in FIG. 1 is formed, and the WL driver portion is a portion corresponding to a region where BL driver 6 in FIG. 1 is formed.

In the memory cell array portion, a plurality of memory cells each including a TMR element 190 as a magnetoresistance effect element and an access diode 180 as an access element are formed. TMR element 190 is an element corresponding to reference numeral 14 in the circuit shown in FIG. 1, and access diode 180 is an element corresponding to reference numeral 16 in the circuit shown in FIG. 1.

Furthermore, two field effect transistors for controlling memory cells is formed. These two field effect transistors are a p-channel MOS transistor and an n-channel MOS transistor.

In the WL driver portion, a field effect transistor for controlling memory cells is formed. This field effect transistor is an n-channel MOS transistor.

In the following, the structure of nonvolatile semiconductor memory device 1A in the present embodiment will be described specifically.

As shown in FIG. 3, in the region where the p-channel MOS transistor of BL driver portion is formed, source/drain regions 102a, 102b of the p-channel MOS transistor are formed on a main surface of a p-type silicon substrate 101 as a semiconductor substrate. Source/drain regions 102a, 102b are arranged to oppose to each other with a channel region interposed therebetween. On the channel region between source/drain regions 102a and 102b, a gate electrode 104a is formed with a gate insulating film 103a interposed. This gate electrode 104a is covered with a sidewall insulating film 105a on its top surface and side surfaces.

In the region where the n-channel MOS transistor of BL driver portion is formed, an n-type well region 102k is formed in silicon substrate 101. On a main surface of silicon substrate 101 where the n-type well region 102k is formed, source/drain regions 102c, 102d of the n-channel MOS transistor are formed. Source/drain regions 102c, 102d are arranged to oppose to each other with a channel region interposed therebetween. On the channel region between source/drain regions 102c and 102d, a gate electrode 104b is formed with a gate insulating film 103b interposed. This gate electrode 104b is covered with a sidewall insulating film 105b on its top surface and side surfaces. It is noted that the p-channel MOS transistor and the n-channel MOS transistor, which form the BL driver described above, are isolated from each other by an element-isolating film 106 formed on the main surface of silicon substrate 101.

A first interlayer insulating film 110 is formed on these p-channel MOS transistor and n-channel MOS transistor. In the first interlayer insulating film 110, respective contact holes are formed in regions positioned on source/drain regions 102a–102d. These contact holes are filled with a conductor film to form connecting contacts 112a–112d in the first interlayer insulating film 110. It is noted that connecting contact 112b is connected to connecting contact 112c on first interlayer insulating film 110. Therefore, the drain of the p-channel MOS transistor and the source of the n-channel MOS transistor, which form the BL driver, are electrically connected to each other. Furthermore, a ground voltage (VSS) is applied to connecting contact 112d. Therefore, the drain of the n-channel MOS transistor forming the BL driver is grounded.

A second interlayer insulating film 120 is formed on first interlayer insulating film 110. In second interlayer insulating film 120, a contact hole is formed in a region positioned above connecting contact 112a formed in first interlayer insulating film 110. Furthermore, one contact hole is formed on a connecting portion between connecting contacts 112b and 112c. These two contact holes are filled with a conductor film to form connecting contacts 122a and 122b in second interlayer insulating film 120. It is noted that the source of the p-channel MOS transistor forming the BL driver is connected to the power supply. Therefore, a power supply voltage (VCC) is applied to connecting contact 122a.

A passivation film 130 is formed on interlayer insulating film 120. A bit line 160 is formed between second interlayer insulating film 120 and passivation film 130, and bit line 160 is connected to connecting contact 122b formed in second interlayer insulating film 120. Bit line 160 corresponds to any one of bit lines BL1–BLn shown in FIGS. 1 and 2. It is noted that bit line 160 is electrically connected to memory cells in the memory cell array portion described later.

As shown in FIG. 4, in the WL driver portion, n-type well region 102k is formed in silicon substrate 101. On the main surface of silicon substrate 101, source/drain regions 102e, 102f of the n-channel MOS transistor are formed. Source/drain regions 102e, 102f are arranged to oppose to each other with a channel region interposed therebetween. On the channel region between source/drain regions 102e and 102f, a gate electrode 104c is formed with a gate insulating film 103c interposed. Gate electrode 104c is covered with a sidewall insulating film 105c on its top surface and side surfaces.

On this n-channel MOS transistor, first interlayer insulating film 110 is formed. In first interlayer insulating film 110, contact holes are formed in respective regions positioned on source/drain regions 102e, 102f. These contact holes are filled with a conductor film to form connecting contacts 112e and 112f in first interlayer insulating film 110. It is noted that a ground voltage (VSS) is applied to connecting contact 112f. Therefore, the drain of the n-channel MOS transistor forming the WL driver is grounded.

On first interlayer insulating film 110, second interlayer insulating film 120 and passivation film 130 are formed. Between first interlayer insulating film 110 and second interlayer insulating film 120, a word line 170 is formed, and word line 170 is connected to connecting contact 112e formed in second interlayer insulating film 120. Word line 170 corresponds to any one of word lines WL1–WLk shown in FIGS. 1 and 2. It is noted that word line 170 is electrically connected to memory cells in the memory cell array portion described later.

As shown in FIGS. 3 and 4, in the memory cell array portion, first interlayer insulating film 110 is formed on the main surface of silicon substrate 101. Second interlayer insulating film 120 is formed on first interlayer insulating film 110. A plurality of word lines 170 extending approximately parallel to the direction normal to the plane of FIG. 3 are positioned in second interlayer insulating film 120.

On each word line 170, an access diode 180 is positioned which is formed of an n-type silicon layer 181 as an n-type semiconductor layer that is recrystallized by the melting-crystallization method and a p-type silicon layer 182 as a p-type silicon layer that is recrystallized by the melting-crystallization method. Access diode 180 has a pn junction at an interface between n-type silicon layer 181 and p-type silicon layer 182.

A TMR element 190 is positioned on each access diode 180. A contact hole is formed on each TMR element. The contact holes are filled with a conductor film to form connecting contacts 126. Each of connecting contacts 126 is connected to each of a plurality of bit lines 160 extending in a direction normal to the plane of FIG. 4. It is noted that passivation film 130 is formed on bit line 160.

The structure of the memory cell will now be described in detail.

Figure 5:
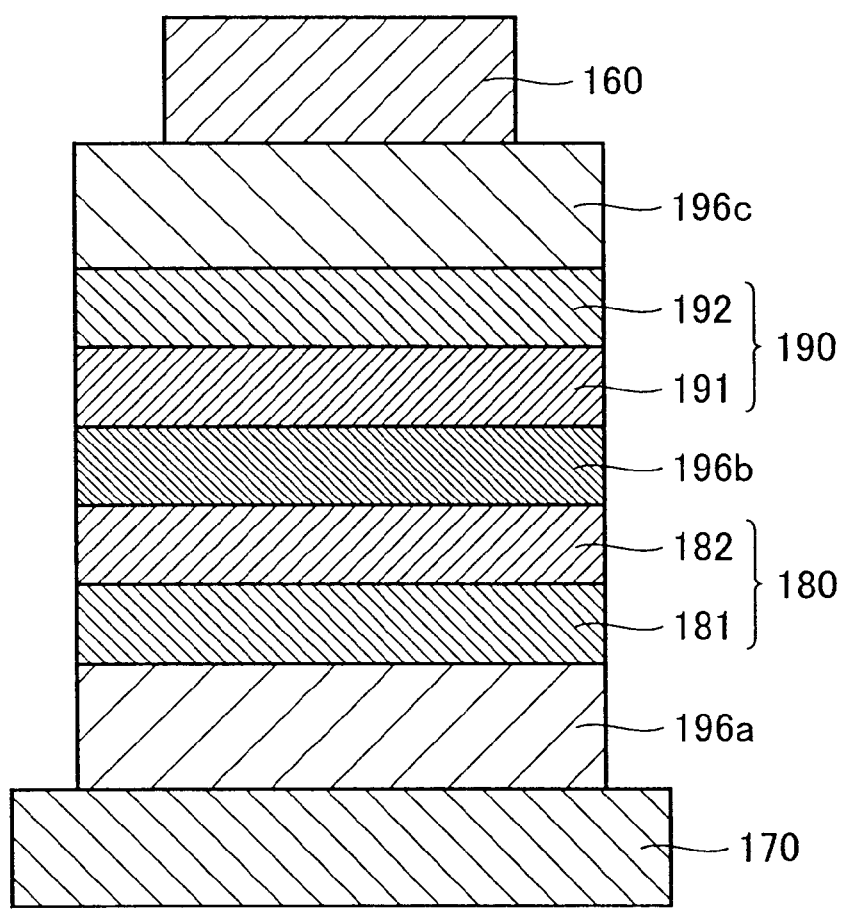
FIG. 5 is an enlarged cross sectional view showing a structure of a memory cell of the nonvolatile semiconductor memory device in the first embodiment of the present invention.

As shown in FIG. 5, the memory cell includes TMR element 190 and access diode 180. TMR element 190 includes an MTJ layer 192 comprised of three-layer stacked film of a ferromagnetic layer, a tunnel insulator layer and a ferromagnetic layer, and an antiferromagnetic layer 191 that fixes the magnetization direction of one of the ferromagnetic layers, as shown in FIG. 5. Access diode 180 includes n-type silicon layer 181 and p-type silicon layer 182, as described above. A first buffer layer 196a is positioned between word line 170 and access diode 180, a second buffer layer 196b is positioned between access diode 180 and TMR element 190, and a third buffer layer 196c is positioned between TMR element 190 and bit line 160.

To sum up the characteristic structure of nonvolatile semiconductor memory device 1A in accordance with the present embodiment illustrated above, nonvolatile semiconductor memory device 1A includes silicon substrate 101 as a semiconductor substrate, bit line 160 as a first conductive line, a word line 170 as a second conductive line, and a memory cell. Silicon substrate 101 has a main surface, above which bit line 160 is positioned. Word line 170 is provided to intersect bit line 160. A memory cell is positioned in a region where bit line 160 and word line 170 intersect and has one end electrically connected to bit line 160 and the other end electrically connected to word line 170. This memory cell includes TMR element 190 as a memory element and access diode 180 as an access element which are electrically connected in series. Access diode 180 includes n-type silicon layer 181 and p-type silicon layer 182 recrystallized by the melting-recrystallization method and has a pn junction at the interface between n-type silicon layer 181 and p-type silicon layer 182.

As described above, such a pn junction diode is used as an access element that includes a semiconductor layer formed by the melting-recrystallization method and has a pn junction in this semiconductor layer, so that a diode excellent in the electric characteristics such as internal resistance and reverse direction characteristics can be used as an access element. As a result, a nonvolatile semiconductor memory device that realizes excellent reading and writing operations can be provided.

Furthermore, with the pn junction diode described above that is applied as an access element, variations are less likely caused in the electric characteristic of each access diode formed in a memory cell. Therefore a sense current can be stabilized. As a result, nonvolatile semiconductor memory devices excellent in reading and writing operations can be produced with a high production yield.

In addition, the use of a diode as an access element can largely reduce an area for the memory cell array as compared with the use of a transistor as an access element.

As described above, a diode including a semiconductor layer recrystallized by the melting-recrystallization method is used as an access diode, so that the nonvolatile semiconductor memory devices having reduced areas and excellent characteristics can be manufactured with a high production yield.

It is noted that the melting-recrystallization method as used herein reefers to a method of recrystallizing a polysilicon layer or an amorphous silicon layer where the silicon layer undergoes a heat treatment to be melted, followed by removal of the heat. The semiconductor layer recrystallized by this melting-recrystallization method includes therein grains largely reduced in number as compared with a polysilicon layer or an amorphous silicon layer that is not recrystallized. Therefore, with the use of the melting-recrystallization method, a diode excellent in electric characteristics can be formed.

In the melting-recrystallization method, the number of grains is significantly reduced after the heat treatment since single-crystallization of the silicon layer takes place during recrystallization. Therefore, the semiconductor layer recrystallized by the melting recrystallization method has a grain having a significantly large grain size, with the grain size larger than that of the polysilicon or amorphous silicon. Therefore, the grain included therein has a grain size larger than 100 nm that is a maximum grain size of a polysilicon layer or an amorphous silicon layer formed by a normal deposit process.

Referring to FIGS. 6 to 17, a method of manufacturing the nonvolatile semiconductor memory device shown in FIGS. 3 and 4 will be described.

Figure 6:
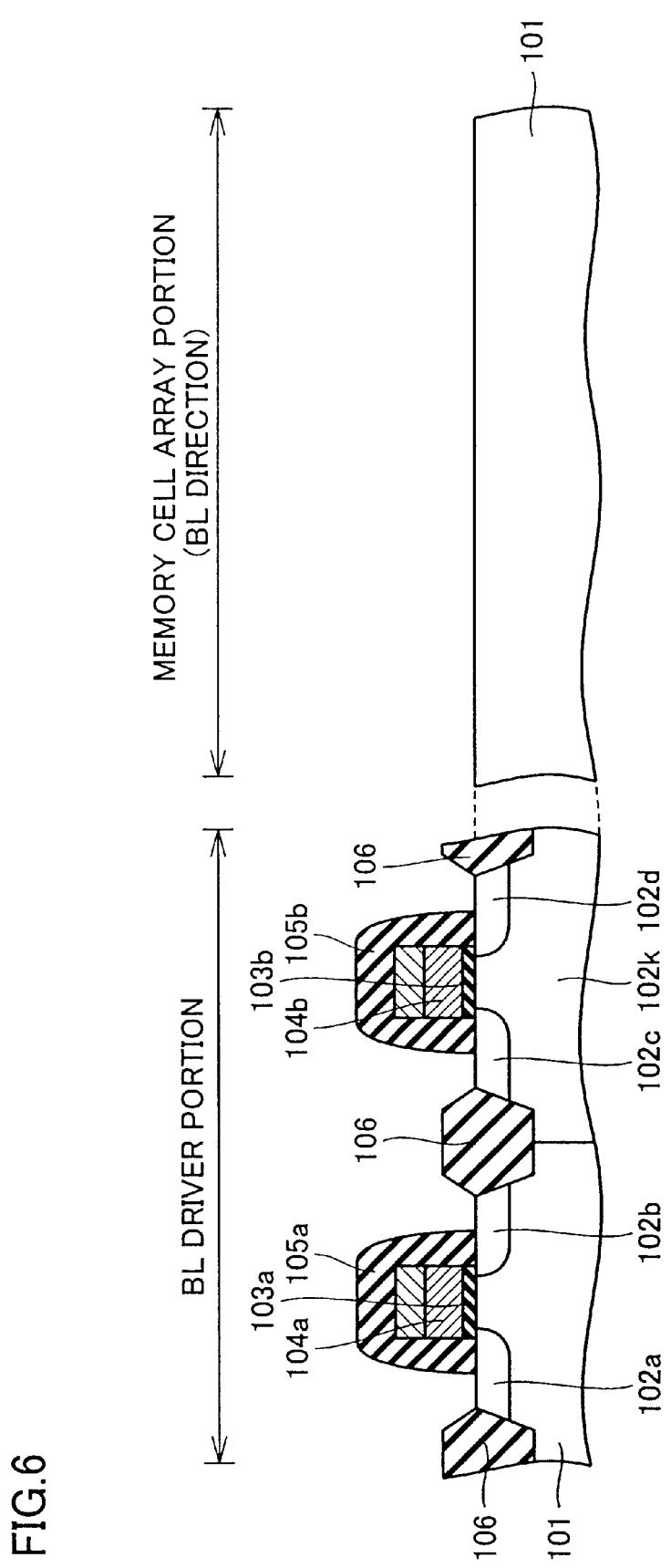
Figure 7:
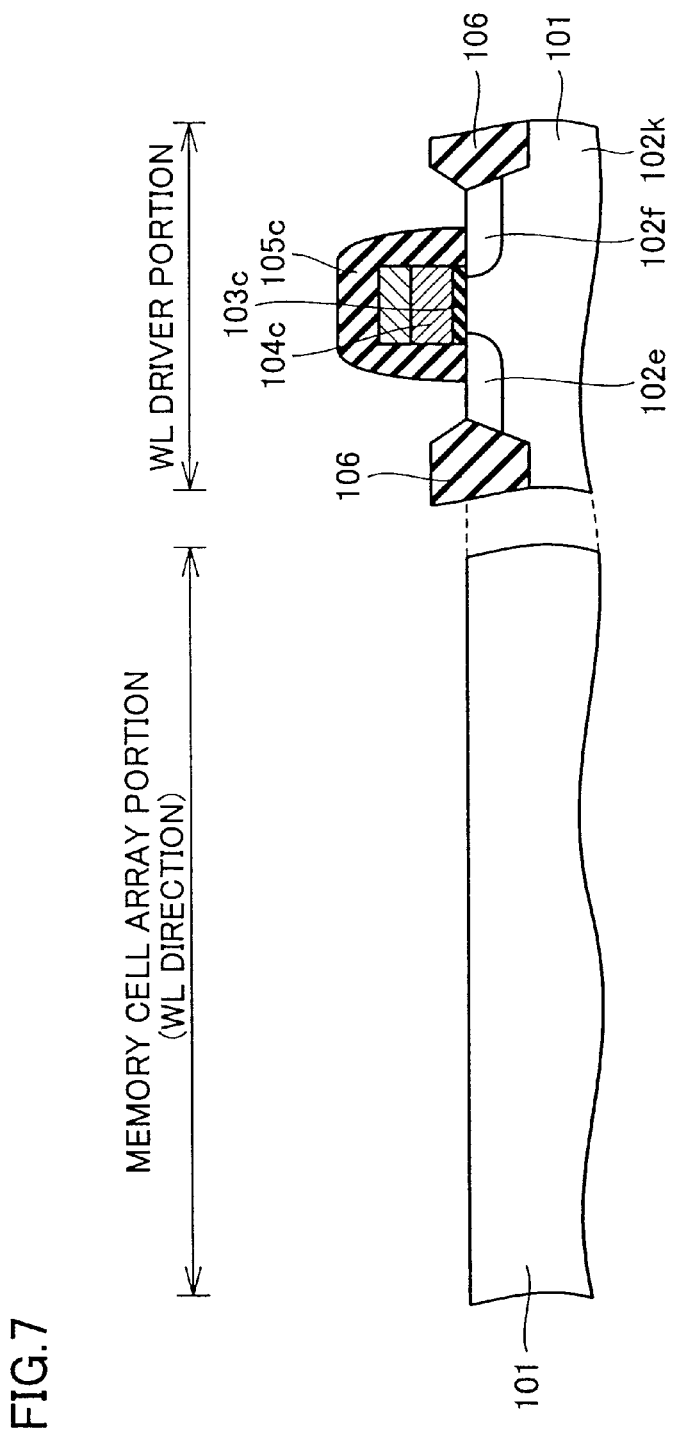

First, as shown in FIGS. 6 and 7, using the normal deposit, photolithography processing and ion implantation processes, a p-channel MOS transistor and an n-channel MOS transistor forming the BL driver portion and an n-channel MOS transistor forming the WL driver portion as well as a field effect transistor forming a logic circuit (not shown) are formed on the main surface of silicon substrate 101.

Specifically, n-type well region 102k is formed in a prescribed region (a region where the n-channel MOS transistor is formed) in the p-type silicon substrate 101 using a mask (not shown). Element-isolating film 106 is then formed in a prescribed region of silicon substrate 101.

An insulating film serving as gate insulating films 103a–103c is formed on the main surface of silicon substrate 101. A conductor film serving as gate electrodes 104a–104c is formed on this insulating film. A resist film (not shown) having a pattern is formed on the conductor film, and using this resist film as a mask, the conductor film and the insulating film are partially removed by etching. Thereafter the resist film is removed. As a result, gate insulating films 103a–103c and gate electrodes 104a–104c are formed.

Then, using gate electrodes 104a–104c as a mask, a conductive impurity is implanted in the main surface of silicon substrate 101 to form source/drain regions 102a–102f. It is noted that at this time the p-channel MOS transistor and the n-channel MOS transistor are separately formed by introducing respective different conductivity types of impurity.

An insulating film serving as sidewall insulating films 105a–105c is then deposited to cover gate electrode 104a–104c. This insulating film is selectively removed by anisotropic etching to form sidewall insulating films 105a–105c. As a result, the p-channel MOS transistor and n-channel MOS transistor forming BL driver portion, the n-channel MOS transistor forming WL driver portion, and the field effect transistor forming a logic circuit (not shown) are formed.

Figure 8:
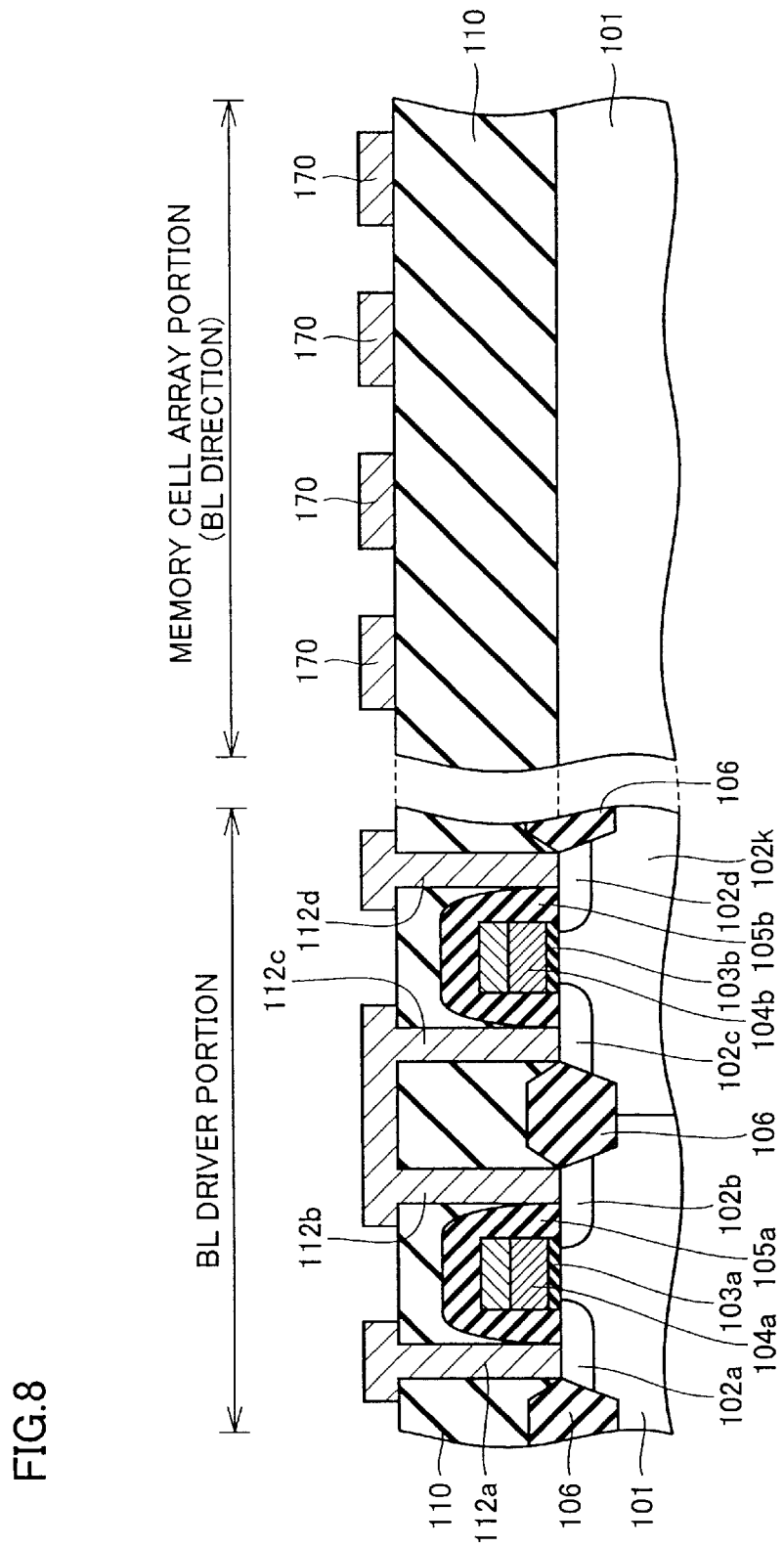
Figure 9:
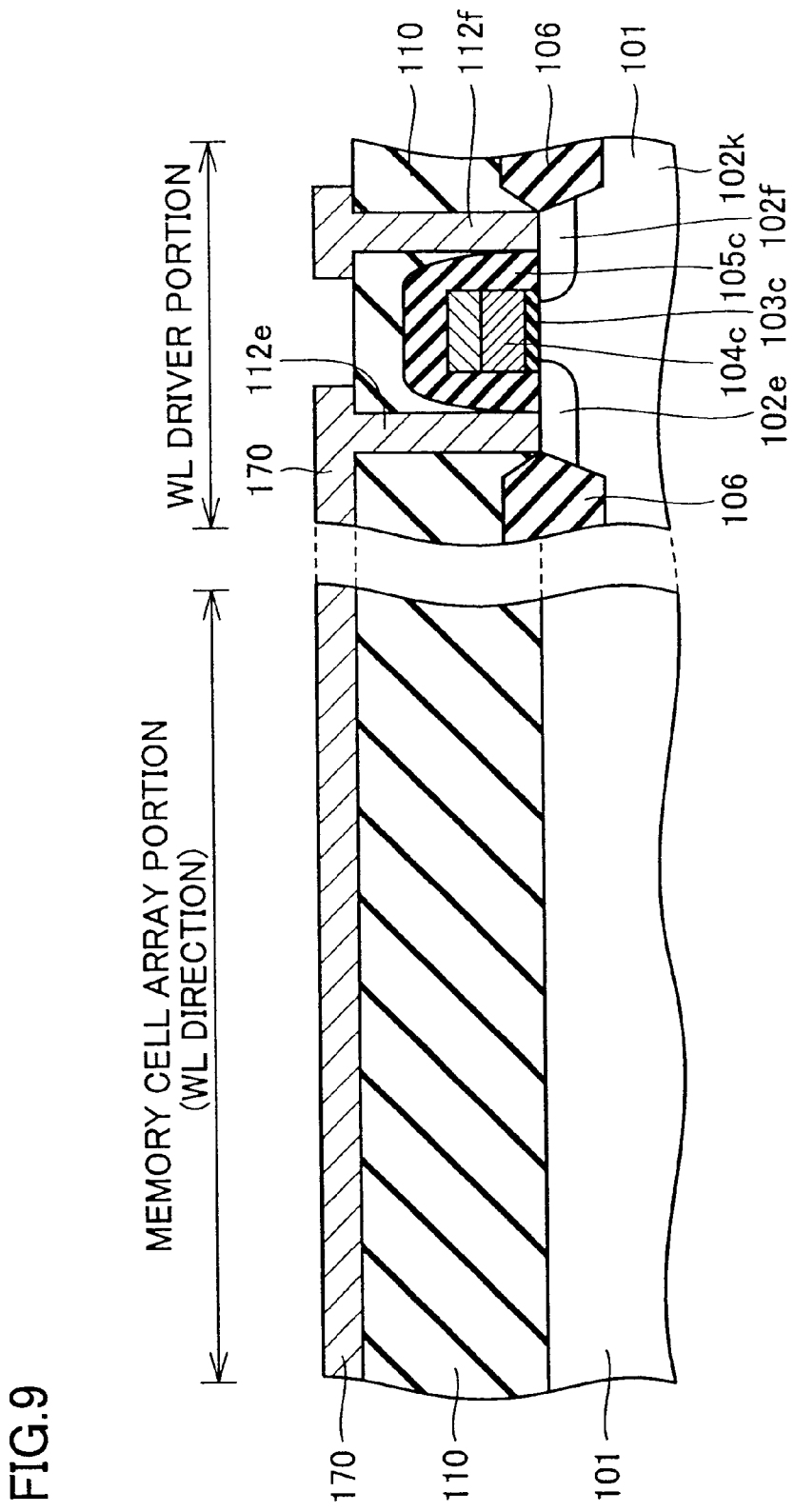

Then, as shown in FIGS. 8 and 9, first interlayer insulating film 110 is formed to cover the entire surface of silicon substrate 101. Desirably, first interlayer insulating film 110 is for example Boro-Phsopho Tetra Ethyl Ortho Silicate (BPTEOS) film and has a thickness of approximately 200 nm. A resist film (not shown) having a pattern is formed on first interlayer insulating film 110 by photolithography. Using this resist film as a mask, a part of first interlayer insulating film 110 is removed by etching. Thereafter the resist film is removed. As a result, contact holes are formed in first interlayer insulating film 110.

Thereafter, a conductor film is formed which fills the contact holes and extends onto the upper surface of first interlayer insulating film 110. For example, platinum (Pt) that is a refractory metal is preferably used as a material for the conductor film as used here. Furthermore, in order to improve sealing of the conductor film, desirably, a barrier metal film made of titanium-nickel (Ti—Ni) film is deposited in the contact hole, followed by a tungsten (W) film forming the lower layer of the conductor film with a thickness of about 300 nm, a titanium (Ti) film for improving sealing with a thickness of about 5 nm, and a platinum film forming the upper layer of the conductor film. Here, the deposited platinum film of a thickness of about 100 nm can prevent degradation of the conductor film due to the heat treatment in the melting-recrystallization of the amorphous silicon layer described later.

Thereafter, a resist film (not shown) having a pattern is formed on the conductor film by photolithography, and using this resist film as a mask, a part of the conductor film is removed by etching. Thereafter the resist film is removed. As a result, in first interlayer insulating film 110, connecting contacts 112a–112f are formed which fill the contact holes and extend over the first interlayer insulating film 110. In the memory cell array portion, k word lines 170 are formed to extend approximately parallel on first interlayer insulating film 110.

Figure 10:
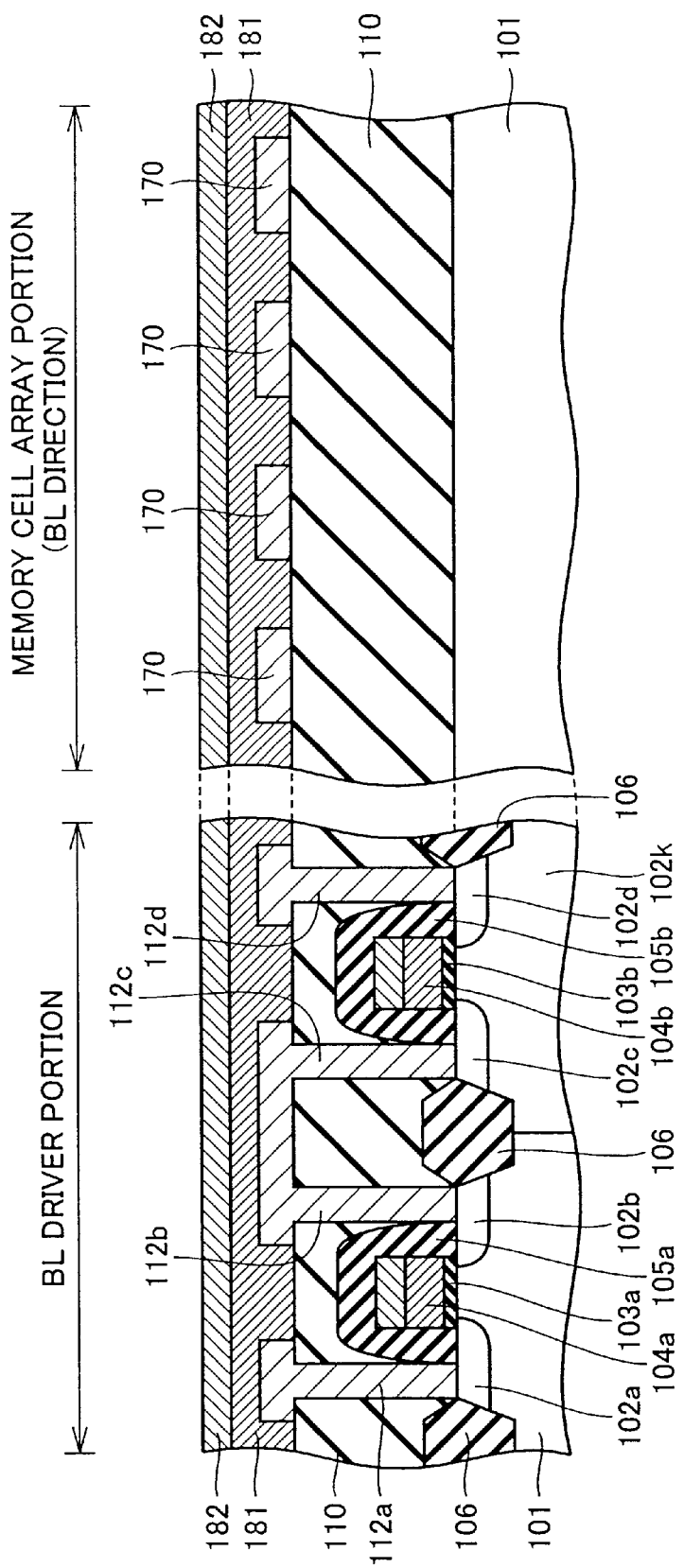
Figure 11:
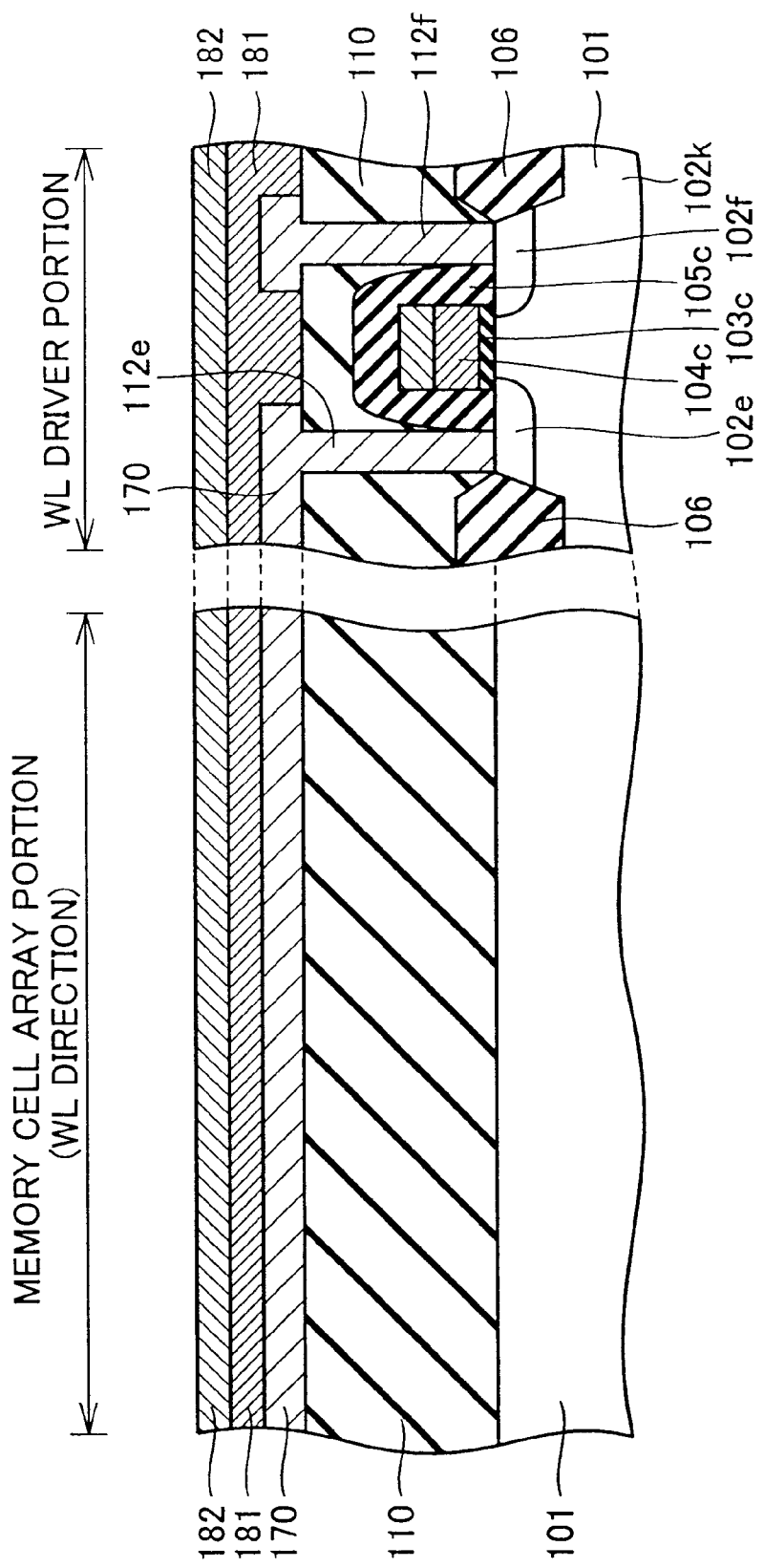

Then, as shown in FIGS. 10 and 11, n-type silicon layer 181 and p-type silicon layer 182 recrystallized by the melting-recrystallization method are formed to cover the entire surface of first interlayer insulating film 110.

Specifically, an amorphous silicon layer of 300 nm thick is first deposited using CVD on the conductor film. Phosphorous (P) that is an n-type impurity is implanted in the amorphous silicon layer by ion implantation. Here, the implantation energy is for example 5 keV and the implantation concentration is for example about $1\times10^{14}$ cm$^{-2}$. The amorphous silicon layer implanted with impurity is then melted by laser annealing and is then recrystallized. Then, on this recrystallized silicon layer, an amorphous silicon layer doped with boron (B) is deposited to have a thickness of about 100 nm by CVD or the like. Thereafter, the amorphous layer doped with boron is subjected to a heat treatment at about 600° C. for recrystallization.

It is noted that a variety of methods of forming recrystallized n-type silicon layer 181 on word line 170 may be contemplated other than the method described above. The specific forming method will be described later.

Figure 12:
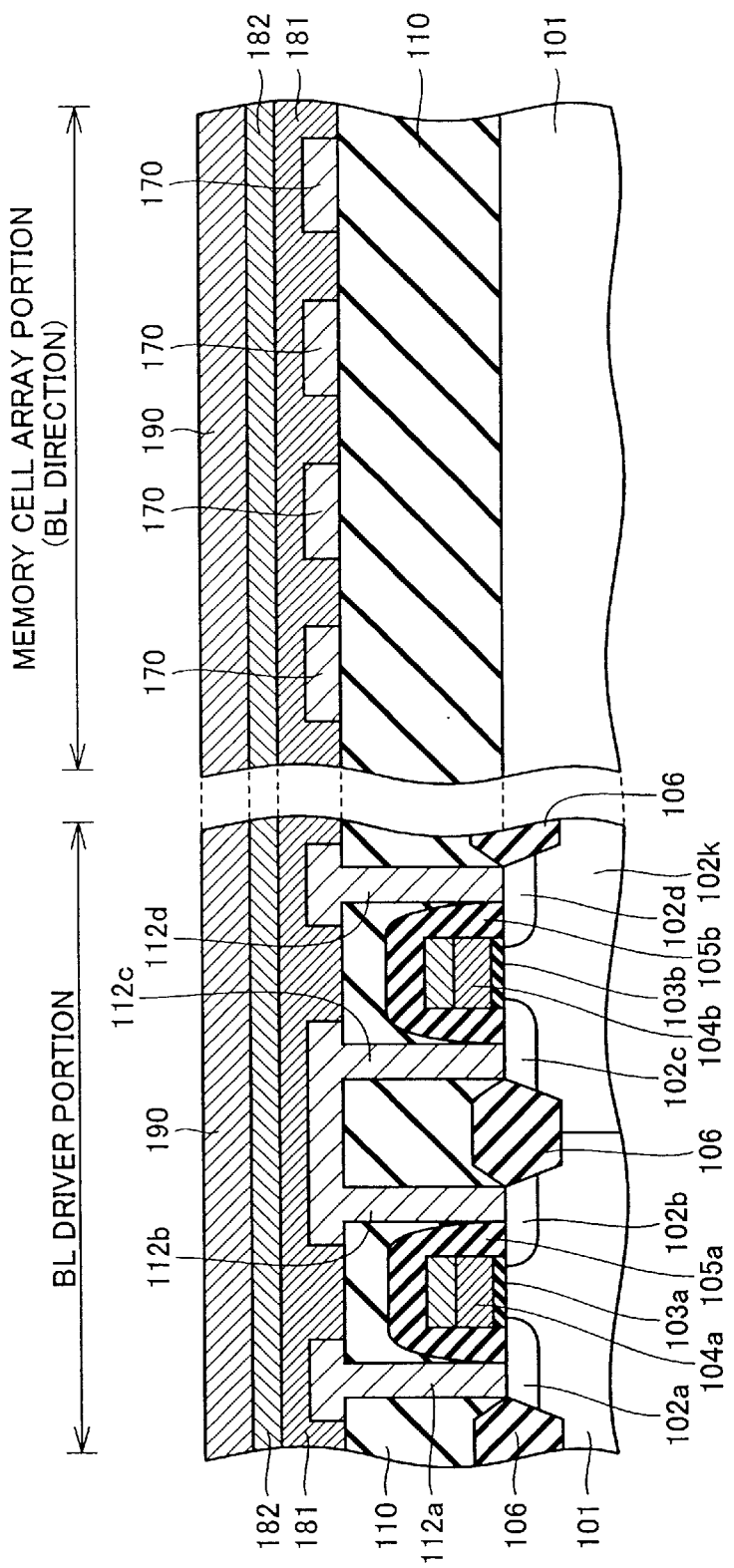
Figure 13:
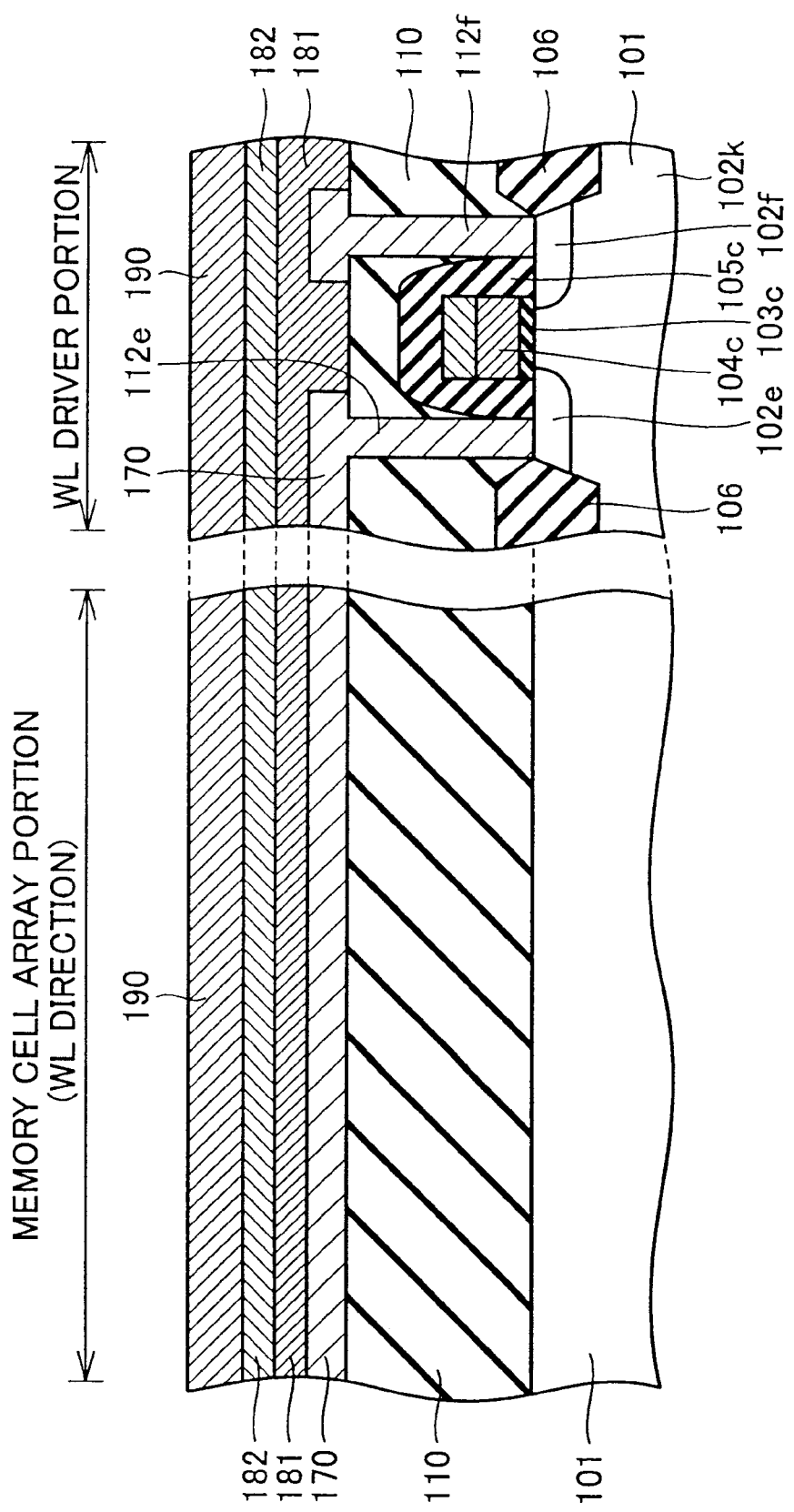

Then, as shown in FIGS. 12 and 13, a stacked film serving as TMR element 190 is formed to cover the entire surface of p-type silicon layer 182. It is noted that this stacked film includes an MTJ layer made of two ferromagnetic layers and a thin tunnel insulator layer interposed therebetween, and an antiferromagnetic layer in contact with one of the ferromagnetic layers.

Figure 14:
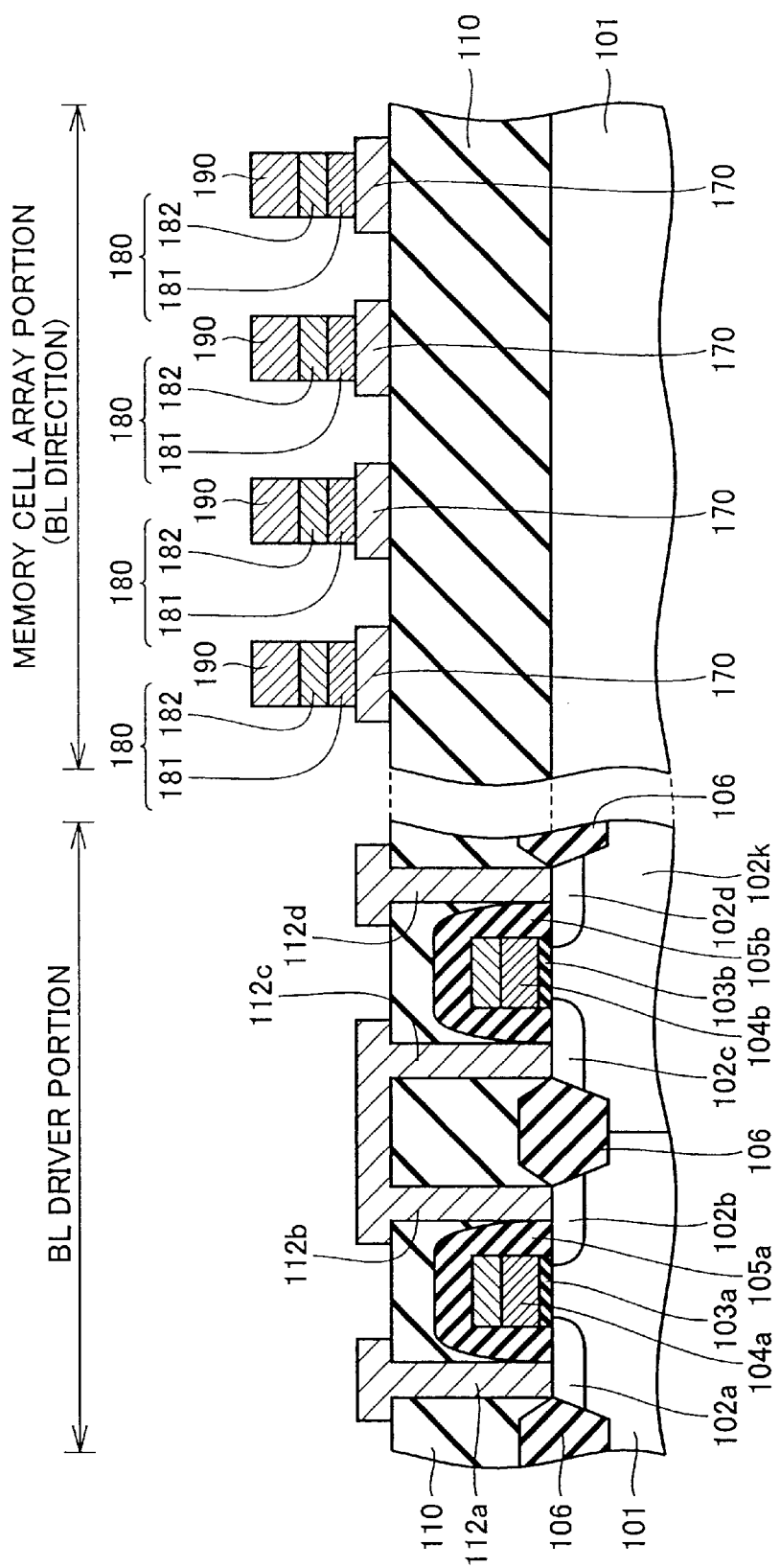
Figure 15:
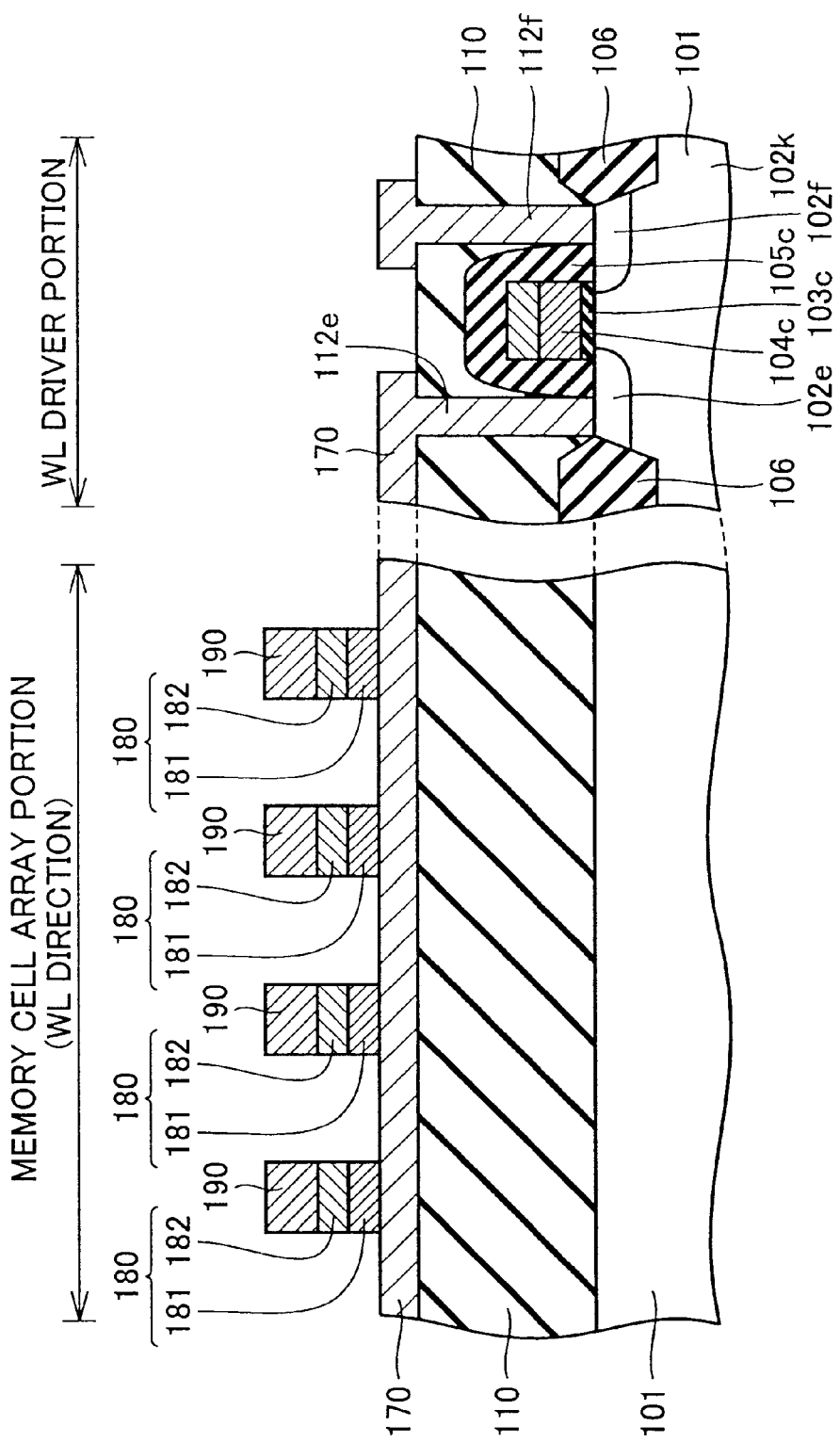

A resist film (not shown) having a pattern is then formed on the stacked film serving as TMR element 190. Using this resist film as a mask, the stacked film, the n-type silicon layer and the p-type silicon layer are partially removed. Thereafter the resist film is removed. As a result, as shown in FIGS. 14 and 15, TMR element 190 and access diode 180 are formed on each word line 170.

Figure 16:
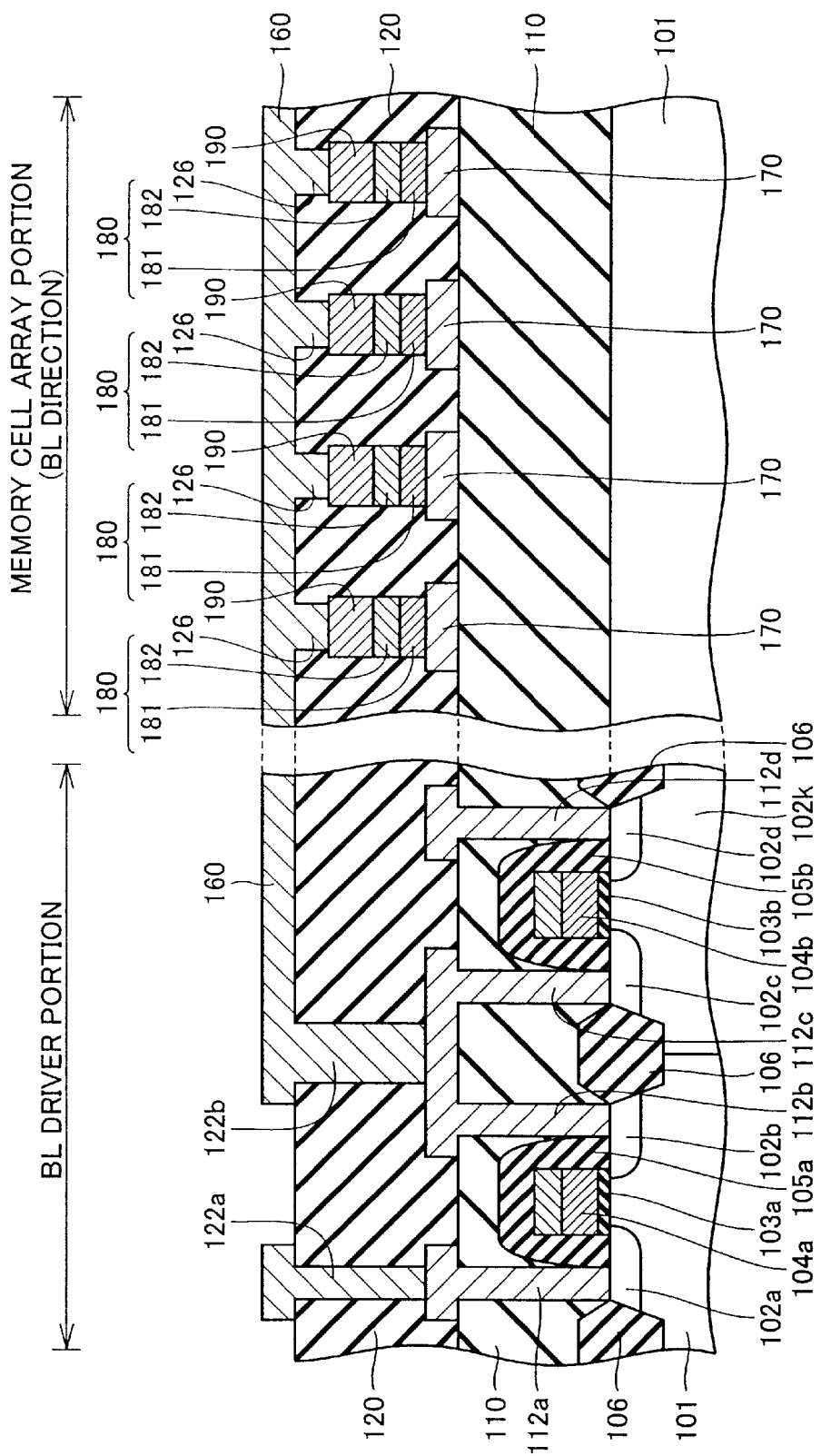
Figure 17:
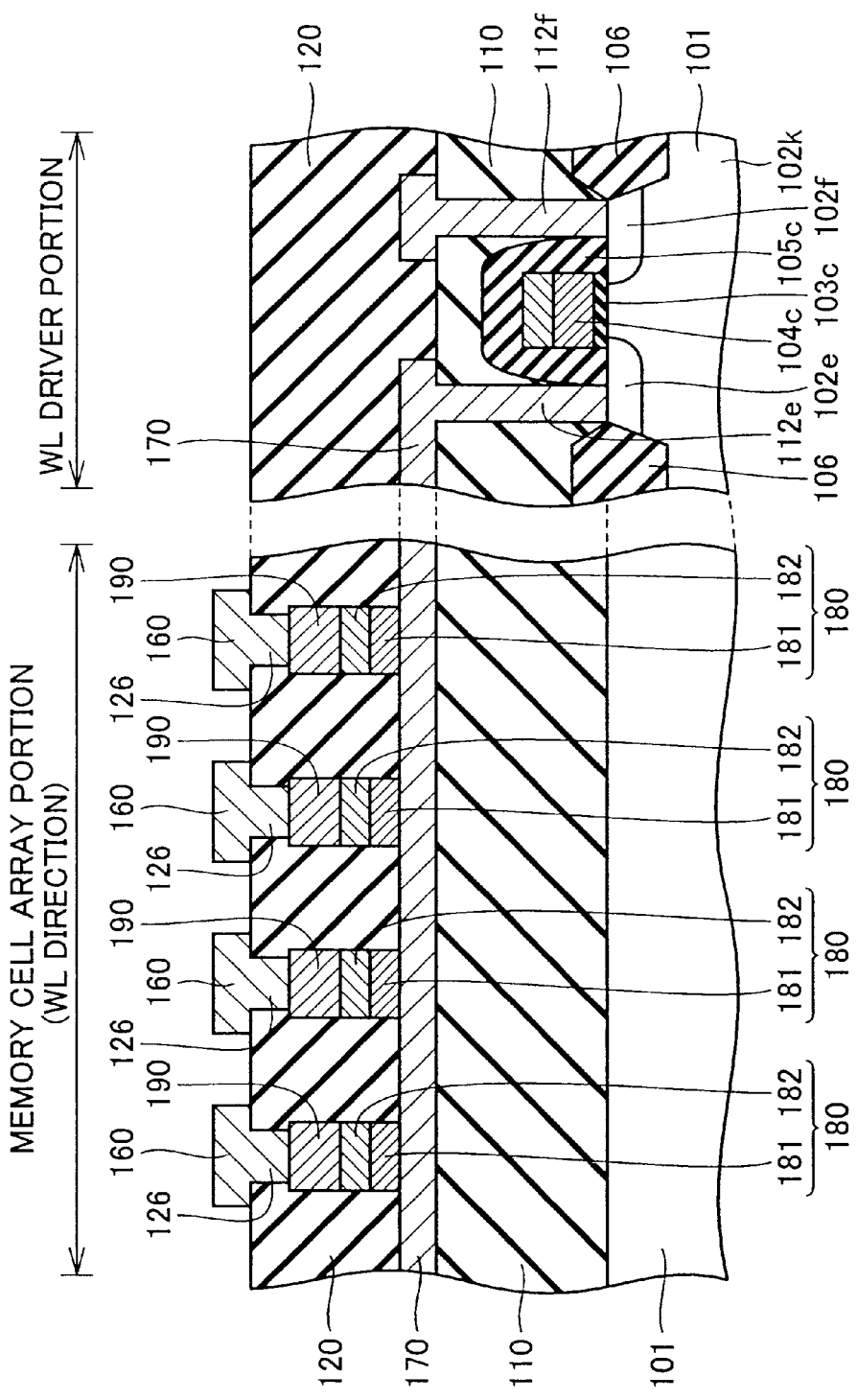

Then, as shown in FIGS. 16 and 17, second interlayer insulating film 120 is formed to cover first interlayer insulating film 110. A resist film (not shown) having a pattern is then formed on first interlayer insulating film 120 by photolithography. Using this resist film as a mask, a part of second interlayer insulating film 120 is removed by etching. Thereafter the resist film is removed. As a result, contact holes are formed in second interlayer insulating film 110.

Thereafter, a conductor film is formed which fills the contact holes and extends onto the upper surface of second interlayer insulating film 120. A resist film (not shown) having a pattern is then formed on the conductor film by photolithography, and using this resist film as a mask, a part of the conductor film is removed by etching. Thereafter the resist film is removed. As a result, connecting contacts 122a, 122b and 126 are formed which fill the contact holes and extend over second interlayer insulating film 120. In the memory cell array portion, n bit lines 160 are formed which extend approximately parallel on TMR elements 190 and are connected to connecting contacts 126.

Thereafter passivation film 130 is formed to cover the entire surface of second interlayer insulating film 120. Through the steps described above, nonvolatile semiconductor memory device 1A having the structure shown in FIGS. 3 and 4 result. It is noted that although in the present embodiment an amorphous silicon layer is recrystallized as a recrystallized semiconductor layer forming an access diode, by way of illustration, a polysilicon layer may be recrystallized to form a recrystallized semiconductor layer.

To sum up the characteristic steps of the method of manufacturing nonvolatile semiconductor memory device 1A shown in FIGS. 6 to 17 in accordance with the present invention, the method the steps of forming word line 170 as a second conductive line above the main surface of silicon substrate 101 as a semiconductor substrate, forming on word line 170 n-type silicon layer 181 and p-type silicon layer 182 as semiconductor layers formed by the melting-recrystallization method, forming TMR element 190 as a memory element on p-type silicon layer 182, and forming bit line 160 as a first conductive line on TMR element 190.

Through the steps described above, the nonvolatile semiconductor memory devices having reduced areas and excellent characteristics can be manufactured with a high production yield.

In the following, another example of the method of forming n-type silicon layer 181 forming access diode 180 will be described with reference to the figures.

Figure 18:
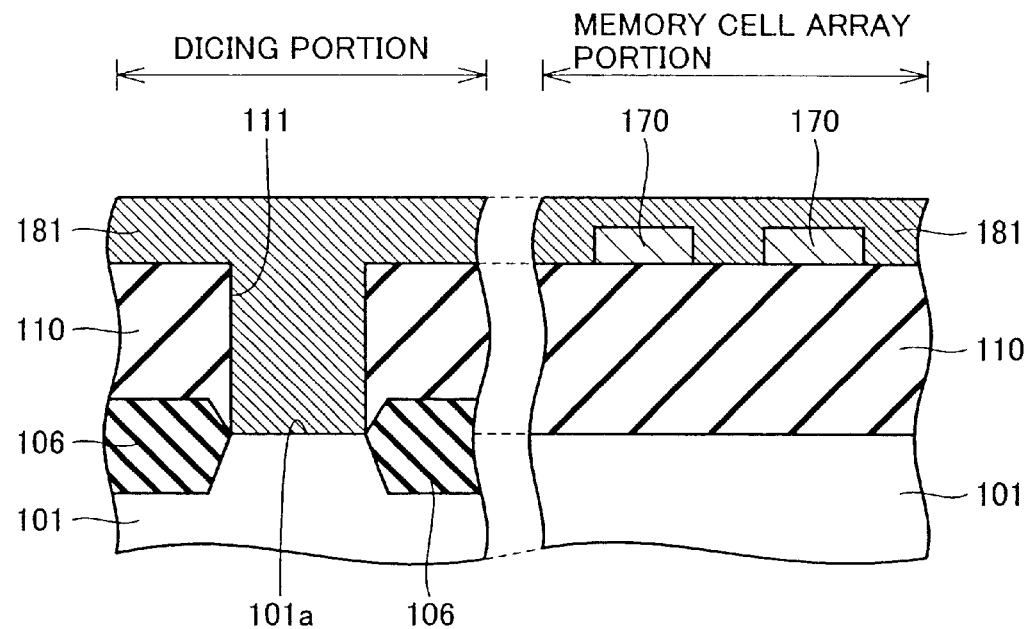
FIG. 18 is a cross sectional view schematically illustrating another example of the fourth step of the method of manufacturing a nonvolatile semiconductor memory device in the first embodiment of the present invention.

In the present forming method shown in FIG. 18, a contact hole 111 provided in a dicing portion is utilized to form the recrystallized n-type silicon layer 181.

In the present forming method, in the step of forming an amorphous silicon layer serving as n-type silicon layer 181 on word line 170 of the memory cell array portion, contact hole 111 provided in a dicing portion is filled with this amorphous silicon layer, at the same time. Here, the amorphous silicon layer is brought into contact with main surface 101a of silicon substrate 101 that is positioned at the lower end of the opening of contact hole 111 in the dicing portion. Furthermore, the amorphous silicon layer in the memory cell array portion is made continuous from the amorphous silicon layer in the dicing portion.

This amorphous silicon layer is then subjected to a heat treatment. Preferably, laser annealing is used for this heat treatment. Specifically, that part of the amorphous silicon layer which is positioned in the dicing portion is irradiated with laser so that the entire amorphous silicon layer is melted. Thereafter, the laser irradiation is stopped and the amorphous silicon layer is cooled. Here, using main surface 101a of silicon substrate 101 as a seed, the melted amorphous silicon layer is recrystallized from main surface 101a of silicon substrate 101 upward. The recrystallization proceeds outside contact hole 111 and then moves in the lateral direction to reach the memory cell array portion.

As a result, the silicon layer having grains largely reduced in number and being close to a single-crystal silicon layer can be formed on the word lines. It is noted that the nonvolatile semiconductor memory device is not increased in size because the dicing portion is removed in the subsequent dicing step. Furthermore, the laser irradiation only at the dicing portion can prevent the memory cell array portion from being abnormally heated, thereby ensuing the reliability.

Figure 19:
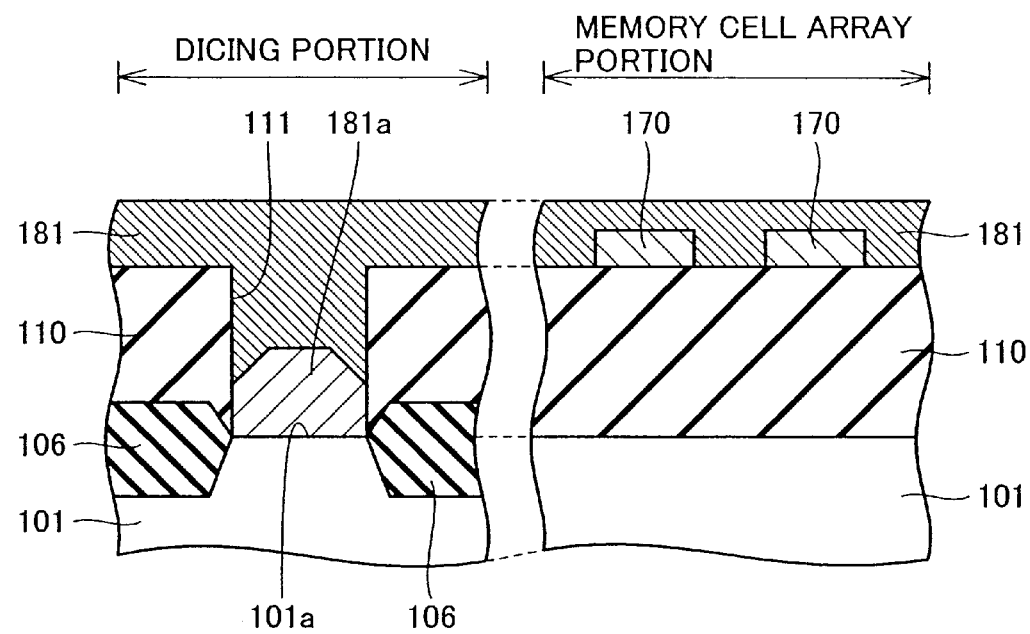
FIG. 19 is a cross sectional view schematically illustrating another example of the fourth step of the method of manufacturing a nonvolatile semiconductor memory device in the first embodiment of the present invention.

In the forming method shown in FIG. 19, contact hole 111 provided in the dicing portion is also utilized to form recrystallized n-type silicon layer 181.

In the present forming method, prior to the step of forming an amorphous silicon layer serving as n-type silicon layer 181 on word lines 170 in the memory cell array portion, an epitaxial layer 181a is selectively formed within contact hole 111 in the dicing portion by an epitaxial growth method. Thereafter, in the step of forming an amorphous silicon layer serving as n-type silicon layer 181 on word lines 170 in the memory cell array portion, contact hole 111 provided in the dicing portion is filled with this amorphous silicon layer, at the same time. Here, the amorphous silicon layer is brought into contact with the surface of epitaxial layer 181a positioned at the lower portion of the opening of contact hole 111 in the dicing portion. Furthermore, the amorphous silicon layer in the memory cell array portion is made continuous from the amorphous silicon layer in the dicing portion.

This amorphous silicon layer is then subjected to a heat treatment. Preferably, laser annealing is used for the heat treatment. Specifically, that part of the amorphous silicon layer which is positioned in the dicing portion is irradiated with laser so that the entire amorphous silicon layer is melted. Thereafter the laser irradiation is stopped and the amorphous silicon layer is cooled. At this time, using the surface of epitaxial layer 181a as a seed, the melted amorphous silicon layer is recrystallized from main surface 101a of silicon substrate 101 upward. The recrystallization proceeds outside contact hole 111 and thereafter moves in the lateral direction to reach the memory cell array portion.

As a result, the silicon layer having grains largely reduced in number and being close to a single-crystal layer can be formed on the word lines. It is noted that the nonvolatile semiconductor memory device is not increased in size because the dicing portion is removed in a subsequent dicing step. In addition, the laser irradiation only in the dicing portion can prevent the memory cell array portion from being abnormally heated, thereby ensuring the reliability.

Figure 20:
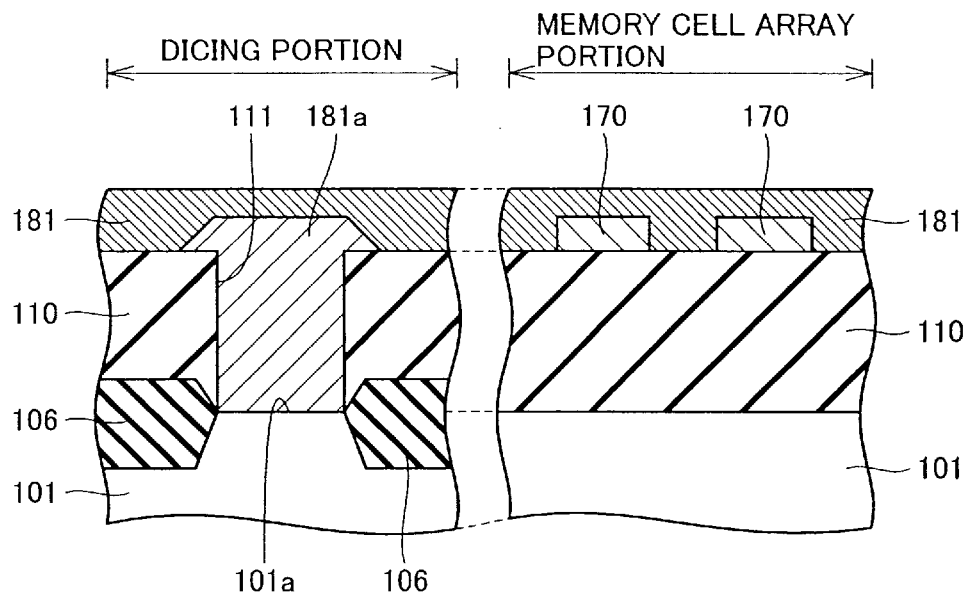
FIG. 20 is a cross sectional view schematically illustrating another example of the fourth step of the method of manufacturing a nonvolatile semiconductor memory device in accordance with the first embodiment of the present invention.

Alternatively, epitaxial layer 181a that is selectively grown in contact hole 111 in the dicing portion by the epitaxial growth method may be formed to extend outside contact hole 111 as shown in FIG. 20. In this case, since the distance between the seed and the n-type silicon layer formed on word lines 170 is reduced, an n-type silicon layer having grains further reduced in number can be fabricated.

Figure 21:
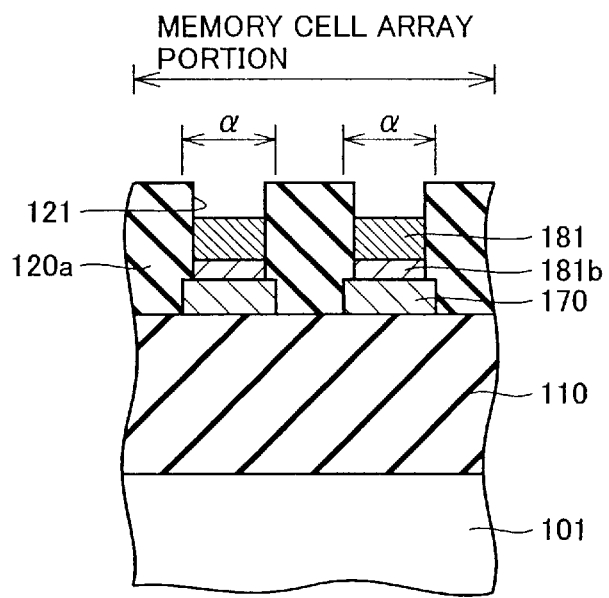
FIG. 21 is a cross sectional view schematically illustrating yet another example of the fourth step of the method of manufacturing a nonvolatile semiconductor memory device in the first embodiment of the present invention.

In the forming method shown in FIG. 21, a silicon layer having less grains is formed using a contact hole 121 formed by removing a part of interlayer insulating film 120a, which is deposited on word lines 170 in advance.

In the present forming method, contact hole 121 is formed in advance in that region of interlayer insulating film 120a which is positioned on word line 170. Here, the opening size a of contact hole 121 is an integer multiple of a lattice constant of silicon. A silicon layer is then formed on word line 170 positioned at the lower end of the opening of contact hole 121. With the use of this method, a silicon layer 181b formed immediately above word line 170 has a crystal structure that is relatively close to single crystal. Therefore, a silicon layer is grown upward using silicon layer 181b as a seed, resulting in a silicon layer having less grains.

Second Embodiment

A nonvolatile semiconductor memory device in accordance with a second embodiment of the present invention will now be described. A nonvolatile semiconductor memory device 1B in the present embodiment differs from nonvolatile semiconductor memory device 1A in the first embodiment described above only in the structure of the memory cell array portion in the word line extending direction. It is noted that the circuit configuration of nonvolatile semiconductor memory device 1B in the present embodiment is similar to the circuit configuration of nonvolatile semiconductor memory device 1A in the first embodiment described above.

Figure 22:
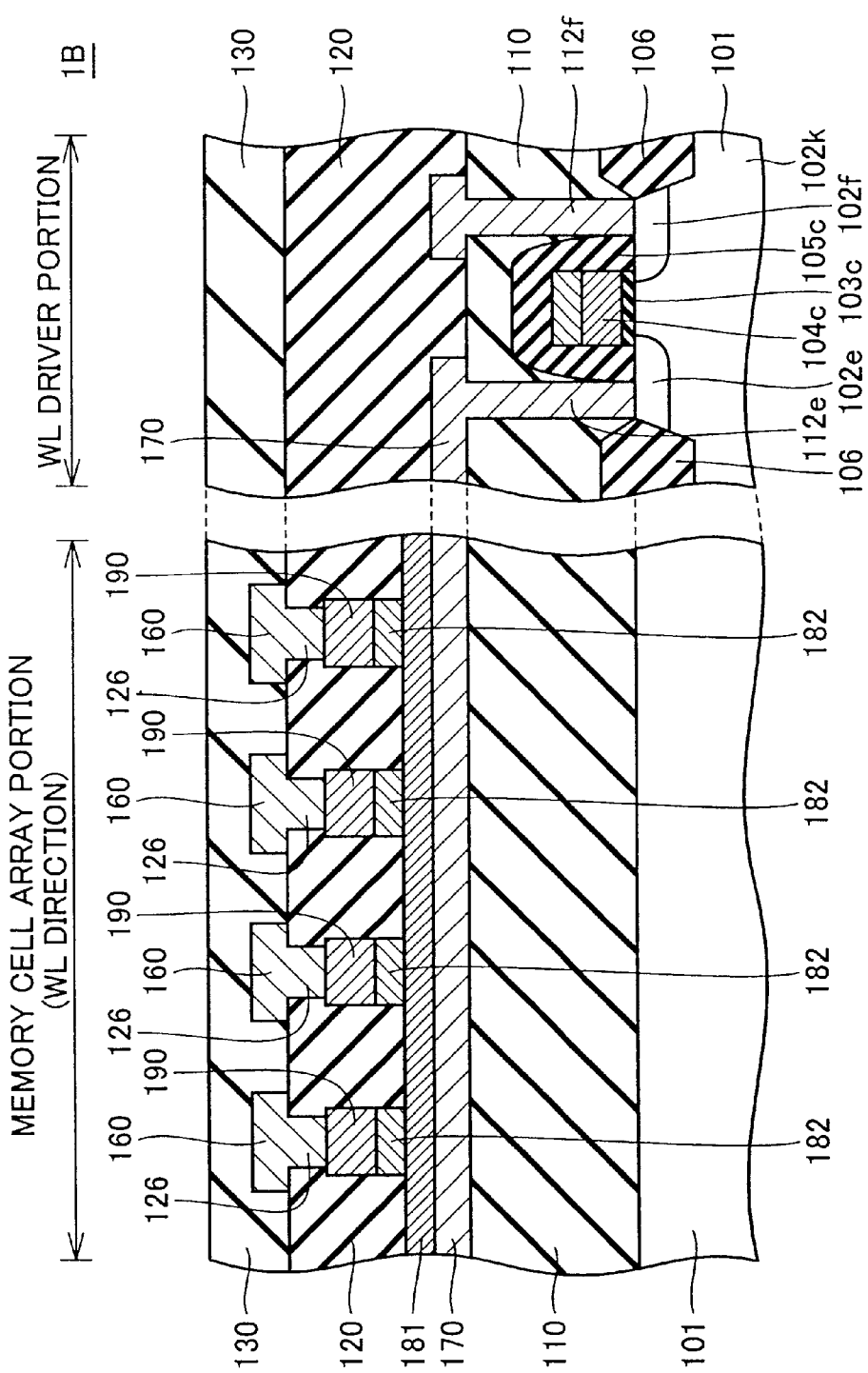
FIG. 22 is a schematic cross sectional view along a word line extending direction in a nonvolatile semiconductor memory device in a second embodiment of the present invention.

As shown in FIG. 22, in the memory cell array portion of nonvolatile semiconductor memory device 1B in the present embodiment, n-type silicon layer 181 of access diode 180 positioned on word line 170 is a common layer connected to the same word line. In other words, in nonvolatile semiconductor memory device 1A in the first embodiment described above, each memory cell has a separate n-type silicon layer 181, while in nonvolatile semiconductor memory device 1B in the present embodiment, n-type silicon layer 181 connected to one word line 170 is formed as a common layer, rather than independent layers.

As described above, in the access diode, only p-type silicon layer may be formed independently for each memory cell and the n-type silicon layer does not have to be specially formed independently.

Third Embodiment

A nonvolatile semiconductor memory device in a third embodiment of the present invention will now be described. It is noted that the circuit configuration of nonvolatile semiconductor memory device 1C in the present embodiment is similar to the circuit configuration of nonvolatile semiconductor memory device 1A in the first embodiment described above.

Figure 23:
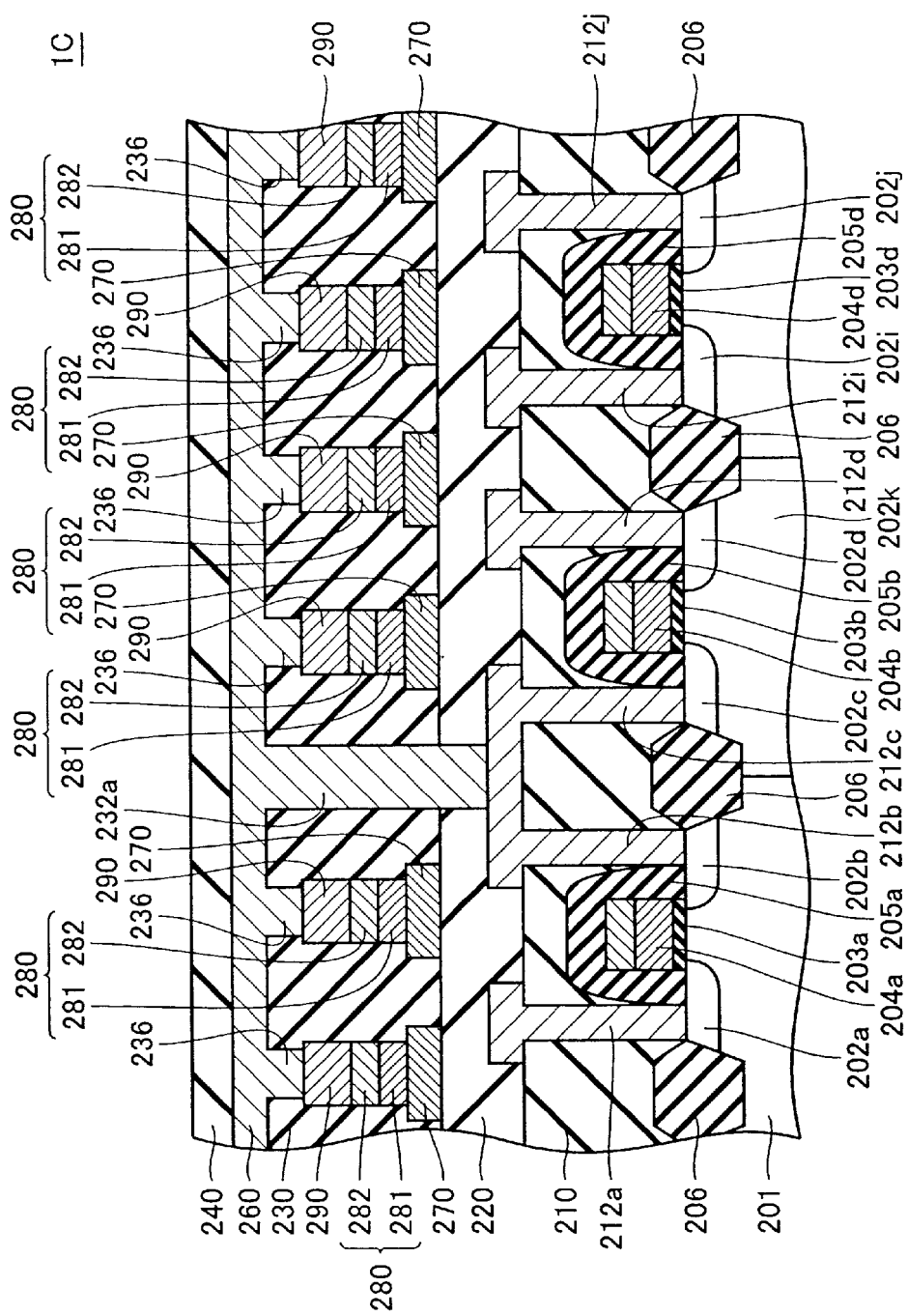
FIG. 23 is a schematic cross sectional view along a bit line extending direction in a nonvolatile semiconductor memory device in a third embodiment of the present invention.
Figure 24:
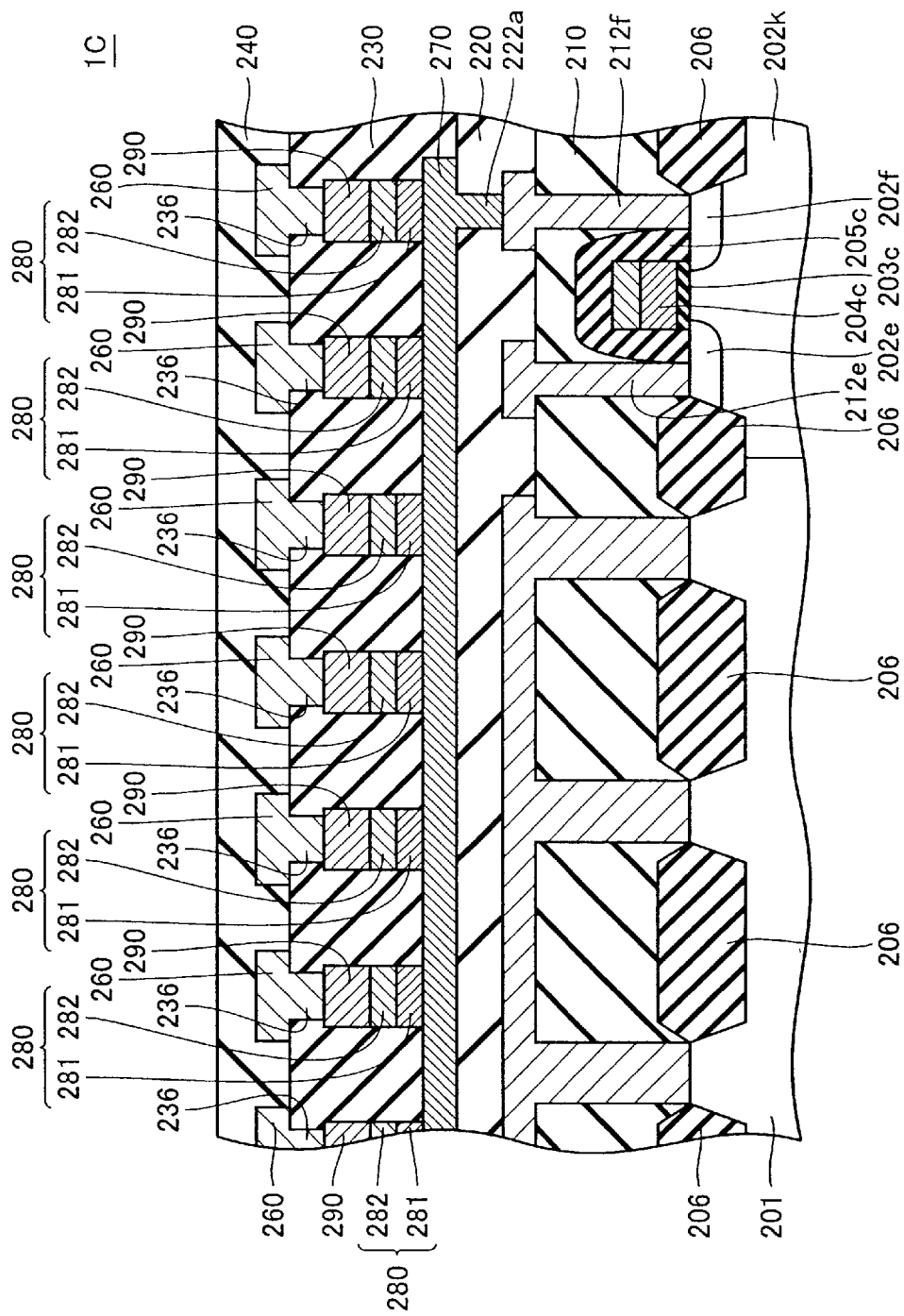
FIG. 24 is a schematic cross sectional view along a word line extending direction in the nonvolatile semiconductor memory device in the third embodiment of the present invention.

As shown in FIG. 23, nonvolatile semiconductor memory device 1C in the present embodiment includes, in the bit line extending direction, a p-channel MOS transistor and an n-channel MOS transistor forming a BL driver as well as a p-channel MOS transistor forming a logic circuit on a main surface of a p-type silicon substrate 101 as a semiconductor substrate. As shown in FIG. 24, nonvolatile semiconductor memory device 1C in the present embodiment further includes, in the word line extending direction, an n-channel MOS transistor forming a WL driver on the main surface of p-type silicon substrate 201. Furthermore, above these transistors, a memory cell array is arranged in a stacked manner.

In the following, the structure of nonvolatile semiconductor memory device 1C in the present embodiment will be described specifically.

As shown in FIG. 23, in a prescribed region of the main surface of silicon substrate 201, source/drain regions 202a, 202b of the p-channel MOS transistor forming the BL driver are formed. Source/drain regions 202a, 202b are arranged to oppose to each other with a channel region interposed therebetween. On the channel region between source/drain regions 202a and 202b, a gate electrode 204a is formed with a gate insulating film 203a interposed. Gate electrode 204a is covered with a sidewall insulating film 205a on its top and side surfaces.

In a region of silicon substrate 201 where the n-channel MOS transistor forming the BL driver is formed, an n-type well region 202k is formed. On the main surface of silicon substrate 201 where this n-type well region is formed, source/drain regions 202c, 202d of the n-channel MOS transistor is formed. Source/drain regions 202c, 202d are arranged to opposed to each other with a channel region interposed therebetween. On the channel region between source/drain regions 202c and 202d, a gate electrode 204b is formed with a gate insulating film 203b interposed. Gate electrode 204b is covered with a sidewall insulating film 205b on its top and side surfaces.

On the main surface of silicon substrate 201 where the p-channel MOS transistor forming the logic circuit is formed, source/drain regions 202i, 202j of the p-channel MOS transistor are formed. Source/drain regions 202i, 202j are arranged to oppose to each other with a channel region interposed therebetween. On the channel region between source/drain regions 202i and 202j, a gate electrode 204d is formed with a gate insulating film 203d interposed. Gate electrode 204d is covered with a sidewall insulating film 205d on its top and side surfaces. The p-channel MOS transistor and the n-channel MOS transistor described above are isolated from each other by an element-isolating film 206.

Furthermore, as shown in FIG. 24, in a region of silicon substrate 201 where the n-channel MOS transistor forming the WL driver is formed, n-type well region 202k is formed. On the main surface of silicon substrate 201 where this n-type well region 202k is formed, source/drain regions 202e, 202f of the n-channel MOS transistor are formed. Source/drain regions 202e, 202f are arranged to oppose to each other with a channel region interposed therebetween. On the channel region between source/drain regions 202e and 202f, a gate electrode 204c is formed with a gate insulating film 203c interposed. Gate electrode 204c is covered with a sidewall insulating film 205c on its top and side surfaces.

As shown in FIGS. 23 and 24, a first interlayer insulating film 210 is formed on these p-channel MOS transistor and n-channel MOS transistor. In first interlayer insulating film 210, contact holes are formed in the respective regions positioned on source/drain regions 202a–202f, 202i, 202j. These contact holes are filled with a conductor film to form connecting contacts 212a–212f, 212i, 212j in first interlayer insulating film 210. It is noted that connecting contact 212b is connected to connecting contact 212c on first interlayer insulating film 210. Therefore, the drain of the p-channel MOS transistor and the source of the n-channel MOS transistor, which form a BL driver, are electrically connected with each other. Connecting contact 212a is connected to a power supply. Therefore, a power supply voltage (VCC) is applied to the source of the p-channel MOS transistor forming the BL driver. A ground voltage (VSS) is applied to connecting contact 212d. Therefore, the drain of the n-channel MOS transistor forming the BL driver is grounded. Furthermore, a ground voltage (VSS) is applied to connecting contact 212e. As a result, the drain of the n-channel MOS transistor forming the WL driver is grounded.

As shown in FIGS. 23 and 24, a second interlayer insulating film 220 is formed on first interlayer insulating film 210. A third interlayer insulating film 230 is formed on second interlayer insulating film 220. In second interlayer insulating film 220, a contact hole is formed in a region positioned on connecting contact 212f formed in first interlayer insulating film 210. This contact hole is filled with a conductor film to form a connecting contact 222a. In second interlayer insulating film 220 and third interlayer insulating film 230, one contact hole is formed in a region positioned on a connecting portion between connecting contacts 212b and 212c formed in first interlayer insulating film 210. This contact hole is filled with a conductor film to form a connecting contact 232a in second interlayer insulating film 220 and third interlayer insulating film 230.

In third interlayer insulating film 230, a plurality of word lines 270 are positioned to extend approximately parallel in a direction normal to the plane of FIG. 23. On each of word lines 270, an access diode 280 is positioned which is formed of an n-type silicon layer 281 as an n-type semiconductor layer recrystallized by the melting-recrystallization method and a p-type silicon layer 282 as a p-type semiconductor layer recrystallized by the melting-recrystallization method. Access diode 280 has a pn junction at the interface between n-type silicon layer 281 and p-type silicon layer 282.

A TMR element 290 is positioned on each access diode 280. Each TMR element 290 includes an MTJ layer comprised of a ferromagnetic layer, a tunnel insulator layer and a ferromagnetic layer, and an antiferromagnetic layer in contact with one of the ferromagnetic layers. A contact hole is formed on each TMR element 290. The contact holes are filled with conductor film to form connecting contacts 236. Each of conductor films 236 is connected to each of a plurality of bit lines 260 extending in a direction normal to the plane of FIG. 24. It is noted that a passivation film 240 is formed on bit line 260.

To sum up the characteristic structure of nonvolatile semiconductor memory device 1C in the present embodiment as described above, nonvolatile semiconductor memory device 1C further includes a circuit portion formed of a field effect transistor to form a BL driver, a WL driver, a logic circuit or the like, in addition to the features of nonvolatile semiconductor memory device 1A in the first embodiment described above. The aforementioned circuit portion and the memory cell are arranged in a stacked manner above the main surface of silicon substrate 201 as a semiconductor substrate.

In the present structure, the circuit portion and the memory cell array can be arranged in a stacked manner, thereby leading to reduced areas for the memory cell array and the circuit portion, in addition to the effect of the first embodiment described above. Therefore, the nonvolatile semiconductor memory device can largely be reduced in size.

Fourth Embodiment

A nonvolatile semiconductor memory device in a fourth embodiment of the present invention will now be described. It is noted that the circuit configuration of nonvolatile semiconductor memory device 1D in the present embodiment is similar to the circuit configuration of nonvolatile semiconductor memory device 1A in the first embodiment described above. The description of the structure of the nonvolatile semiconductor memory device in the word extending direction will not be repeated herein.

Figure 25:
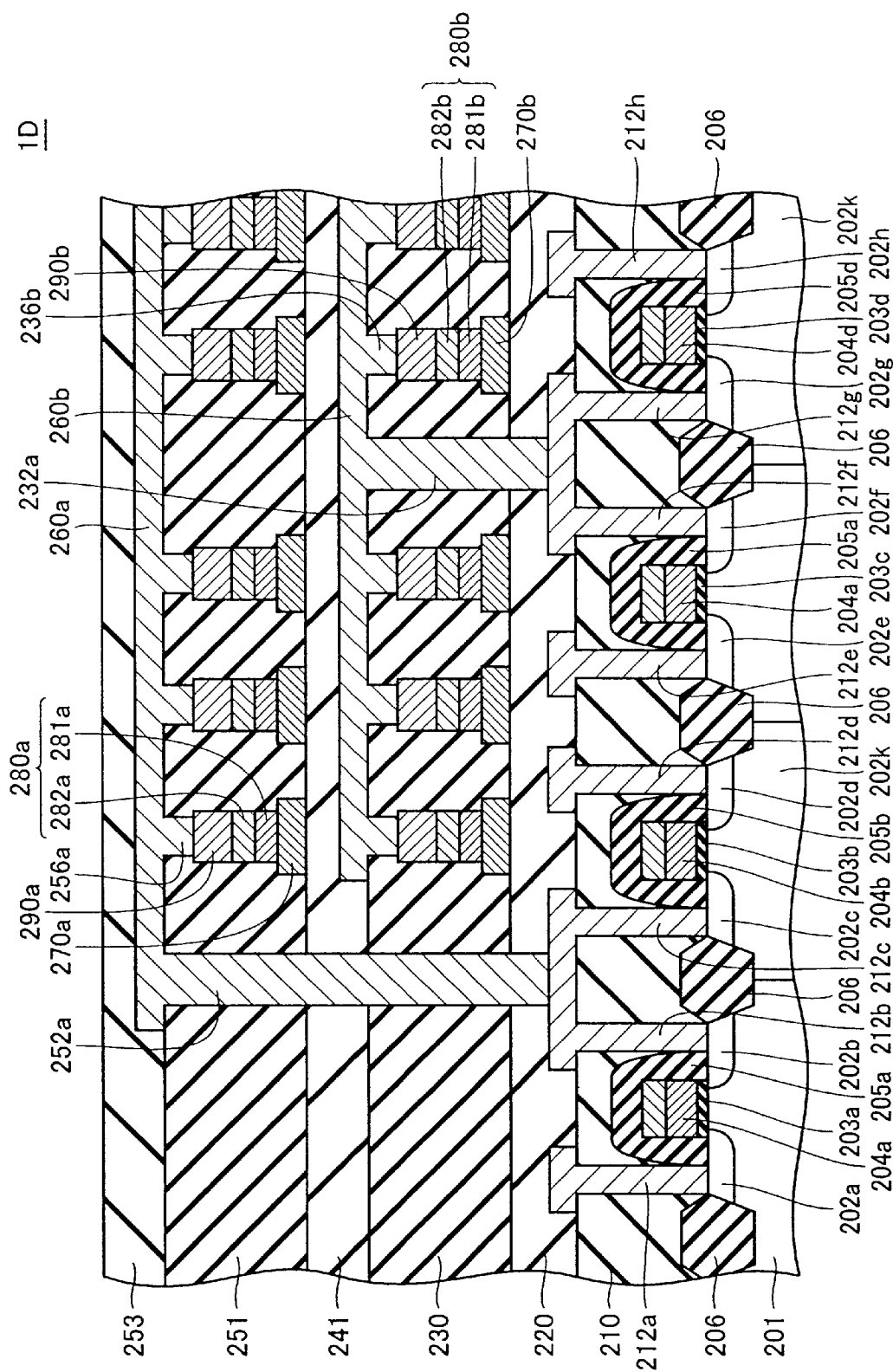
FIG. 25 is a schematic cross sectional view along a bit line extending direction in a nonvolatile semiconductor memory device in a fourth embodiment of the present invention.

As shown in FIG. 25, nonvolatile semiconductor memory device 1D in the present embodiment includes, in a bit line extending direction, two pairs of p-channel MOS transistors and n-channel MOS transistors forming the BL driver, and a field effect transistor forming a logic circuit (not shown), on the main surface of p-type silicon substrate 201 as a semiconductor substrate. Two-layer memory cell arrays are arranged in a stacked manner above these transistors.

In the following, the structure of nonvolatile semiconductor memory device 1D in the present embodiment will be described specifically.

As shown in FIG. 25, in a prescribed region of the main surface of silicon substrate 201, source/drain regions 202a, 202b and 202e, 202f of two p-channel MOS transistors forming the BL driver are formed. Each of source/drain regions 202a, 202b and 202e, 202f are arranged to oppose to each other with respective channel regions interposed therebetween. On the respective channel regions between source/drain regions 202a and 202b and source/drain regions 202e and 202f, gate electrodes 204a and 204c are formed with gate insulating films 203a and 203c interposed, respectively. These gate electrodes 204a and 204c are covered with sidewall insulating films 205a and 205c, respectively, on their top and side surfaces.

In the regions of silicon substrate 201 where two n-channel MOS transistors forming the BL driver are formed, n-type well regions 202k are formed. On the main surface of silicon substrate 201 where n-type well regions 202k are formed, source/drain regions 202c, 202d and 202g, 202h of two n-channel MOS transistors are formed. Each of source/drain regions 202c, 202d and 202g, 202h are arranged to oppose to each other with the channel regions interposed therebetween. On the respective channel regions between source/drain regions 202c and 202d as well as between source/drain regions 202g and 202h, gate electrodes 204b and 204d are formed with gate insulating films 203b and 203d interposed, respectively. These gate electrodes 204b and 204d are covered with sidewall insulating films 205b and 205d, respectively, on their top and side surfaces. It is noted that each p-channel MOS transistor and each n-channel MOS transistor forming the BL driver as described above are isolated from each other by element-isolating film 206.

First interlayer insulating film 210 is formed on these p-channel MOS transistors and n-channel MOS transistors forming the BL driver. In first interlayer insulating film 210, contact holes are formed in respective regions positioned on source/drain regions 202a–202h. These contact holes are filled with a conductor film to form connecting contacts 212a–212h in first interlayer insulating film 210. It is noted that connecting contact 212b is connected to connecting contact 212c on first interlayer insulating film 210. Furthermore, connecting contact 212f is connected to connecting contact 212g on first interlayer insulating film 210. Therefore, the drain of the p-channel MOS transistor and the source of the n-channel MOS transistor, which form the BL driver, are electrically connected to each other. Connecting contacts 212a and 212e are connected to a power supply. Therefore, a power supply voltage (VCC) is applied to the source of the p-channel MOS transistor forming the BL driver. A ground voltage (VSS) is applied to connecting contacts 212d and 212h. Therefore, the drain of the n-channel MOS transistor forming the BL driver is grounded.

As shown in FIG. 25, second interlayer insulating film 220 is formed on first interlayer insulating film 210. Third interlayer insulating film 230 is formed on second interlayer insulating film 220. A fourth interlayer insulating film 241 is formed on third interlayer insulating film 230. A fifth interlayer insulating film 251 is formed on fourth interlayer insulating film 241.

In second and third interlayer insulating films 220, 230, one contact hole is formed in a region positioned on a connecting portion between connecting contacts 212f and 212g formed in first interlayer insulating film 210. This contact hole is filled with a conductor film to form connecting contact 232a in second interlayer insulating film 220 and third interlayer insulating film 230. A bit line 260b is formed between third interlayer insulating film 230 and fourth interlayer insulating film 241. This bit line 260b is connected to connecting contact 232a formed in second interlayer insulating film 220 and third interlayer insulating film 230.

In second, third, fourth, and fifth interlayer insulating films 220, 230, 241, and 251, one contact hole is formed in a region positioned on a connecting portion between connecting contacts 212b and 212c formed in first interlayer insulating film 210. This contact hole is filled with a conductor film to form a connecting contact 252a in second, third, fourth, and fifth interlayer insulating films 220, 230, 241, and 251. A bit line 260a is formed between fourth interlayer insulating film 241 and fifth interlayer insulating film 251. This bit line 260a is connected to connecting contact 252a formed in second, third, fourth, and fifth interlayer insulating films 220, 230, 241, and 251.

In third interlayer insulating film 230, a plurality of word lines 270b are positioned to extend approximately parallel in a direction normal to the plane of FIG. 25. On each of word lines 270b, an access diode 280b is positioned which is formed of an n-type silicon layer 281b as an n-type semiconductor layer recrystallized by the melting-recrystallization method and a p-type silicon layer 282b as a p-type semiconductor layer recrystallized by the melting-recrystallization method. Access diode 280b has a pn junction at the interface between n-type silicon layer 281b and p-type silicon layer 282b.

A TMR element 290b is positioned on each of access diodes 280b. Each TMR element 290b includes an MTJ layer comprised of a ferromagnetic layer, a tunnel insulator layer and a ferromagnetic layer, and an antiferromagnetic layer in contact with one of the ferromagnetic layers. A contact hole is formed on each of TMR elements 290b. The contact holes are filled with a conductor film to form connecting contacts 236b. Each connecting contact 236b is connected to bit line 260b extending in a direction parallel to the plane of FIG. 25.

In fifth interlayer insulating film 251, a plurality of word lines 270a are positioned to extend approximately parallel in a direction normal to the plane of FIG. 25. On each of word lines 270a, an access diode 280a is positioned which is formed of an n-type silicon layer 281a as an n-type semiconductor layer recrystallized by the melting-recrystallization method and a p-type silicon layer 282a as a p-type semiconductor layer recrystallized by the melting-recrystallization method. Access diode 280a has a pn junction at the interface between n-type silicon layer 281a and p-type silicon layer 282a.

A TMR element 290a is positioned on each of access diodes 280a. Each TMR element 290a includes an MTJ layer comprised of a ferromagnetic layer, a tunnel insulator layer and a ferromagnetic layer, and an antiferromagnetic layer in contact with one of the ferromagnetic layers. A contact hole is formed on each of TMR elements 290a. The contact holes are filled with a conductor film to form connecting contacts 256a. Each connecting contact 256a is connected to bit line 260a extending in a direction parallel to the plane of FIG. 25. It is noted that a passivation film 253 is formed on bit line 260a.

To sum up the characteristic structure of nonvolatile semiconductor memory device 1D in the present embodiment as described above, nonvolatile semiconductor memory device 1D includes a plurality of memory cells arranged in a stacked manner above the main surface of silicon substrate 201 as a semiconductor substrate, in addition to the features of nonvolatile semiconductor memory device 1C in the third embodiment described above.

In the present structure, the memory cell arrays can be arranged in a stacked manner, thereby leading to a reduced area for the memory cell array, in addition to the effect of the first embodiment described above. Therefore, the nonvolatile semiconductor memory device can largely be reduced in size.

Fifth Embodiment

A nonvolatile semiconductor memory device in a fifth embodiment of the present invention will now be described. It is noted that the circuit configuration of nonvolatile semiconductor memory device 1E in the present embodiment differs from the circuit configuration of nonvolatile semiconductor memory device 1A in the first embodiment described above in that each word line is divided into a word line for writing data and a word line for reading data. In other words, nonvolatile semiconductor memory device 1E in the present embodiment includes n bit lines arranged approximately parallel, and k word lines for writing data arranged approximately parallel and k word lines for reading data arranged approximately parallel, to intersect these bit lines.

Figure 26:
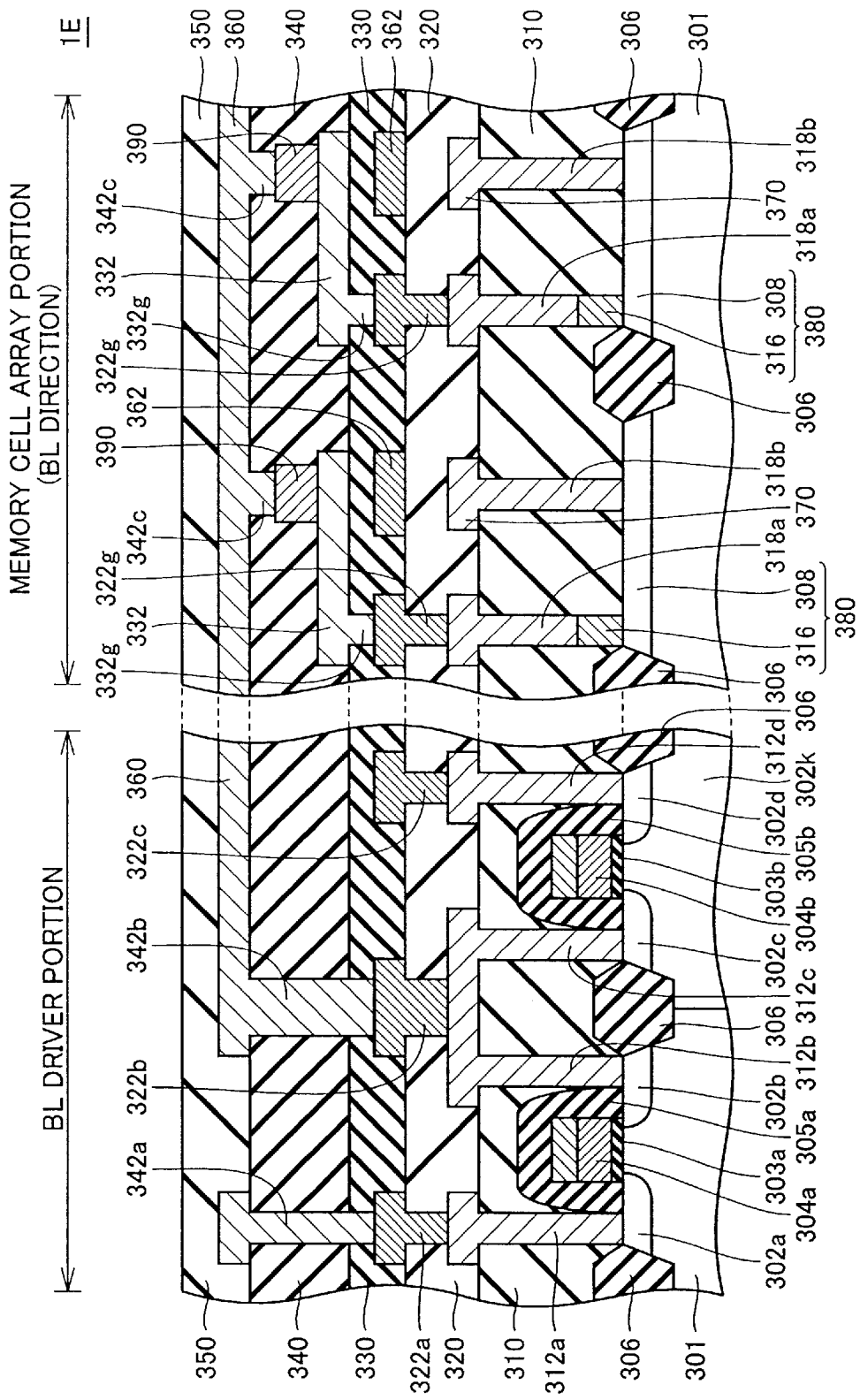
FIG. 26 is a schematic cross sectional view along a bit line extending direction in a nonvolatile semiconductor memory device in a fifth embodiment of the present invention.
Figure 27:
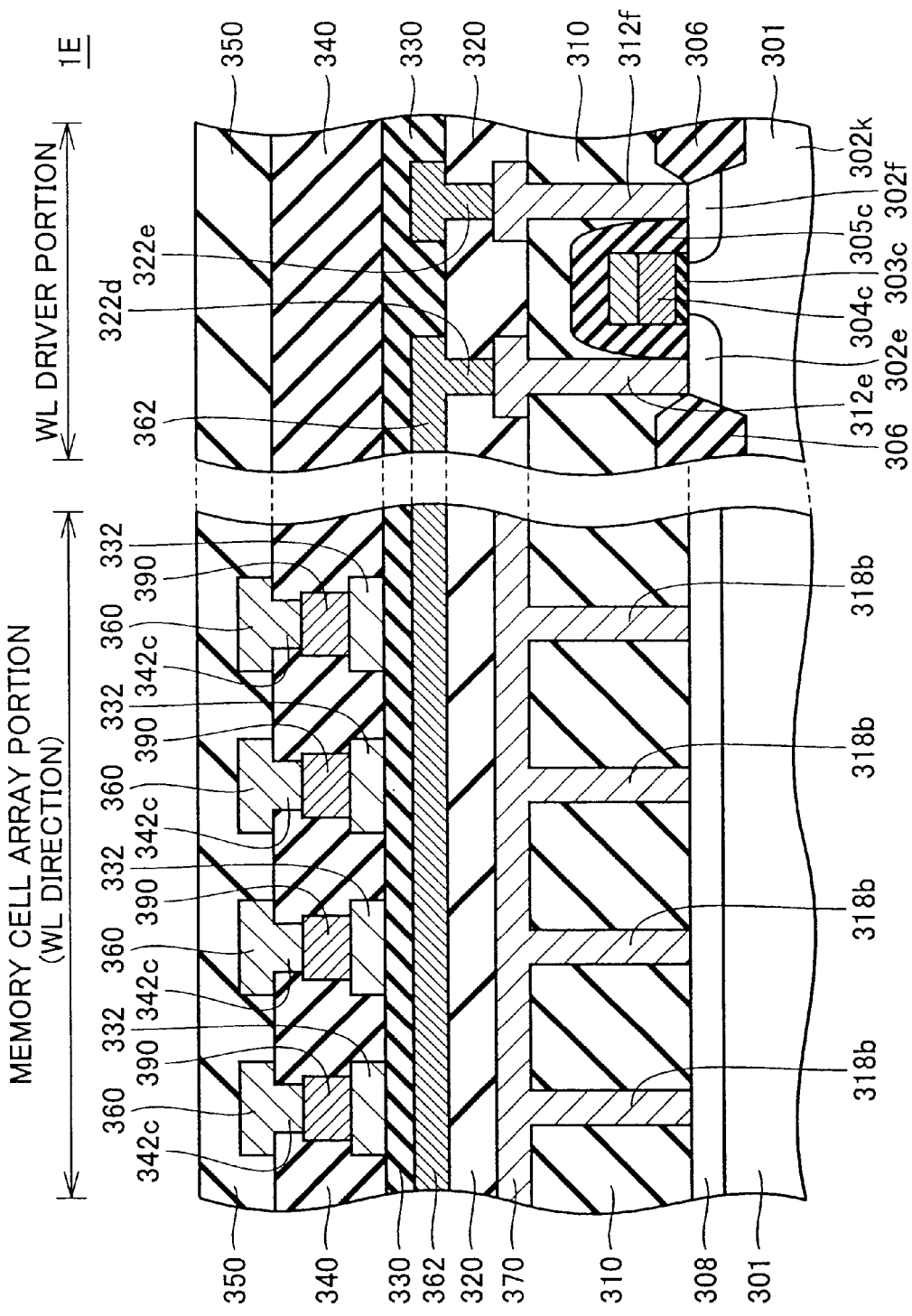
FIG. 27 is a schematic cross sectional view along a word line extending direction in the nonvolatile semiconductor memory device in the fifth embodiment of the present invention.

As shown in FIGS. 26 and 27, nonvolatile semiconductor memory device 1E in the present embodiment includes a memory cell array portion, a BL driver portion and a WL driver portion, similar to nonvolatile semiconductor memory device 1A in the first embodiment described above.

In the memory cell array portion, a plurality of memory cell are formed each including a TMR element 190 and an access diode 180. In the BL driver portion, two field effect transistors are formed for controlling the memory cells. These two field effect transistors are a p-channel MOS transistor and an n-channel MOS transistor. In the WL driver portion, a field effect transistor for controlling the memory cells is formed. This field effect transistor is an n-channel MOS transistor.

In the following, the structure of nonvolatile semiconductor memory device 1E in the present embodiment will be described specifically.

As shown in FIG. 26, in the BL driver portion of nonvolatile semiconductor memory device 1E, source/drain regions 302a, 302b of the p-channel MOS transistor are formed on a main surface of a p-type silicon substrate 301 as a semiconductor substrate. Source/drain regions 302a, 302b are arranged to oppose to each other with a channel region interposed therebetween. On the channel region between source/drain regions 302a and 302b, a gate electrode 304a is formed with a gate insulating film 303a interposed. This gate electrode 304a is covered with a sidewall insulating film 305a on its top and side surfaces.

In a region where the n-channel MOS transistor of the BL driver portion is formed, an n-type well region 302k is formed in silicon substrate 301. On the main surface of silicon substrate 301 where this n-type well region 302k is formed, source/drain regions 302c, 302d of the n-channel MOS transistor are formed. Source/drain regions 302c and 302d are arranged to oppose to each other with a channel region interposed therebetween. On the channel region between source/drain regions 302c and 302d, a gate electrode 304b is formed with a gate insulating film 303b interposed. This gate electrode 304b is covered with a sidewall insulating film 305b on its top and side surfaces. It is noted that the p-channel MOS transistor and the n-channel MOS transistor as described above are isolated from each other by an element-isolating film 306.

A first interlayer insulating film 310 is formed on these p-channel MOS transistor and n-channel MOS transistor forming the BL driver portion. In first interlayer insulating film 310, contact holes are formed in the respective regions positioned on source/drain regions 302a–302d. These contact holes are filled with a conductor film to form connecting contacts 312a–312d in first interlayer insulating film 310. It is noted that connecting contact 312b is connected to connecting contact 312c on first interlayer insulating film 310. Therefore, the drain of the p-channel MOS transistor and the source of the n-channel MOS transistor, which form the BL driver, are electrically connected to each other.

A second interlayer insulating film 320 is formed on first interlayer insulating film 310. In second interlayer insulating film 320, contact holes are formed in the regions positioned on connecting contacts 312a and 312d formed in first interlayer insulating film 310. Furthermore, one contact hole is formed on a connecting portion between connecting contacts 312b and 312c. These three contact holes are filled with a conductor film to form connecting contacts 322a–322c in second interlayer insulating film 320. It is noted that a ground voltage (VSS) is applied to connecting contact 322c. Therefore, the drain of the n-channel MOS transistor forming the BL driver portion is grounded.

A third interlayer insulating film 330 and a fourth interlayer insulating film 340 are formed on second interlayer insulating film 320. In third interlayer insulating film 330 and fourth interlayer insulating film 340, contact holes are formed in the regions positioned on connecting contacts 322a and 322b formed in second interlayer insulating film 320. These two contact holes are filled with a conductor film to form connecting contacts 342a, 342b in third and fourth interlayer insulating films 330 and 340. It is noted that connecting contact 342a is connected to a power supply. Therefore, a power supply voltage (VCC) is applied to the source of the p-channel MOS transistor forming the BL driver.

A passivation film 350 is formed on fourth interlayer insulating film 340. A bit line 360 is formed between fourth interlayer insulating film 340 and passivation film 350. This bit line 360 is connected to connecting contact 342b formed in third interlayer insulating film 330 and fourth interlayer insulating film 340. It is noted that bit line 360 is electrically connected to the memory cells in the memory cell array portion described later.

As shown in FIG. 27, in a region where the n-channel MOS transistor of the WL driver portion is formed, an n-type well region 302k is formed in silicon substrate 301. Source/drain regions 302e, 302f are formed on the main surface of silicon substrate 301 where this n-type well region 302k is formed. Source/drain regions 302e, 302f are arranged to oppose to each other with a channel region interposed therebetween. On the channel region between source/drain regions 302e and 302f, a gate electrode 304c is formed with a gate insulating film 303c interposed. Gate electrode 304c is covered with a sidewall insulating film 305c on its top and side surfaces.

First interlayer insulating film 310 is formed on the n-channel MOS transistor. In first interlayer insulating film 310, contact holes are formed in the respective regions positioned on source/drain regions 302e and 302f. These contact holes are filled with a conductor film to form connecting contact 312e, 312f in first interlayer insulating film 310.

Second interlayer insulating film 320 is formed on first interlayer insulating film 310. In second interlayer insulating film 320, contact holes are formed in the respective regions positioned on connecting contacts 312e, 312f formed in first interlayer insulating film 310. These contact holes are filled with a conductor film to form connecting contacts 322d, 322e in second interlayer insulating film 320. It is noted that a ground voltage (VSS) is applied to connecting contact 322e. Therefore, the drain of the n-channel MOS transistor forming the WL driver is grounded.

Third interlayer insulating film 330, fourth interlayer insulating film 340 and passivation film 350 are formed on second interlayer insulating film 320. A word line for writing 362 is formed between second interlayer insulating film 320 and third interlayer insulating film 330. Word line for writing 362 is connected to connecting contact 322d formed in second interlayer insulating film 320.

As shown in FIGS. 26 and 27, in the memory cell array portion of nonvolatile semiconductor memory device 1E, silicon substrate 301 is partitioned by element-isolating film 306 in the bit line extending direction. An n-type diffusion layer 308 is formed on the main surface of silicon substrate 301.

First interlayer insulating film 310 is formed on the main surface of silicon substrate 301. In first interlayer insulating film 310, two contact holes are formed on n-type diffusion layer 308 for each memory cell. A p-type silicon layer 316 is formed by the epitaxial growth method at the upper portion of one of these contact holes. This p-type silicon layer 316 is in contact with n-type diffusion layer 308 of silicon substrate 301 at the interface at the lower end, to form a pn junction. The contact hole on p-type silicon layer 316 is filled with a conductor film to form a connecting contact 318a in first interlayer insulating film 310. On the other hand, the other contact hole is filled with a conductor film to form a connecting contact 318b in first interlayer insulating film 310.

Second interlayer insulating film 320 is formed on first interlayer insulating film 310. A plurality of word lines for reading 370 are formed between first interlayer insulating film 310 and second interlayer insulating film 320 to extend in a direction normal to the plane of FIG. 26. These word lines for reading 370 are connected to respective connecting contacts 318b.

In second interlayer insulating film 320, a contact hole is formed in a region positioned on connecting contact 318a formed in first interlayer insulating film 310. This contact hole is filled with a conductor film to form a connecting contact 322g in second interlayer insulating film 320.

Third interlayer insulating film 330 is formed on second interlayer insulating film 320. A plurality of word lines for writing 362 extending in the direction normal to the plane of FIG. 26 are formed at the corresponding positions above word lines for reading 370 between second interlayer insulating film 320 and third interlayer insulating film 330.

In third interlayer insulating film 330, a contact hole is formed in a region positioned on connecting contact 322g formed in second interlayer insulating film 320. This contact hole is filled with a conductor film to form a connecting contact 332g in third interlayer insulating film 330.

Fourth interlayer insulating film 340 is formed on third interlayer insulating film 330. A strap 332 is formed between third interlayer insulating film 330 and fourth interlayer insulating film 340. Strap 332 is connected to connecting contact 332g. The other end of strap 332 extends over word line for writing 362. A TMR element 390 is formed on strap 332 at a position corresponding to word line for writing 362. Each TMR element 390 includes an MTJ layer comprised of a ferromagnetic layer, a tunnel insulator layer and a ferromagnetic layer, and an antiferromagnetic layer in contact with one of the ferromagnetic layers. A contact hole is formed on each of TMR elements 390. The contact holes are filled with a conductor film to form connecting contacts 342c.

Passivation film 350 is formed on fourth interlayer insulating film 340. Between fourth interlayer insulating film 340 and passivation film 350, a plurality of bit lines 360 are formed to extend in a direction normal to the plane of FIG. 27. Bit lines 360 are connected to connecting contacts 342c.

To sum up the characteristic structure of nonvolatile semiconductor memory device 1E in the present embodiment as described above, nonvolatile semiconductor memory device 1E includes silicon substrate 301 as a semiconductor substrate, bit line 360 as a first conductive line, word line for reading 370 as a second conductive line, and a memory cell. Silicon substrate 301 has a main surface, and bit line 360 is positioned above the main surface of silicon substrate 301. Word line for reading 370 is provided to intersect bit line 360. A memory cell is positioned at and in proximity to a region where bit line 360 and word line for reading 370 intersect, and has one end electrically connected to bit line 360 and the other end electrically connected to word line for reading 370. This memory cell includes TMR element 390 as a memory element and access diode 380 as an access element which are electrically connected in series. Access diode 380 includes p-type silicon layer 316 as a first semiconductor layer selectively grown on the main surface of silicon substrate 301 by the epitaxial growth method, and has a pn junction at the interface between p-type silicon layer 316 and silicon substrate 301.

As described above, a pn junction diode is used as an access element, which includes the first semiconductor layer formed by the epitaxial growth method and has a pn junction between this semiconductor layer and the semiconductor substrate, so that a diode excellent in the electric characteristic such as an internal resistance or reverse direction characteristics can be used as an access element. As a result, a nonvolatile semiconductor memory device excellent in reading and writing operations can be provided.

Furthermore, the use of the aforementioned pn junction diode as an access element hardly causes variations in the electric characteristics of each access diode formed in a memory cell. Therefore, the sense current can be stabilized. Thus, the nonvolatile semiconductor memory devices excellent in reading and writing operations can be provided with a high production yield.

In addition, the use of a diode as an access element can largely reduce the memory cell array area as compared with the use of a transistor as an access element. The memory cell array can further be reduced as compared with the structure employing a pn diode as an access element, which is formed in a semiconductor substrate by forming a diffusion layer in the semiconductor substrate.

In addition, in the preset structure, since the word line is divided into a word line for reading data and a word line for writing data, a nonvolatile semiconductor memory device having excellent reading and writing characteristics can be provided.

As described above, with the use of a diode including a semiconductor layer formed by the epitaxial growth method as an access diode, the nonvolatile semiconductor memory devices having reduced areas and excellent characteristics can be manufactured with a high production yield.

Referring to FIGS. 28 to 42, a method of manufacturing the nonvolatile semiconductor memory device shown in FIGS. 26 and 27 will now be described.

Figure 28:
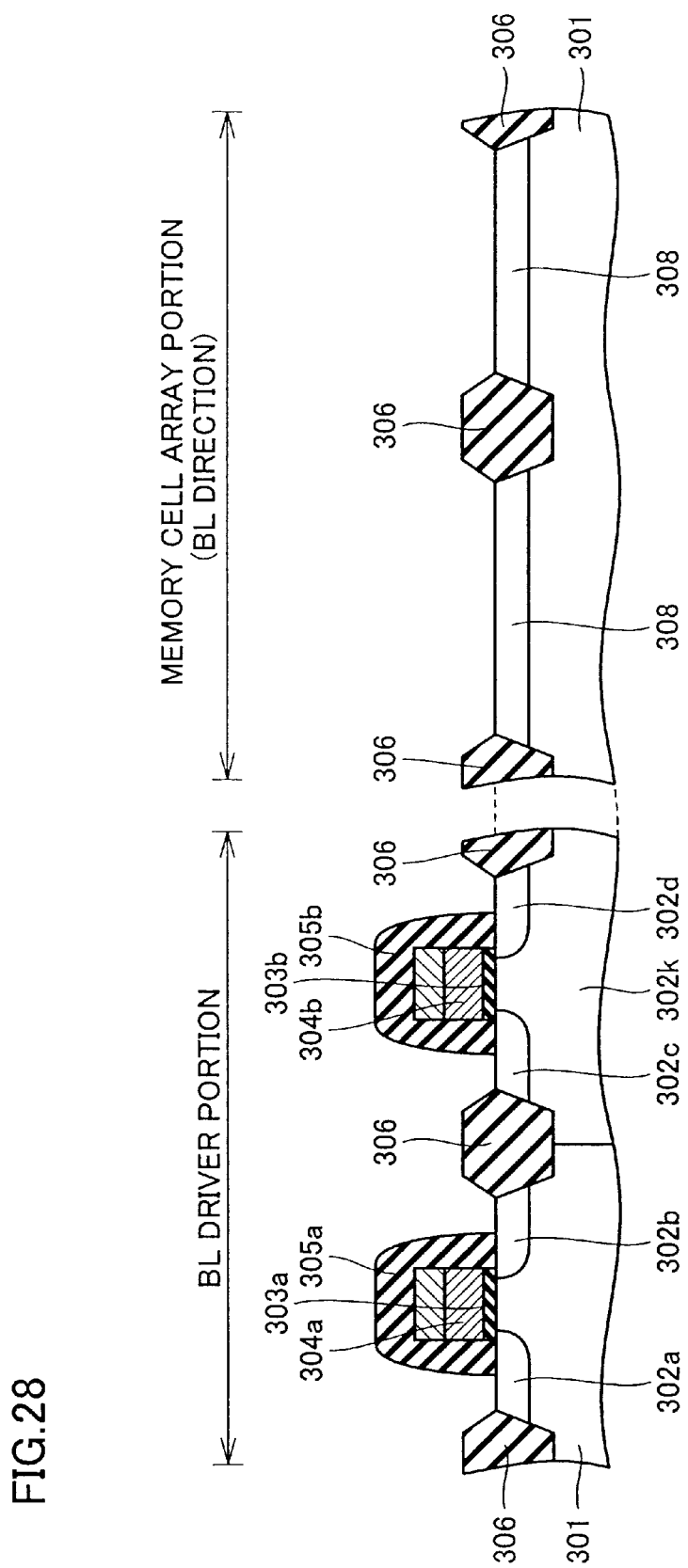
Figure 29:
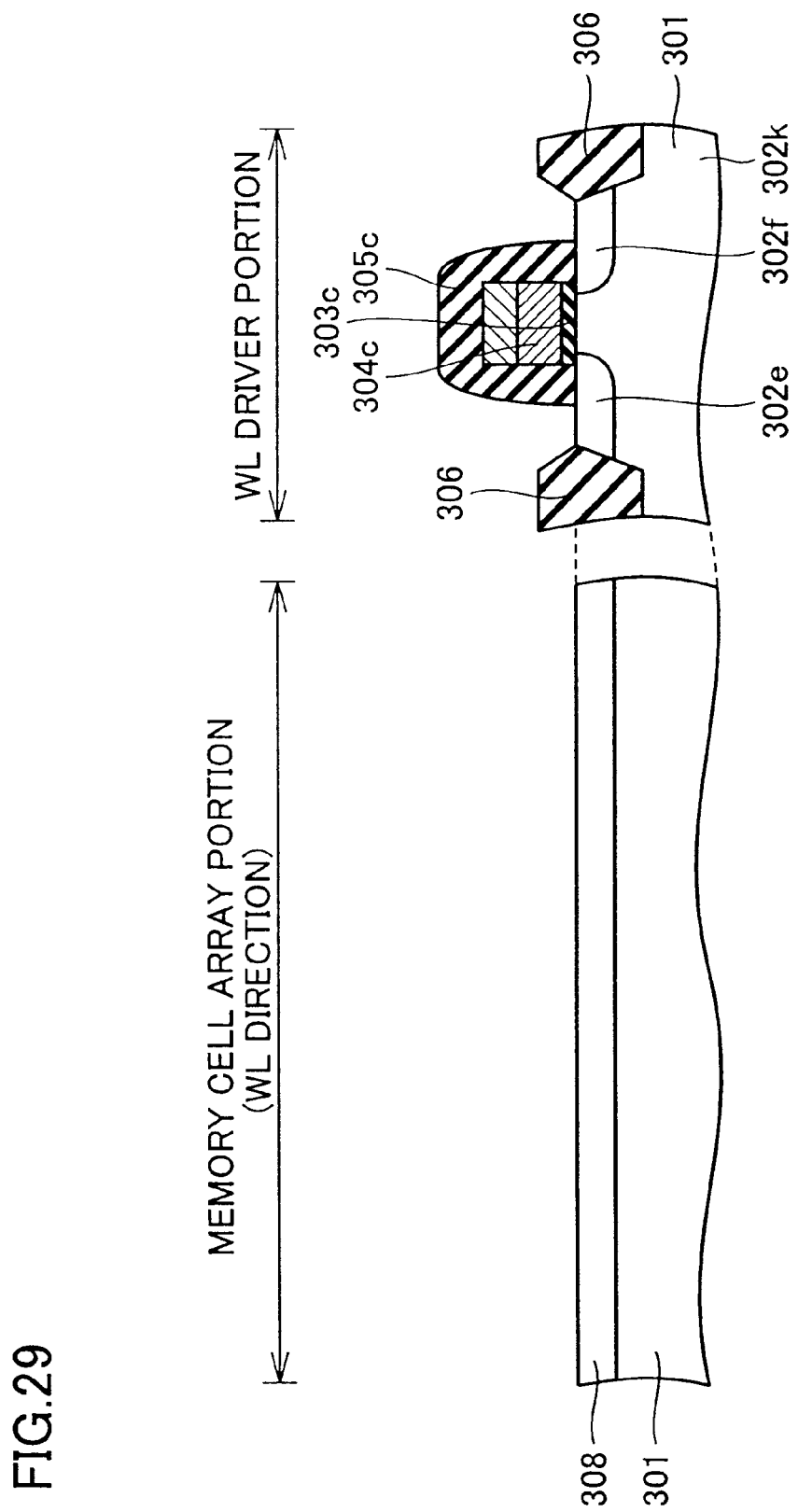

First, as shown in FIGS. 28 and 29, a p-channel MOS transistor and an n-channel MOS transistor forming a BL driver portion, an n-channel MOS transistor forming a WL driver portion, and a field effect transistor forming a logic circuit (not shown) are formed on the main surface of silicon substrate 301 by normal deposition, photolithography and ion implantation steps.

Specifically, using a mask (not shown) n-type well region 302k is formed in a prescribed region (a region where an n-channel MOS transistor is formed) of p-type silicon substrate 301. Element-isolating film 306 is then formed in a prescribed region of silicon substrate 301.

Then, an insulating film serving as gate insulating films 303a–303c is formed on the main surface of silicon substrate 301. On this insulating film, a conductor film serving as gate electrodes 304a–304c is formed. A resist film (not shown) having a pattern is formed on this conductor film, and using this resist film as a mask, the conductor film and the insulating film are partially removed by etching. Thereafter the resist film is removed. As a result, gate insulating films 303a–303c and gate electrodes 304a–304c are formed.

Then, using gate electrodes 304a–304c as a mask, a conductive impurity is implanted in the main surface of silicon substrate 301, thereby to form source/drain regions 302a–302f. It is noted that the p-channel MOS transistor and the n-channel MOS transistor are separately formed by introducing respective different conductivity types of impurity. Here, simultaneously with the formation of source/drain regions 302a, 302b of the p-channel MOS transistor, n-type diffusion layer 308 is formed in the memory cell array portion.

An insulating film serving as sidewall insulating films 305a–305c is then deposited to cover gate electrodes 304a–304c. This insulating film is selectively removed by anisotropic etching to form sidewall insulating films 305a–305c. This results in the p-channel MOS transistor and n-channel MOS transistor forming the BL driver portion, the n-channel MOS transistor forming the WL driver portion, and a field effect transistor forming a logic circuit (not shown).

Figure 30:
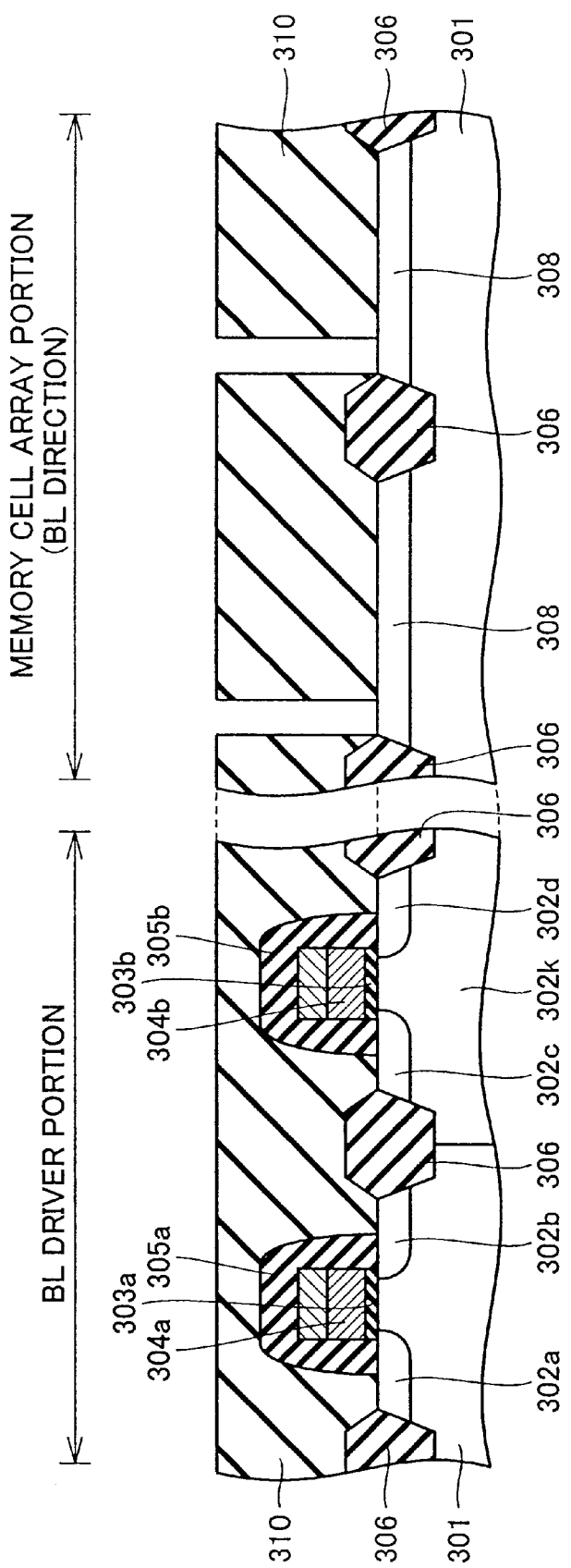
Figure 31:
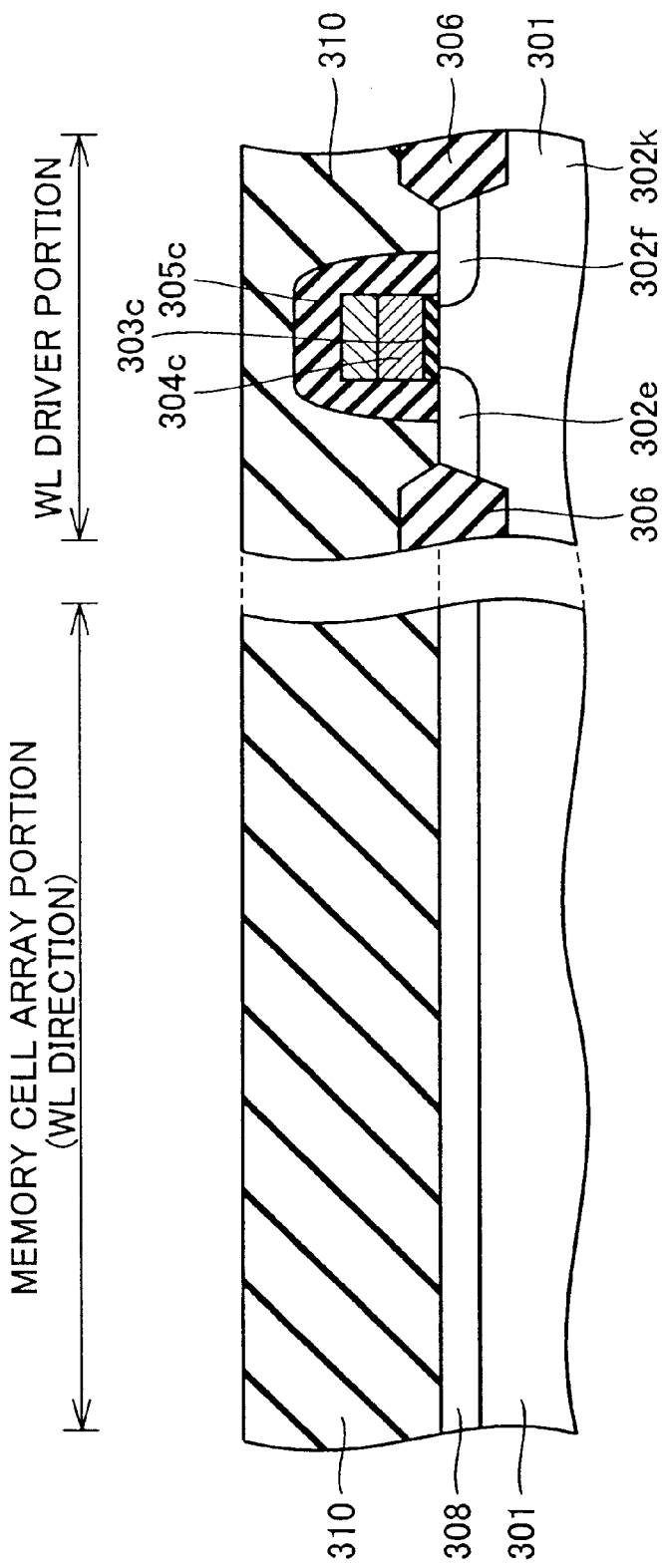
Figure 32:
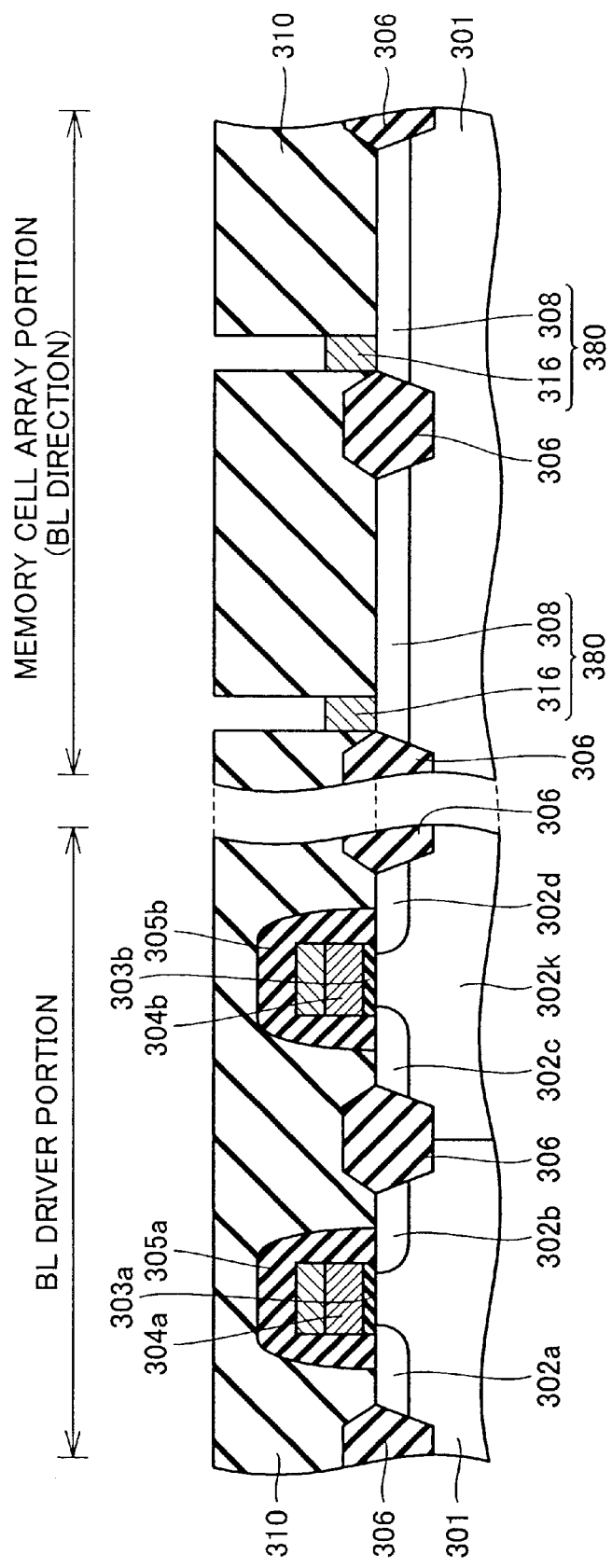

Then, as shown in FIGS. 30 and 31, first interlayer insulating film 310 is formed to cover the entire surface of silicon substrate 301. First interlayer insulating film 310 employs, for example, a BPTEOS film and desirably has a thickness of about 200 nm generally. Then, a resist film (not shown) having a pattern is formed on first interlayer insulating film 310 by photolithography. Using this resist film as a mask, a part of first interlayer insulating film 310 is removed by etching. Thereafter the resist film is removed. As a result, a contact hole is formed in first interlayer insulating film 310. It is noted that at this time a contact hole is created only in a portion where an access diode is to be formed, and the other contact holes are not formed in first interlayer insulating film 310 at this point.

Thereafter, an epitaxial growth layer is formed at the lower portion of the opening of the aforementioned contact hole by the epitaxial growth method. Then, boron (B) that is a p-type impurity is implanted in this epitaxial growth layer by ion implantation. Here, the implantation energy is for example 5 keV and the implantation concentration is for example about $1 \times 10^{15}$ cm$^{-2}$. As a result, p-type silicon layer 316 is formed at the lower portion of the opening of the aforementioned contact hole. Access diode 380 is constituted with this p-type silicon layer 316 and n-type diffusion layer 308 formed in silicon substrate 301.

Figure 33:
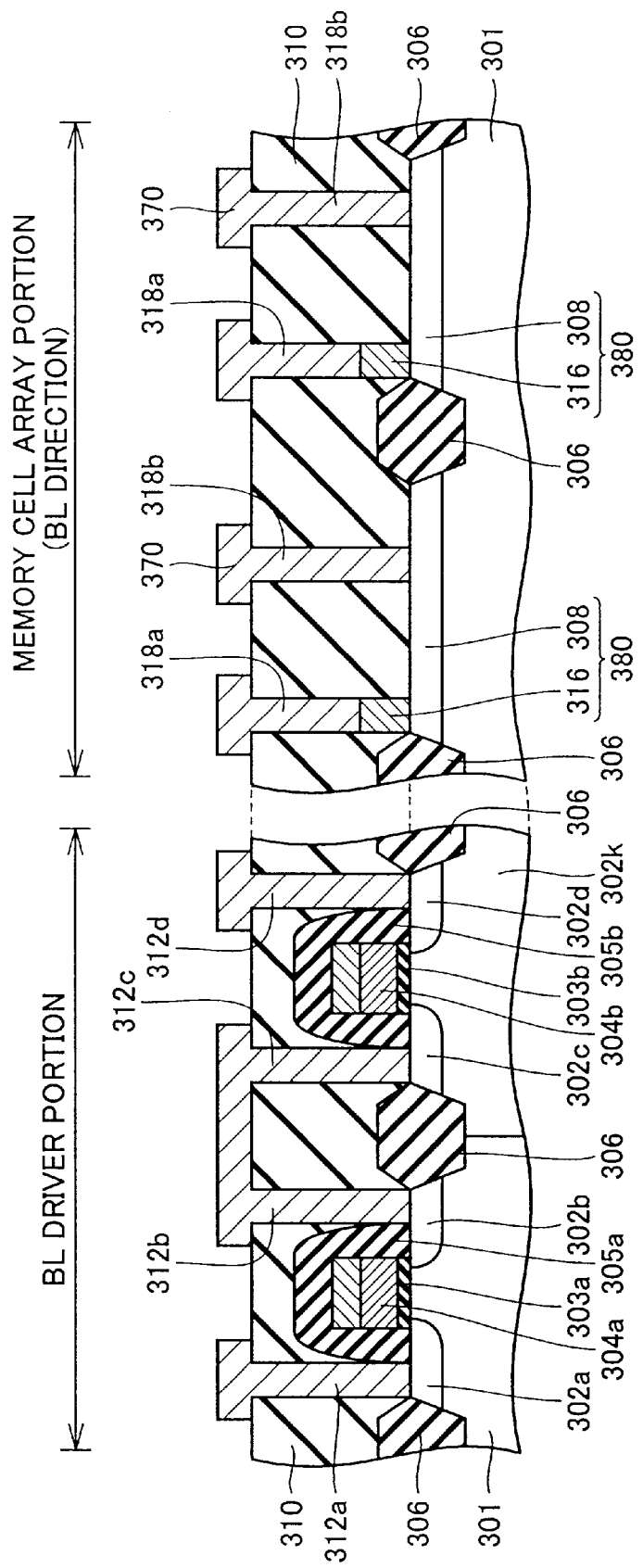
Figure 34:
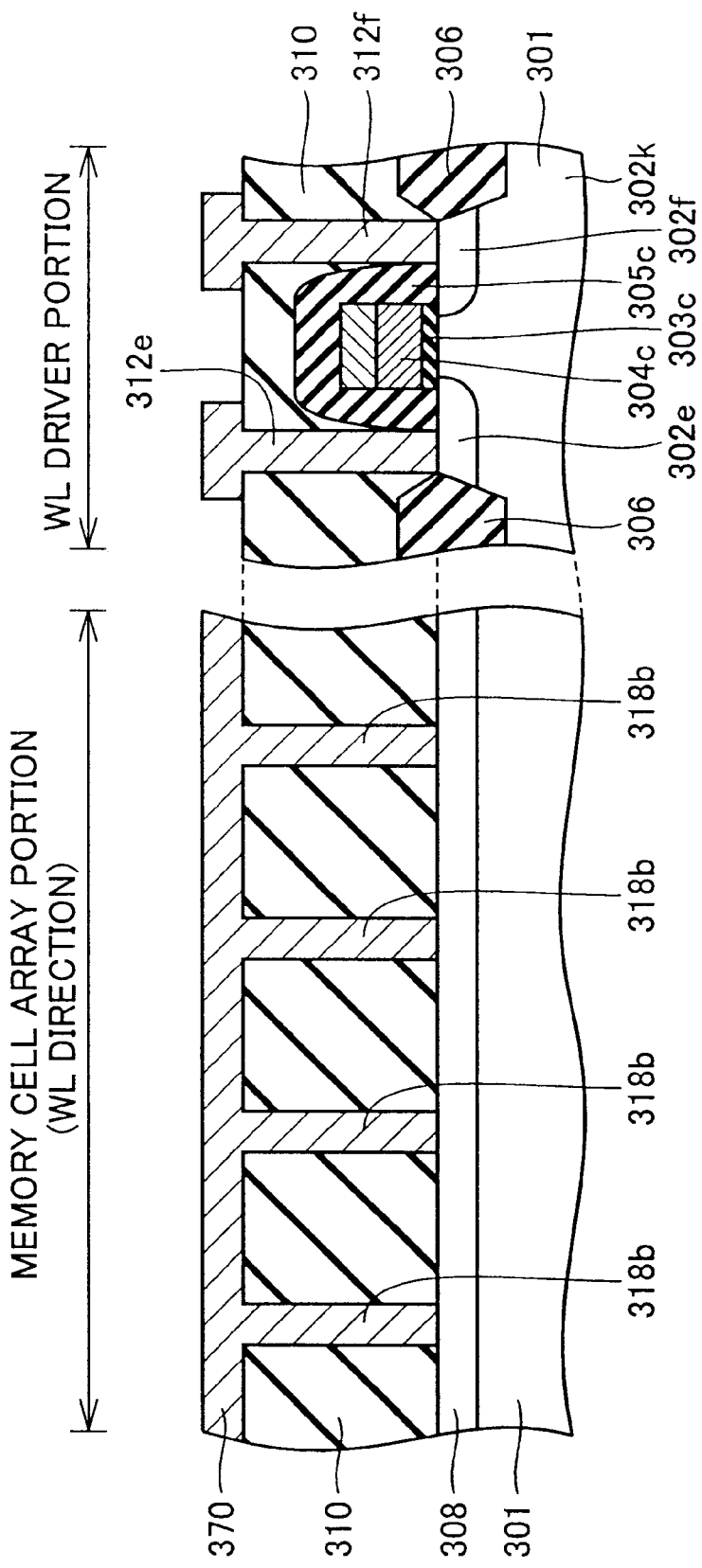

Then, as shown in FIGS. 33 and 34, a resist film (not shown) having a pattern is formed on first interlayer insulating film 310 by photolithography. At this point, p-type silicon layer 316 that has been already formed is also covered with the resist film. Using this resist film as a mask, a part of first interlayer insulating film 310 is removed by etching, so that the contact holes other than the contact hole in which an access diode is formed is formed. Thereafter the resist film is removed.

Next, a conductor film is formed which fills in all the contact holes formed in first interlayer insulating film 310 and extends over the upper surface of first interlayer insulating film 310. For example tungsten (W) is used as this conductor film. It is noted that in order to improve the sealing, a barrier metal film made of TiN may be formed prior to the filling of the tungsten film. Thereafter, a resist film (not shown) having a pattern is formed on this conductor film by photolithography. Using this resist film as a mask, a part of the conductor film is removed by etching. Thereafter the resist film is removed. As a result, connecting contacts 312a–312f and connecting contacts 318a, 318b are formed which fill the contact holes and extend over first interlayer insulating film 310. In the memory cell array portion, k word lines for reading 370 are formed to extend over connecting contact 318b.

Figure 35:
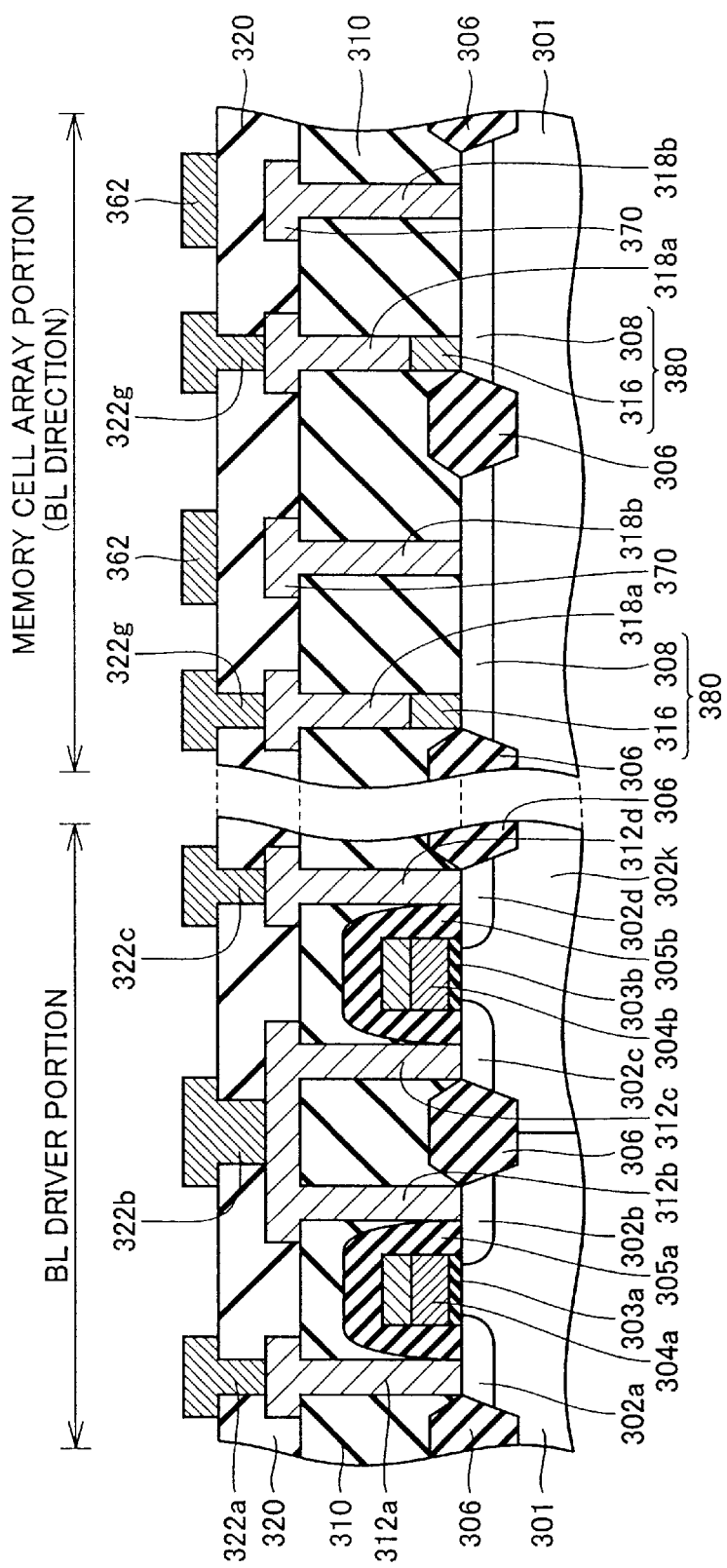
Figure 36:
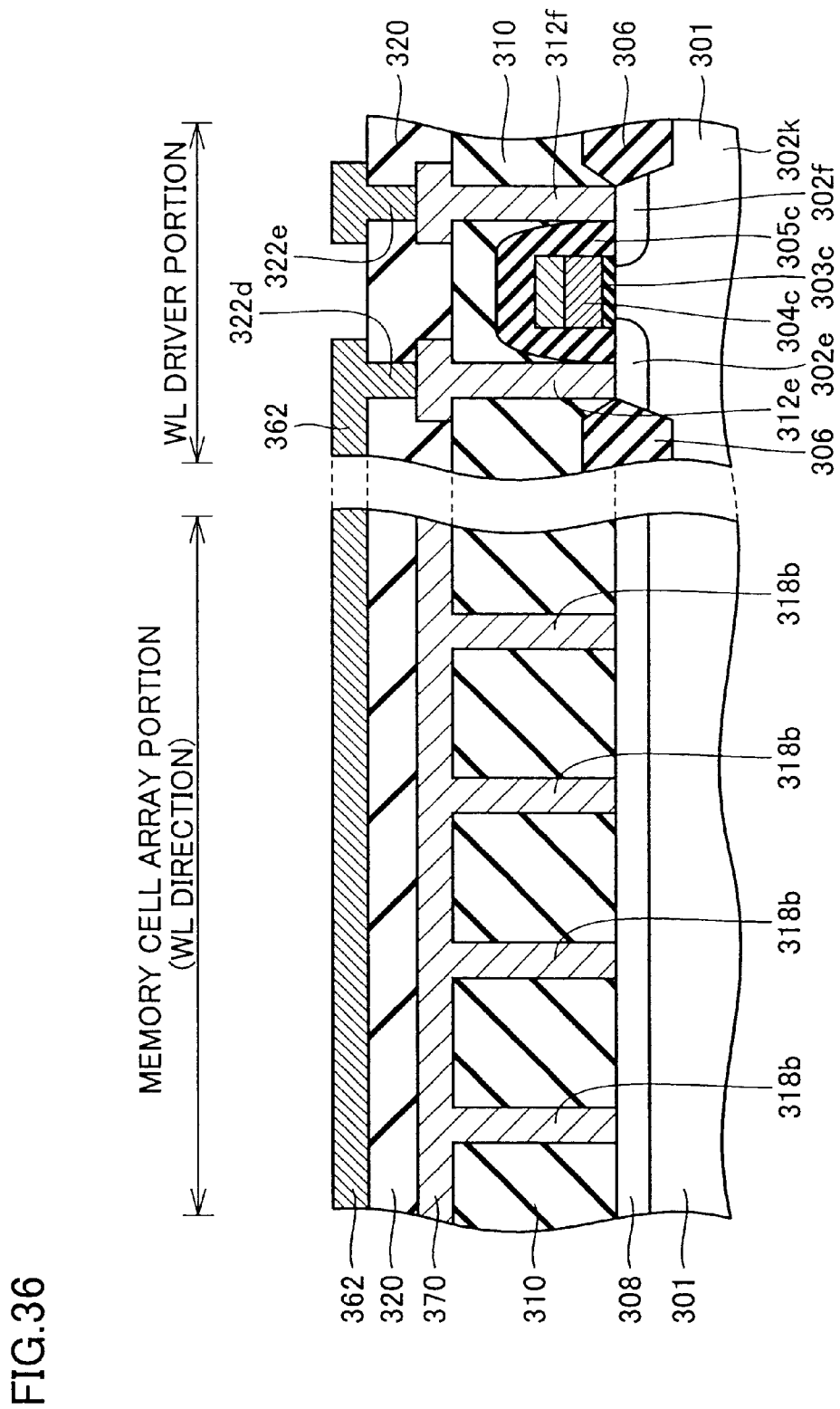

Then, as shown in FIGS. 35 and 36, second interlayer insulating film 320 is formed to cover first interlayer insulating film 310. A resist film (not shown) having a pattern is formed on second interlayer insulating film 320 by photolithography. Using this resist film as a mask, a part of second interlayer insulating film 320 is removed by etching. Thereafter the resist film is removed. As a result, contact holes are formed in second interlayer insulating film 320.

Then, a conductor film is formed which fills in the contact holes and extends over the upper surface of second interlayer insulating film 320. For example copper (Cu) is used as a conductor film. Thereafter, a resist film (not shown) having a pattern is formed on this conductor film by photolithography, and using this resist film as a mask, a part of the conductor film is removed by etching. Thereafter the resist film is removed. As a result, connecting contacts 322a–322e, 322g are formed which extend over second interlayer insulating film 320. In the memory cell array portion, word line for writing data 362 is formed in a position corresponding to word line for reading 370.

Figure 37:
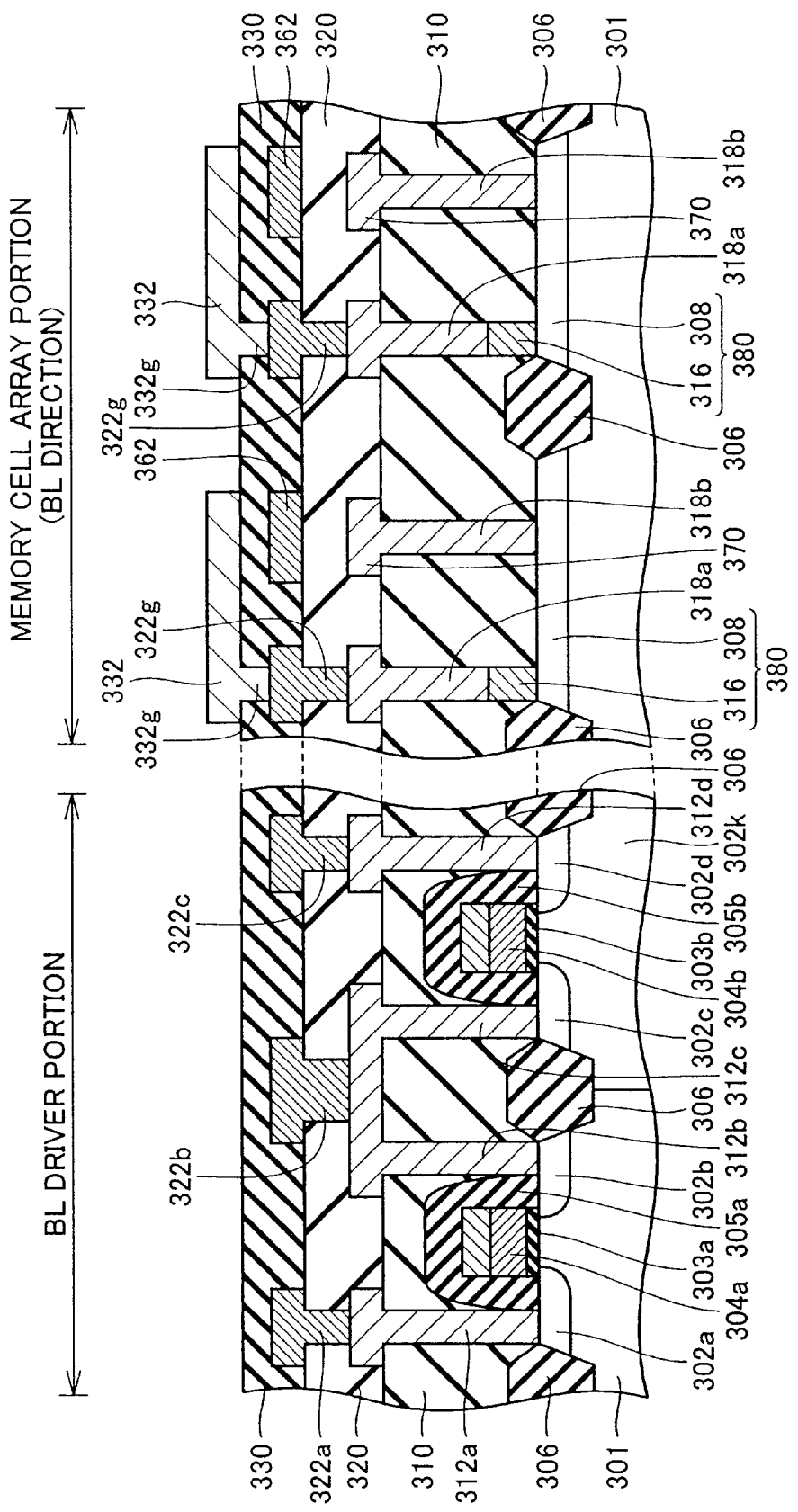
Figure 38:
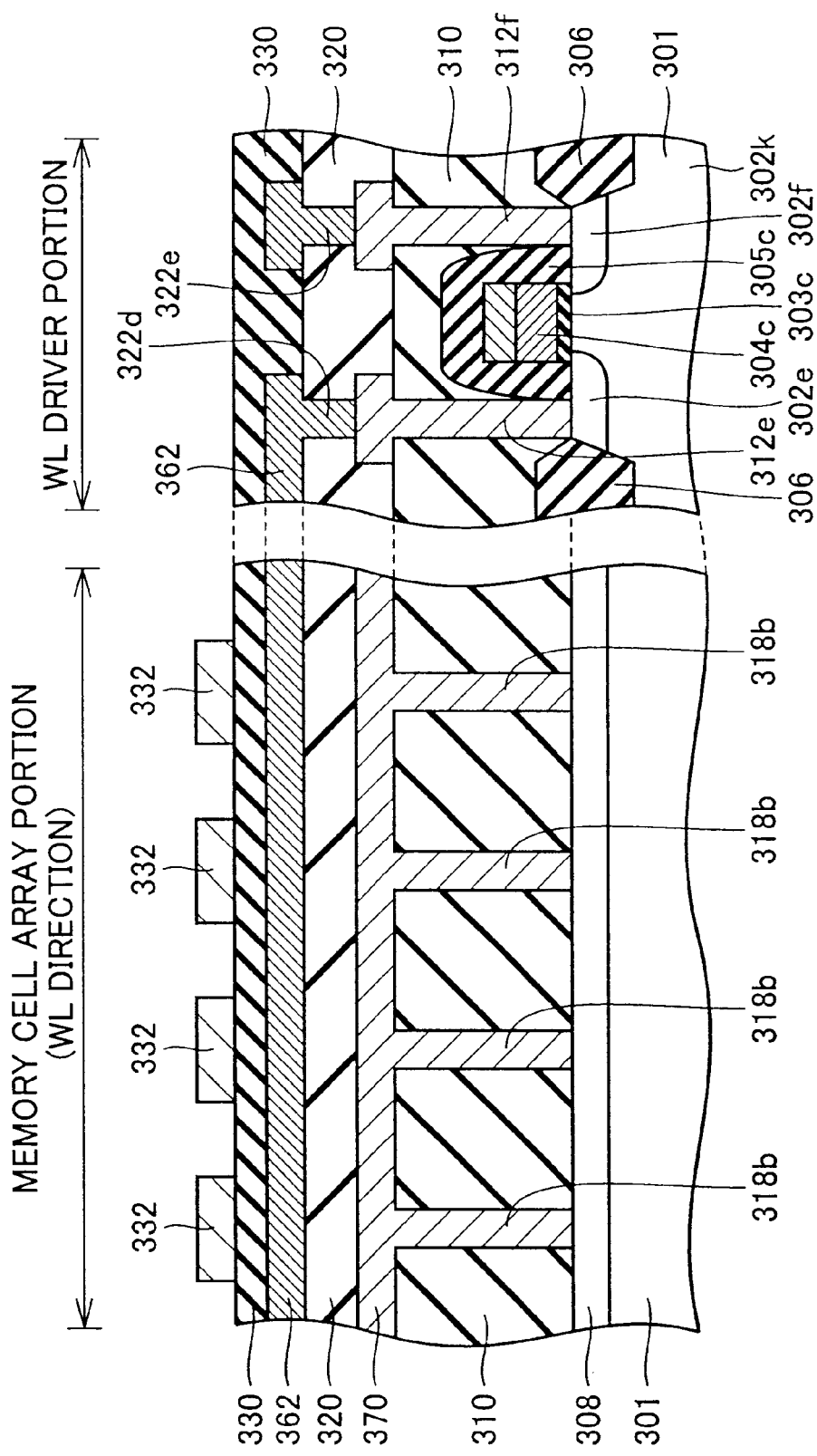

Then, as shown in FIGS. 37 and 38, third interlayer insulating film 330 is formed to cover second interlayer insulating film 320. For example, a so-called Low-k film having a low dielectric constant is used as the third interlayer insulating film. A resist film (not shown) having a pattern is formed on third interlayer insulating film 330 by photolithography. Using this resist film as a mask, a part of third interlayer insulating film 330 is removed by etching. Thereafter the resist film is removed. As a result, contact holes are formed in third interlayer insulating film 330.

Then, a conductor film is formed which fills in the contact holes and extends over the upper surface of third interlayer insulating film 330. Thereafter, a resist film (not shown) having a pattern is formed on the conductor film by photolithography. Using this resist film as a mask, a part of the conductor film is removed by etching. Thereafter the resist film is removed. This results in connecting contact 332g extending over third interlayer insulating film 330, and strap 332 that is continuous from connecting contact 332g and extends to the position corresponding to word line for writing 362.

Figure 39:
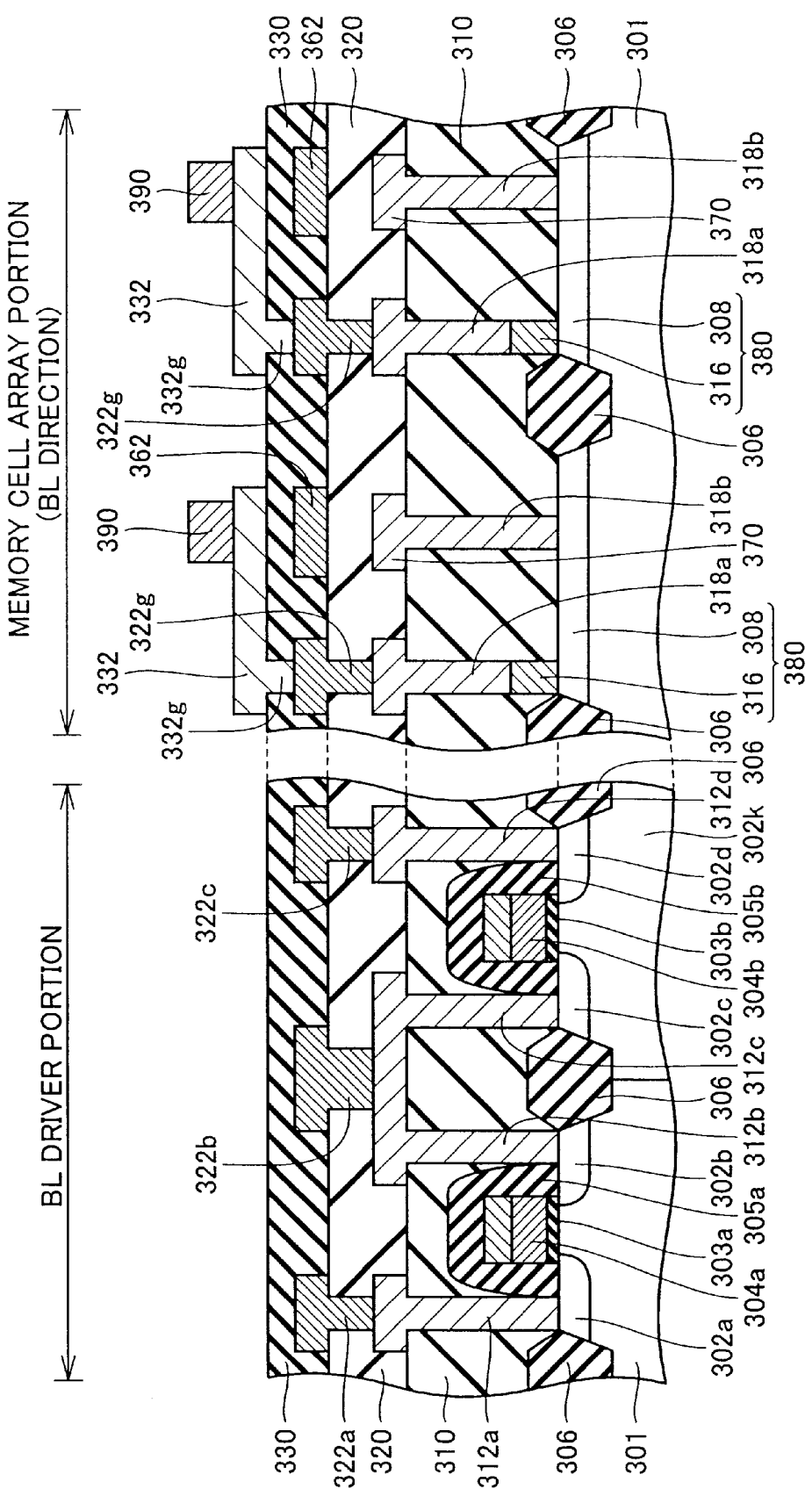
Figure 40:
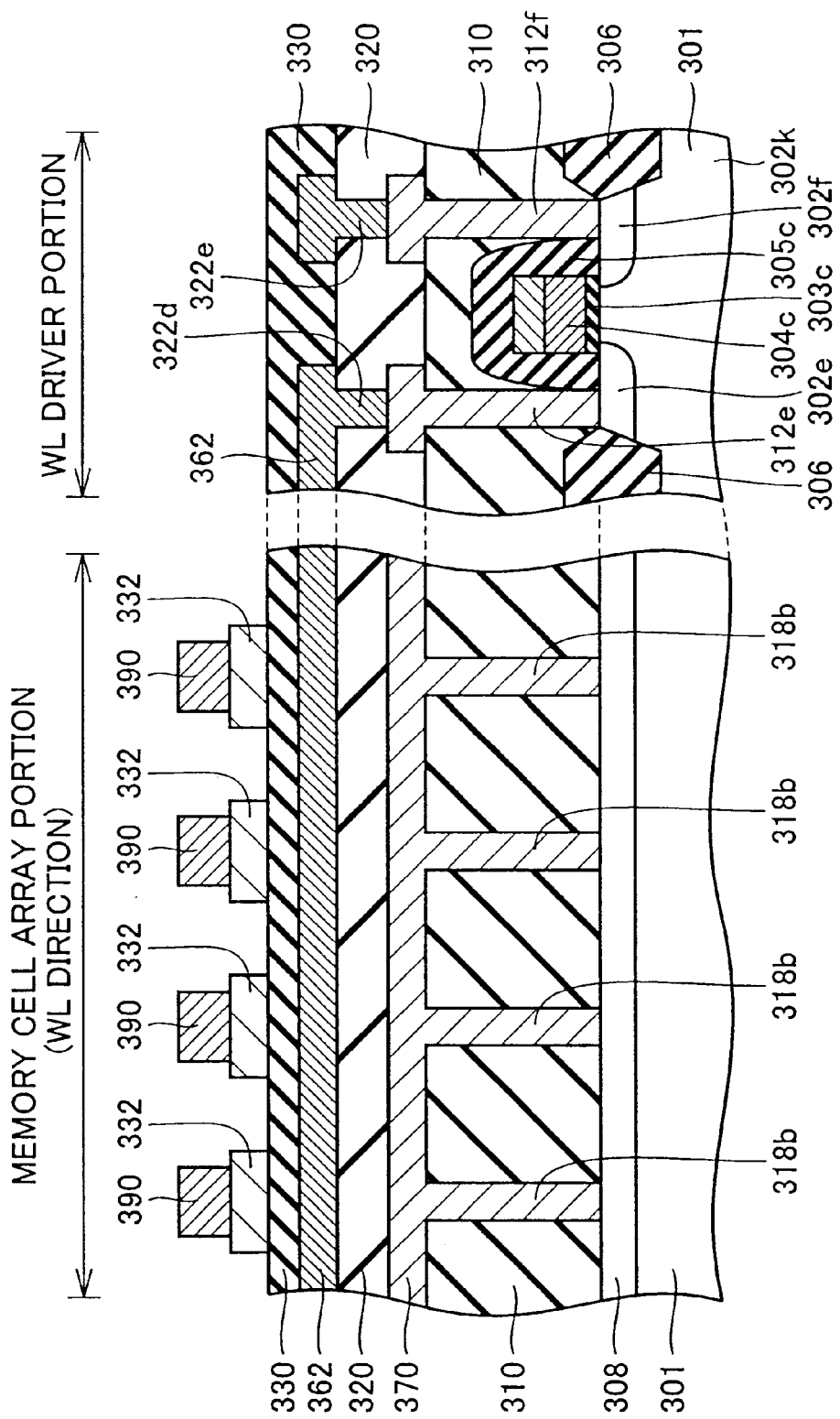

Then, as shown in FIGS. 39 and 40, a stacked film serving as TMR element 390 is formed to cover third interlayer insulating film 330. It is noted that this stacked film includes an MTJ layer comprised of two ferromagnetic layers and a thin insulator layer interposed therebetween, and an antiferromagnetic layer in contact with one of the ferromagnetic layers.

Then, a resist film (not shown) having a pattern is formed on this stacked film by photolithography, and using this resist film as a mask, a part of the stacked film is removed by etching. Thereafter the resist film is removed. As a result, TMR element 390 is formed on strap 332 in the position corresponding to word line for writing 362.

Figure 41:
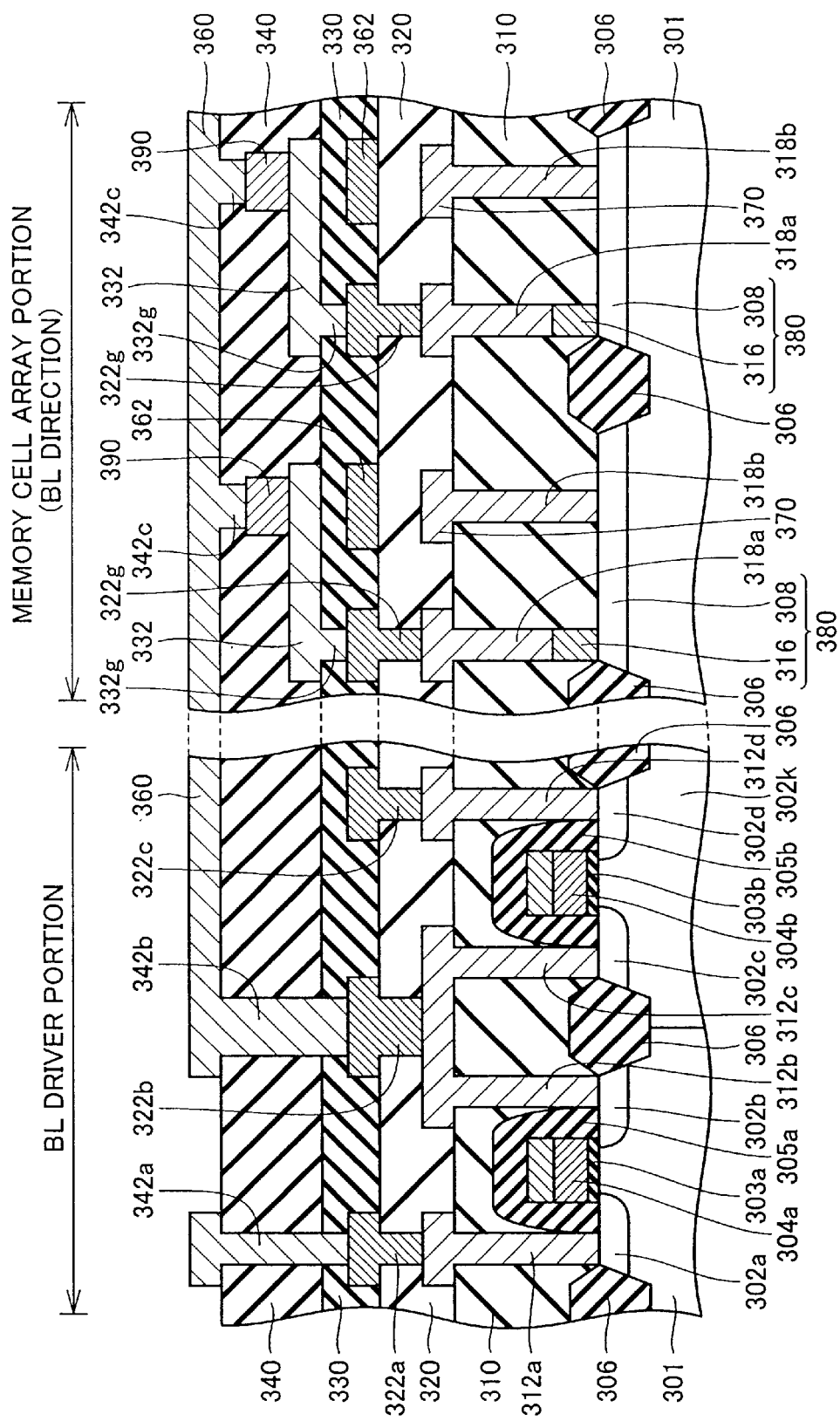
Figure 42:
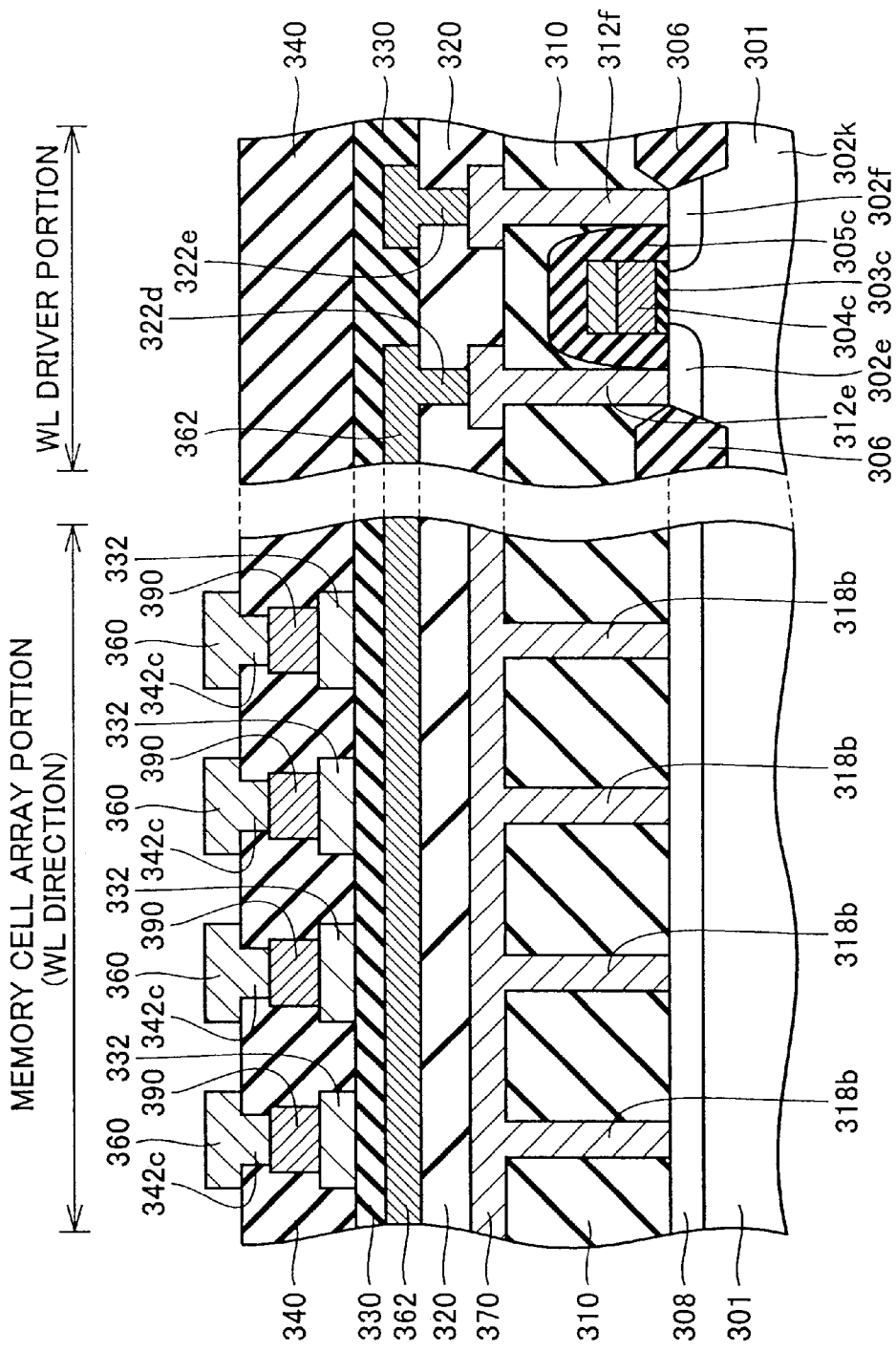

Then, as shown in FIGS. 41 and 42, fourth interlayer insulating film 340 is formed to cover third interlayer insulating film 330. For example, a so-called Low-k film having a low dielectric constant is used as the fourth interlayer insulating film. A resist film (not shown) having a pattern is then formed on fourth interlayer insulating film 340 by photolithography. Using this resist film as a mask, a part of fourth interlayer insulating film 340 is removed by etching. Thereafter the resist film is removed. As a result, contact holes are formed in fourth interlayer insulating film 340.

Thereafter, a conductor film is formed which fills in the contact holes and extends over the upper surface of fourth interlayer insulating film 340. For example, copper (Cu) is used as the conductor film. Thereafter, a resist film (not shown) having a pattern is formed on this conductor film by photolithography. Using this resist film as a mask, a part of the conductor film is removed by etching. Thereafter the resist film is removed. As a result, connecting contacts 342a–342c that fill the contact holes and extend over fourth interlayer insulating film 340 are formed in fourth interlayer insulating film 340. In the memory cell array portion, n bit lines 360 are formed to extend over connecting contact 342c.

Thereafter, passivation film 350 is formed to cover the entire surface of fourth interlayer insulating film 340. Through the steps described above, nonvolatile semiconductor memory device 1E having the structure shown in FIGS. 26 and 27 results.

To sum up the characteristic steps of the method of manufacturing nonvolatile semiconductor memory device 1E shown in FIGS. 28 to 42 in accordance with the present invention, the present method includes the steps of forming n-type diffusion region 308 in the main surface of silicon substrate 301 as a semiconductor substrate, forming p-type silicon layer 316 as a first semiconductor layer by the epitaxial growth method on that main surface of silicon substrate 301 in which n-type diffusion region 308 is formed, forming word line for reading data 370 as a second conductive line to be electrically connected to n-type diffusion region 308 and to be positioned above the main surface of silicon substrate 301, forming TMR element 390 as a memory element electrically connected to p-type silicon layer 316, and forming bit line 360 as a first conductive line on TMR element 390.

Through the steps described above, the nonvolatile semiconductor memory devices having reduced areas and excellent characteristics can be manufactured with a high production yield.

Sixth Embodiment

A nonvolatile semiconductor memory device in a sixth embodiment of the present invention will now be described. A nonvolatile semiconductor memory device 1F in the present embodiment differs from nonvolatile semiconductor memory device 1E in the fifth embodiment described above only in the structure of the WL driver portion. Specifically, while an n-channel MOS transistor is employed as a line-selecting element in the fifth embodiment described above, a pn diode including an epitaxial growth layer is employed as a line-selecting element in the present embodiment. It is noted that the description of the structure of the nonvolatile semiconductor memory device in the bit line extending direction will not be repeated herein.

As shown in FIG. 1, WL driver 6 of nonvolatile semiconductor memory device 1A in the first embodiment as described above includes n-channel MOS transistors 21–2k corresponding to word lines WL1–WLk, respectively. Nonvolatile semiconductor memory device 1F in the present embodiment has diode elements having a forward direction from a corresponding word line toward the ground node, in place of transistors 212k. In this case, WL driver 4 is controlled by applying a write potential higher than the ground potential to the word line selected in writing data to bring the non-selected word line into the non-connected state so that current does not flow, or by applying a ground potential.

Figure 43:
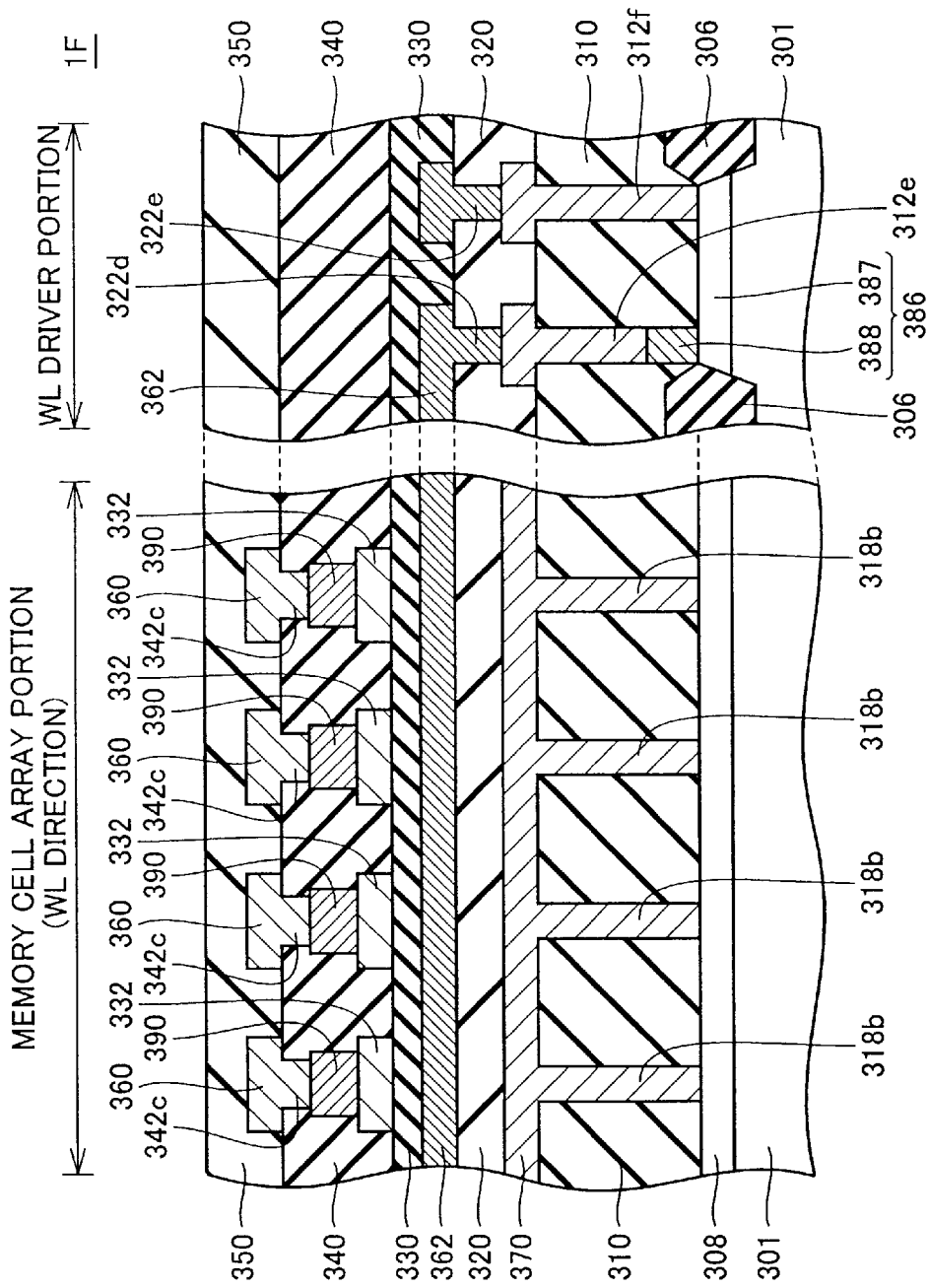
FIG. 43 is a schematic cross sectional view along a word line extending direction in a nonvolatile semiconductor memory device in a sixth embodiment of the present invention.

As shown in FIG. 43, nonvolatile semiconductor memory device 1F in the present embodiment includes a line-selecting diode 386 in the WL driver portion. Specifically, an n-type diffusion region 387 is formed on the main surface of silicon substrate 301 in the WL driver portion. Two contact holes are formed for each memory cell in first interlayer insulating film 310 positioned on n-type diffusion layer 387. At the lower portion of one of these contact holes, a p-type silicon layer 388 as a second semiconductor layer is formed by the epitaxial growth method. This p-type silicon layer 388 is in contact with n-type diffusion layer 387 of silicon substrate 301 at the interface of the lower end thereof to form a pn junction. The contact hole on p-type silicon layer 388 is filled with a conductor film to form a connecting contact 312e in first interlayer insulating film 310. On the other hand, the other contact hole is filled with a conductor film to form a connecting contact 312f in first interlayer insulating film 310.

Because of the present configuration, not only the memory cell array portion but also the WL driver portion can have a reduced area, in addition to the effect of the fifth embodiment described above, and therefore a nonvolatile semiconductor memory device can be further reduced in size.

Seventh Embodiment

A nonvolatile semiconductor memory device in a seventh embodiment of the present invention will now be described. It is noted that the circuit configuration of nonvolatile semiconductor memory device 1G in the present embodiment is similar to the circuit configuration of nonvolatile semiconductor memory device 1A in the first embodiment described above.

Figure 44:
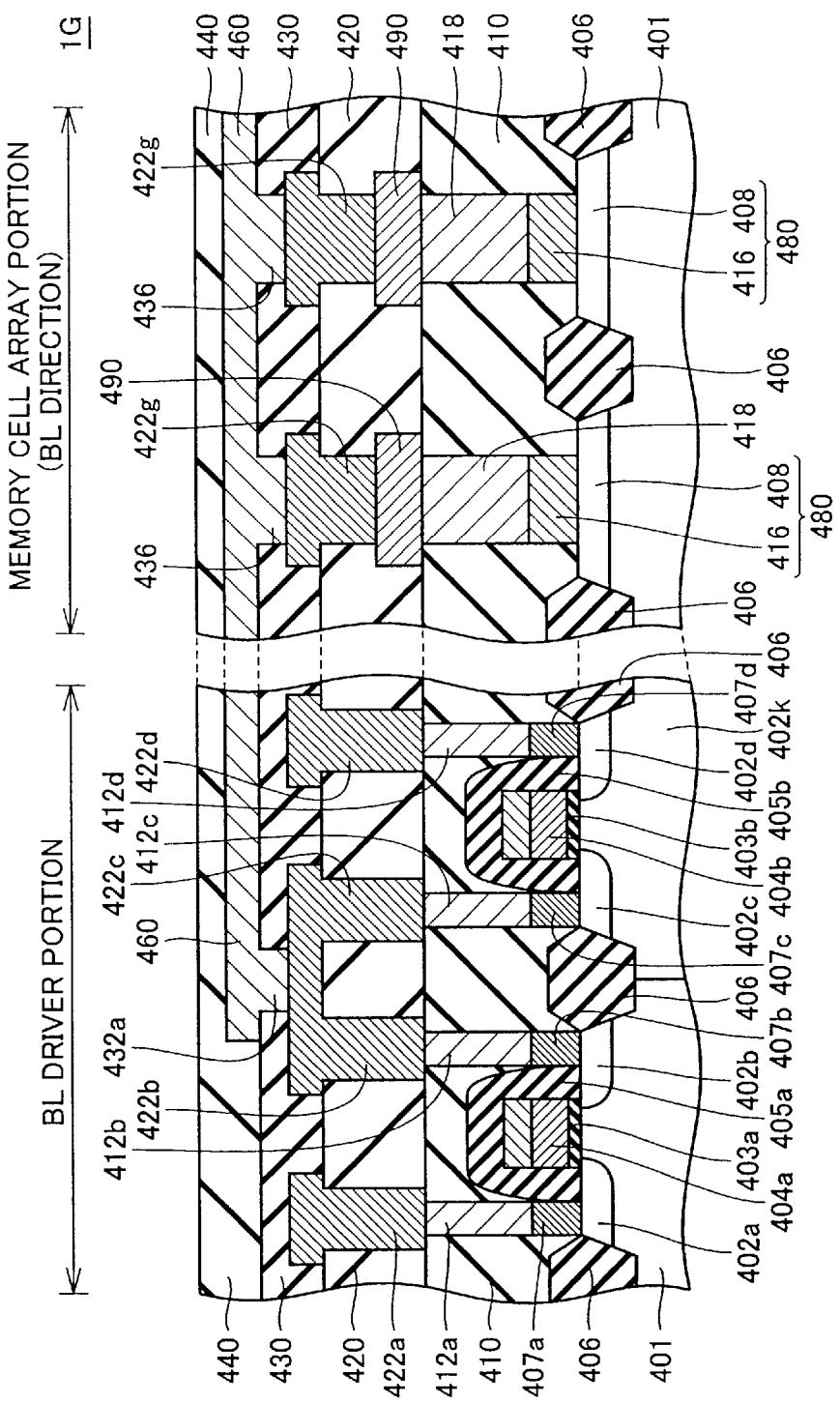
FIG. 44 is a schematic cross sectional view along a bit line extending direction in a nonvolatile semiconductor memory device in a seventh embodiment of the present invention.

First, as shown in FIG. 44, nonvolatile semiconductor memory device 1G in the present embodiment includes a memory cell array portion and a BL driver portion, similar to the first embodiment described above. The BL driver portion is a portion corresponding to a region where BL driver 8 in FIG. 1 is formed. It is noted that the description of the structure of the nonvolatile semiconductor memory device in the word line extending direction will not be repeated.

In the memory cell array portion, a plurality of memory cells are formed each including a TMR element 490 and an access diode 480. TMR element 490 is an element corresponding to reference numeral 14 in the circuit shown in FIG. 1, and access diode 480 is an element corresponding to reference numeral 16 in the circuit shown in FIG. 1. In the BL driver portion, two field effect transistors are formed for controlling the memory cells. These two field effect transistors include a p-channel MOS transistor and an n-channel MOS transistor.

In the following, the structure of nonvolatile semiconductor memory device 1G in the present embodiment will be described specifically.

As shown in FIG. 44, in the BL driver portion of nonvolatile semiconductor memory device 1G, source/drain regions 402a, 402b of the p-channel MOS transistor are formed on a main surface of a p-type silicon substrate 401. Source/drain regions 402a, 402b are arranged to oppose to each other with a channel region interposed therebetween. On the channel region between source/drain regions 402a and 402bA, gate electrode 404a is formed with a gate insulating film 403a interposed. This gate electrode 404a is covered with a sidewall insulating film 405a at its top and side surfaces.

In a region where the n-channel MOS transistor of the BL driver portion is formed, an n-type well region 402k is formed in silicon substrate 401. On that main surface of silicon substrate 401 in which this n-type well region 402k is formed, source/drain regions 402c, 402d of the n-channel MOS transistor is formed. Source/drain regions 402c, 402d are arranged to oppose to each other with a channel region interposed therebetween. On the channel region between source/drain regions 402c and 402d, a gate electrode 404b is formed with a gate insulating film 403b interposed. Gate electrode 404b is covered with a sidewall insulating film 405b on its top and side surfaces. It is noted that the p-channel MOS transistor and the n-channel MOS transistor described above are isolated from each other by an element-isolating film 406.

A first interlayer insulating film 410 is formed on these p-channel MOS transistor and n-channel MOS transistor forming the BL driver. In first interlayer insulating film 410, contact holes are formed in respective regions positioned on source/drain regions 402a–402d. On the bottom surfaces of these contact holes, n-type silicon layers 407a–407d are positioned. The contact holes on n-type silicon layers 407a–407d are filled with a conductor film to form connecting contacts 412a–412d in first interlayer insulating film 410.

A second interlayer insulating film 420 is formed on first interlayer insulating film 410. In second interlayer insulating film 420, contact holes are formed in regions positioned on connecting contacts 412a–412d formed in first interlayer insulating film 410. These contact holes are filled with a conductor film to form connecting contacts 422a–422d in second interlayer insulating film 420. It is noted that connecting contact 422a is connected to a power supply. Therefore, a power supply voltage (VCC) is applied to the source of the p-channel MOS transistor forming the BL driver. A ground voltage (CSS) is applied to connecting contact 422d. As a result, the drain of the n-channel MOS transistor forming the BL driver is grounded. Connecting contact 422b and connecting contact 422c are connected to each other on second interlayer insulating film 420. Therefore, the drain of the p-channel MOS transistor and the source of the n-channel MOS transistor, which form the BL driver, are electrically connected to each other.

A third interlayer insulating film 430 is formed on second interlayer insulating film 420. In third interlayer insulating film 430, one contact hole is formed on a connection portion between connecting contacts 422b and 422c formed in second interlayer insulating film 420. This contact hole is filled with a conductor film to form a connecting contact 432a in third interlayer insulating film 430.

A passivation film 440 is formed on third interlayer insulating film 430. A bit line 460 is formed between third interlayer insulating film 430 and passivation film 440 and is connected to connecting contact 432a formed in third interlayer insulating film 430. This bit line 460 corresponds to any one of bit lines BL1–BLn shown in FIGS. 1 and 2. It is noted that bit line 460 is electrically connected to memory cells in the memory cell array portion described later.

As shown in FIG. 44, in the memory cell array portion of nonvolatile semiconductor memory device 1G, silicon substrate 401 is partitioned by element-isolating film 406 in the bit line extending direction. On the main surface of silicon substrate 401, an n-type diffusion layer 408 is formed. This n-type diffusion layer 408 corresponds to any one of word lines WL1–WLk shown in FIGS. 1 and 2.

First interlayer insulating film 410 is formed on the main surface of silicon substrate 401. In first interlayer insulating film 410, a contact hole is formed for each memory cell on n-type diffusion layer 408. At the lower portion of this contact hole, a p-type silicon layer 416 is formed by the epitaxial growth method. This p-type silicon layer 416 is in contact with n-type diffusion layer 408 of silicon substrate 401 at the interface of the lower end thereof to form a pn junction. The contact hole on p-type silicon layer 416 is filled with a conductor film to form connecting contact 418 in first interlayer insulating film 410.

A second interlayer insulating film 420 is formed on first interlayer insulating film 410. In second interlayer insulating film 420, a TMR element 490 is formed in a region positioned on connecting contact 418 formed in first interlayer insulating film 410. Each TMR element 490 includes an MTJ layer comprised of a ferromagnetic layer, a tunnel insulator layer and a ferromagnetic layer, and an antiferromagnetic layer in contact with one of the ferromagnetic layers. A contact hole is formed on each of TMR elements 490. The contact holes are filled with a conductor film to form connecting contacts 422g.

Third interlayer insulating film 430 is formed on second interlayer insulating film 420. In third interlayer insulating film 430, a contact hole is formed in a region positioned on connecting contact 422g formed in second interlayer insulating film 420. This contact hole is filled with a conductor film to form connecting contact 436 in third interlayer insulating film 430.

Passivation film 440 is formed on third interlayer insulating film 430. Bit line 460 is formed between third interlayer insulating film 430 and passivation film 440. This bit line 460 is connected to connecting contact 436. Bit line 460 corresponds to any one of bit lines BL1–BLk shown in FIGS. 1 and 2.

To sum up the characteristic structure of nonvolatile semiconductor memory device 1G in accordance with the present embodiment as described above, nonvolatile semiconductor device 1G includes silicon substrate 401 as a semiconductor substrate, bit line 460 as a first conductive line, word line 470 as a second conductive line, and a memory cell. Silicon substrate 401 has a main surface, and bit line 460 is positioned above the main surface of silicon substrate 401. Word line 470 is formed of n-type diffusion layer 408 provided in silicon substrate 401 to intersect bit line 460. A memory cell is positioned in a region where bit line 460 and word line 470 intersect and has one end electrically connected to bit line 460 and the other end electrically connected to word line 470. This memory cell includes TMR element 490 as a memory element and access diode 480 as an access element electrically connected in series. Access diode 480 includes p-type silicon layer 416 as a first semiconductor layer selectively grown on the main surface of silicon substrate 401 by the epitaxial growth method, and has a pn junction at the interface between p-type silicon layer 416 and silicon substrate 401.

As described above, a pn junction diode is used as an access element, which includes a first semiconductor layer formed by the epitaxial growth method and has a pn junction between the semiconductor layer and a semiconductor substrate, so that a diode excellent in the electric characteristic such as an internal resistance and reverse direction characteristics can be utilized as an access element. As a result, a nonvolatile semiconductor memory device excellent in reading and writing operations can be provided.

The use of the aforementioned pn junction diode as an access element, is less likely to cause variations in the electric characteristics of each access diode formed in a memory cell. Therefore, the sense current can be stabilized, and thus the nonvolatile semiconductor memory devices excellent in reading and writing operations can be provided with a high production yield.

In addition, the use of a diode as an access element can largely reduce the memory cell area as compared with the use of a transistor as an access element. The memory cell array area can further be reduced as compared with the structure employing a pn diode as an access element, which is formed in a semiconductor substrate by forming a diffusion layer in the semiconductor substrate.

As described above, a diode including a semiconductor layer formed using this epitaxial growth method is used as an access diode, so that the nonvolatile semiconductor memory devices having reduced areas and excellent characteristics can be manufactured with a high production yield.

Next, referring to FIGS. 45 to 51, a method of manufacturing the nonvolatile semiconductor memory device shown in FIG. 44 will be described.

Figure 45:
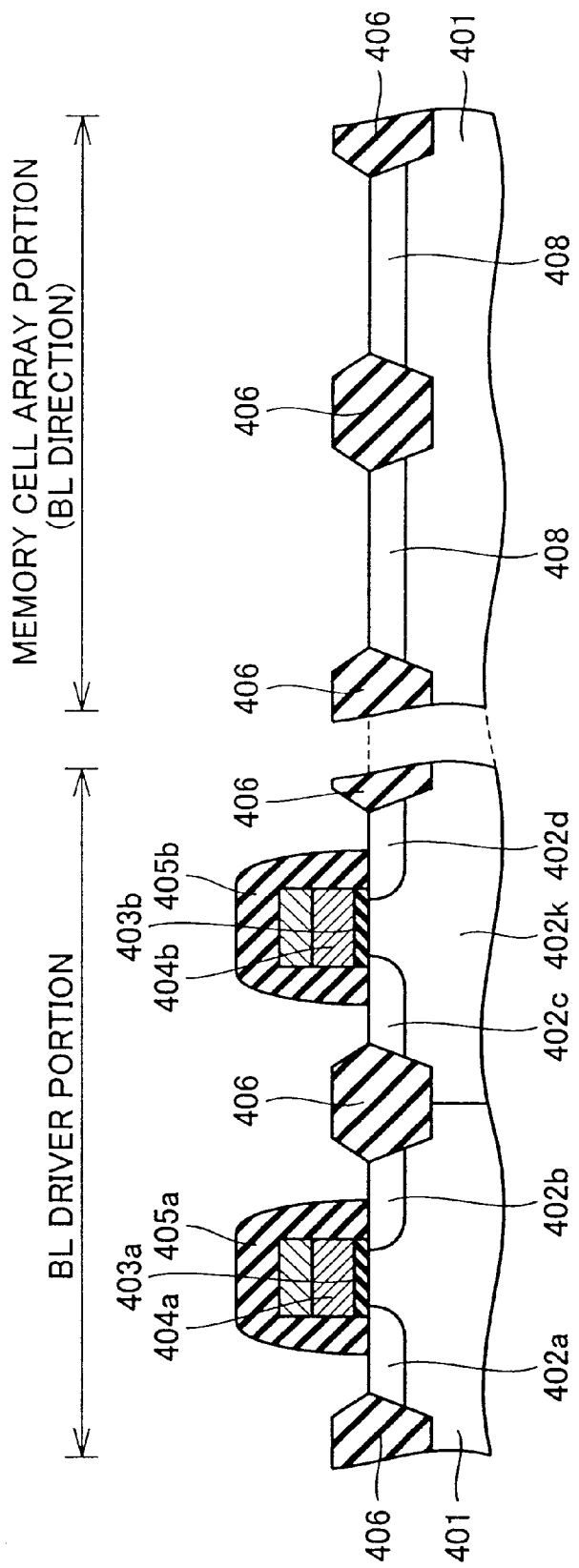
FIGS. 45–51 are schematic cross sectional views along a bit line extending direction, showing the first to seventh steps of a method of manufacturing a nonvolatile semiconductor memory device in the seventh embodiment of the present invention.

First, as shown in FIG. 45, a p-channel MOS transistor and n-channel MOS transistor forming a BL driver portion as well as a field effect transistor forming a logic circuit (not shown) are formed on the main surface of silicon substrate 401 using normal deposition, photolithography and ion implantation steps.

Specifically, n-type well region 402k is formed using a mask (not shown) in a prescribed region (a region where the n-channel MOS transistor is formed) of p-type silicon substrate 401. Element-isolating film 406 is then formed in a prescribed region of silicon substrate 401.

An insulating film serving as gate insulating films 403a, 403b is formed on the main surface of silicon substrate 401. A conductor film serving as gate electrodes 404a, 404b is formed on this insulating film. A resist film (not shown) having a pattern is formed on the conductor film, and using this resist film as a mask the conductor film and the insulating film are partially removed by etching. Thereafter the resist film is removed. As a result, gate insulating films 403a, 403b and gate electrodes 404a, 404b are formed.

Using gate electrodes 404a, 404b as a mask, a conductive impurity is implanted in the main surface of silicon substrate 401 to form source/drain regions 402a–402d. It is noted that the p-channel MOS transistor and the n-channel MOS transistor are separately formed by introducing respective different conductivity types of impurity. At this point, simultaneously with the formation of source/drain regions 402a, 402b of the p-channel MOS transistor, n-type diffusion layer 408 is formed in the memory cell array portion.

An insulating film serving as sidewall insulating films 405a, 405b is then deposited to cover gate electrodes 404a, 404b. This insulating film is selectively removed by anisotropic etching to form sidewall insulating films 405a, 405b. This results in the p-channel MOS transistor and n-channel MOS transistor forming the BL driver portion and the field effect transistor forming a logic circuit (not shown).

Figure 46:
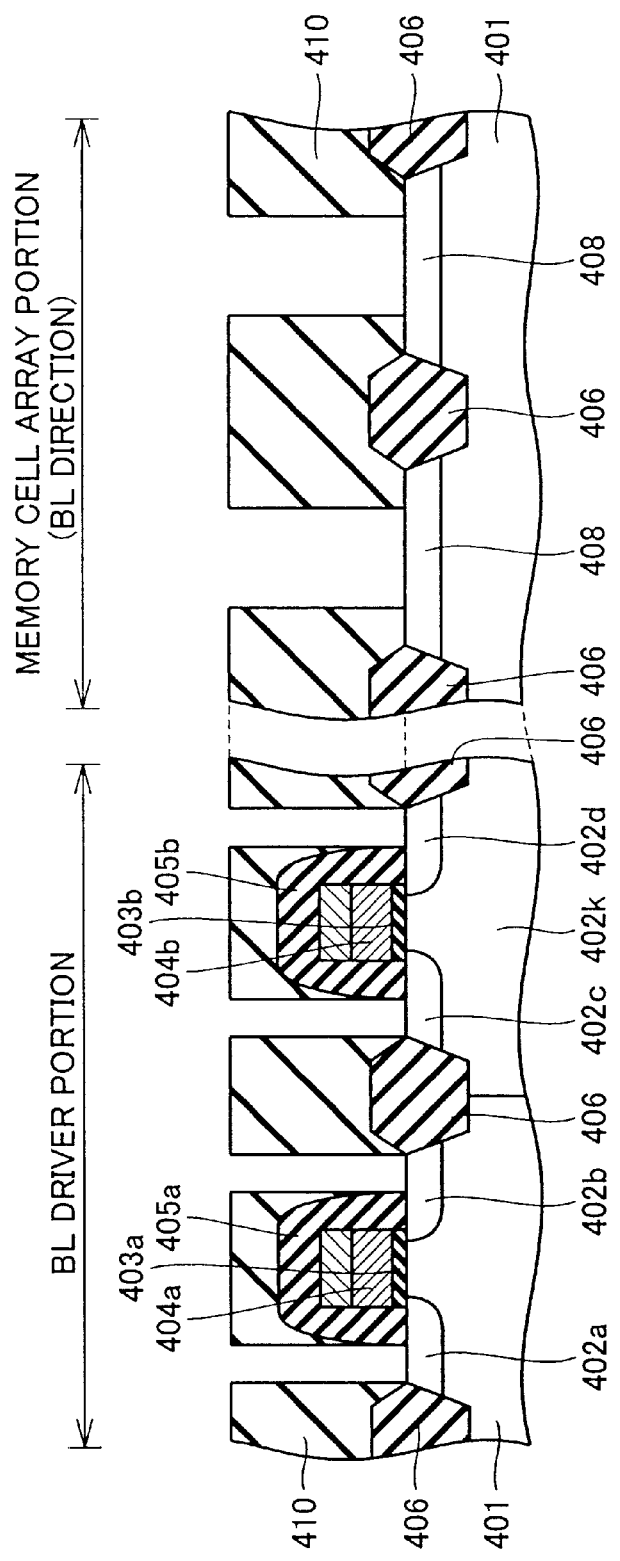

Then, as shown in FIG. 46, a first interlayer insulating film 410 is formed to cover the entire surface of silicon substrate 401. First interlayer insulating film 410 employs, for example, a BPTEOS film and desirably has a thickness of about 200 nm. Then, a resist film (not shown) having a pattern is formed on first interlayer insulating film 410 by photolithography. Using this resist film as a mask, a part of first interlayer insulating film 410 is removed by etching. Thereafter the resist film is removed. As a result, contact holes are formed in first interlayer insulating film 410.

Figure 47:
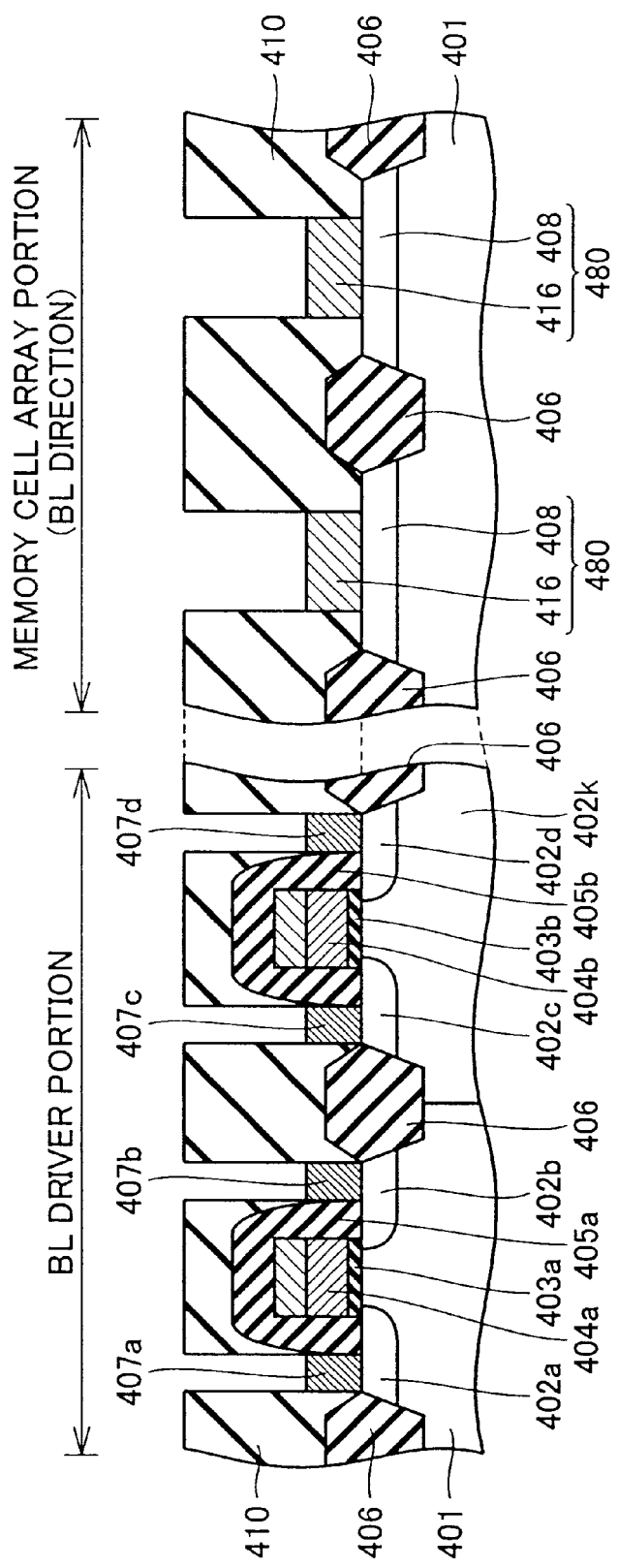

Thereafter, as shown in FIG. 47, at the lower portion of the opening of the contact hole, an epitaxial growth film is formed to have a thickness of about 5 nm. Then, the contact hole formed in the position excluding the memory cell array portion is covered with a resist film (not shown), only the epitaxial growth layer formed in the memory cell array portion is implanted with boron (B) as an p-type impurity by ion implantation. At this time, the implantation energy is for example 5 keV, and the implantation concentration is about $1 \times 10^{-15}$ cm$^{-2}$. Thereafter the resist film is removed. As a result, a p-type silicon layer 416 is formed at the bottom surface of the opening of the contact hole in the memory cell array portion. This p-type silicon layer 416 and n-type diffusion region 408 formed in silicon substrate 401 form access diode 480.

Thereafter, while p-type silicon layer 416 formed in the memory cell array portion is covered with a resist film (not shown), only the epitaxial growth layer formed in the position excluding the memory cell array portion is implanted with phosphorus (P) as an n-type impurity by ion implantation. At this time, the implantation energy is for example 10 keV and the implantation concentration is about $3 \times 10^{15}$ cm$^{-2}$. Thereafter the resist film is removed. As a result, n-type silicon layers 407a–407d are formed at the bottom surfaces of the opening portions of the contact holes formed at positions excluding the memory cell array portion.

Figure 48:
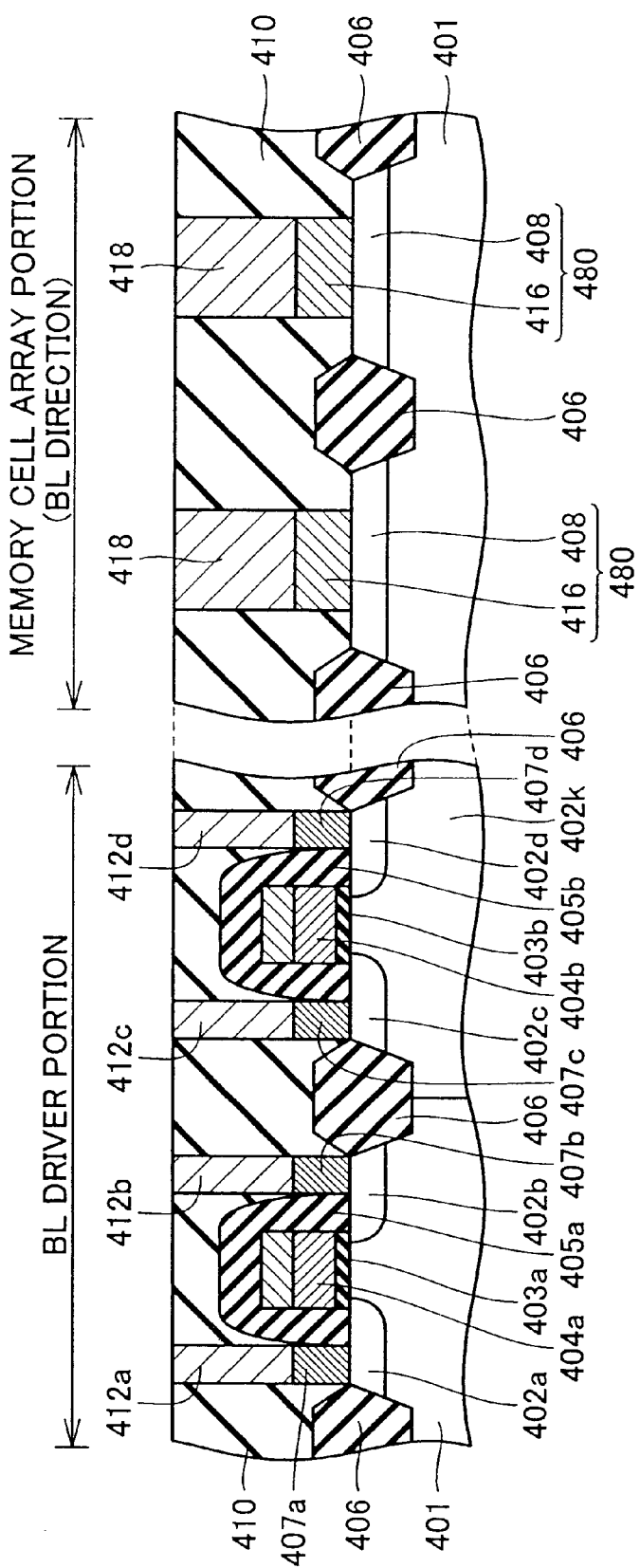

Then, as shown in FIG. 48, a conductor film is formed to fill in the contact holes formed in the first interlayer insulating film 410. As a result, in first interlayer insulating film 410, connecting contacts 412a–412d and connecting contact 418 that fill the contact holes are formed.

Figure 49:
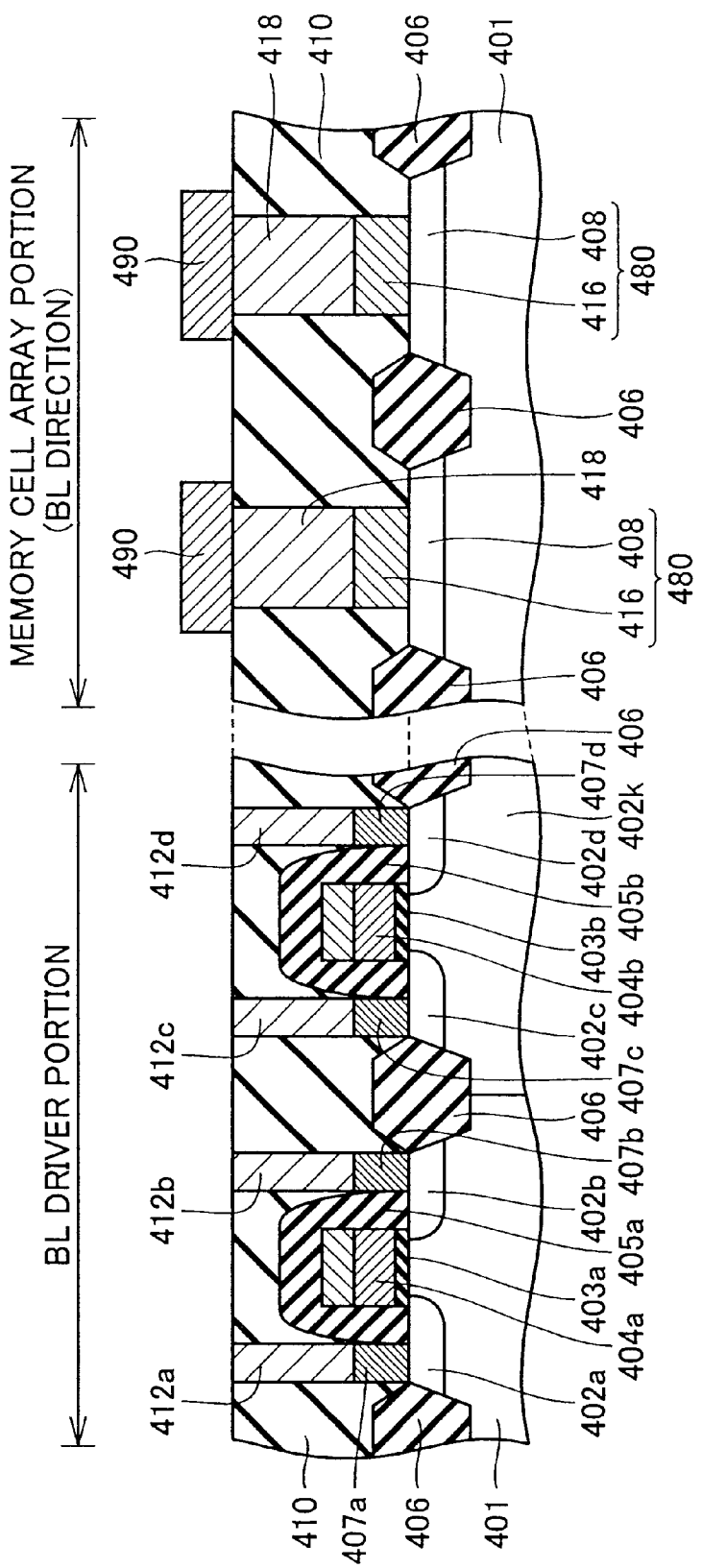

Then, as shown in FIG. 49, a stacked film serving as TMR element 490 is formed to cover first interlayer insulating film 410. It is noted that this stacked film includes an MTJ layer comprised of two ferromagnetic layers and a thin insulator layer interposed therebetween, and an antiferromagnetic layer in contact with one of the ferromagnetic layers.

Thereafter, a resist film (not shown) having a pattern is formed on the stacked film by photolithography, and using this resist film as a mask a part of the stacked film is removed by etching. Thereafter the resist film is removed. As a result, TMR element 490 is formed on connecting contact 418.

Figure 50:
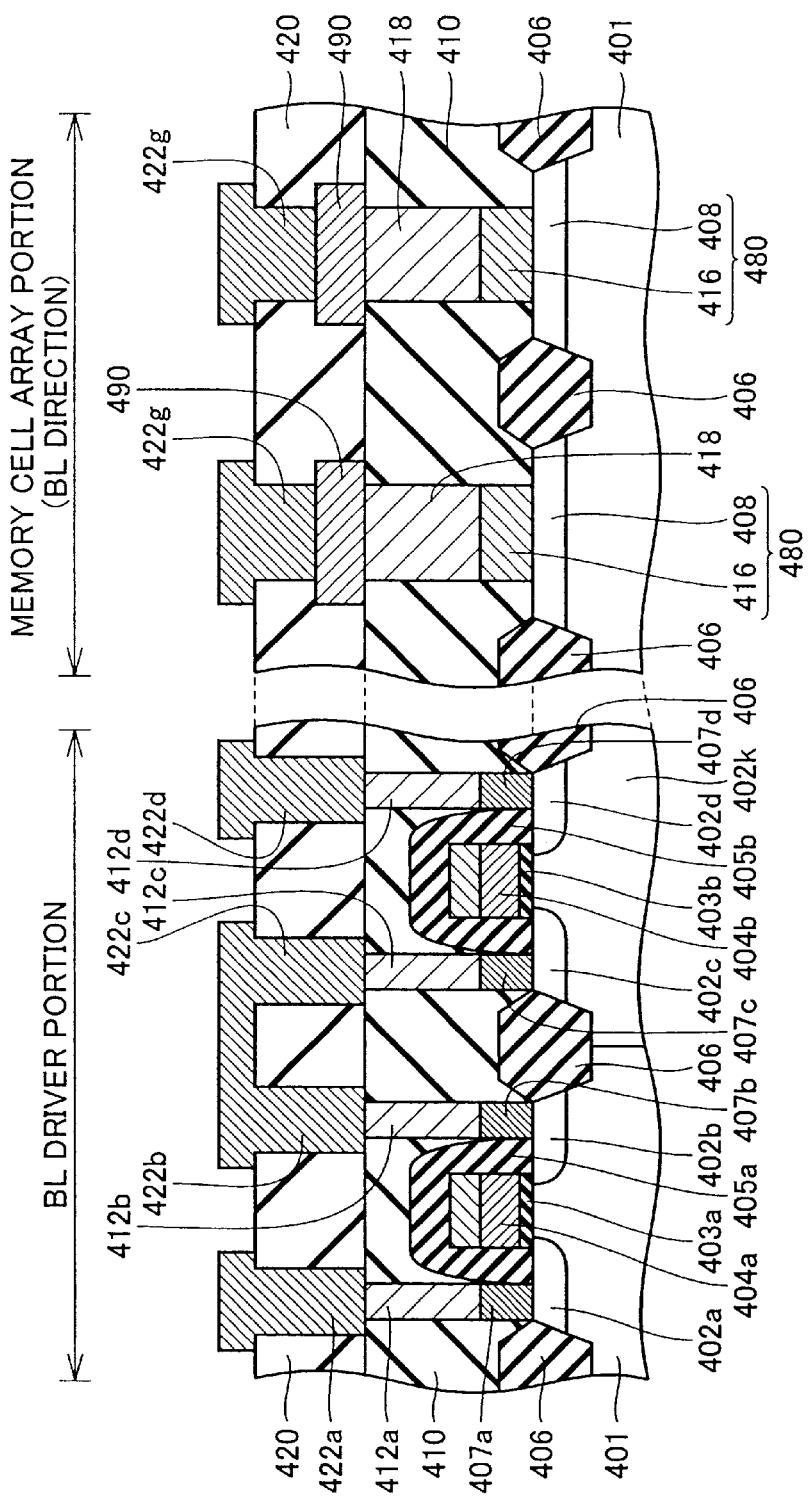

Then, as shown in FIG. 50, second interlayer insulating film 420 is formed to cover first interlayer insulating film 410. A resist film (not shown) having a pattern is then formed on second interlayer insulating film 420 by photolithography. Using this resist film as a mask, a part of second interlayer insulating film 420 is removed by etching. Thereafter the resist film is removed. As a result, contact holes are formed in second interlayer insulating film 420.

Thereafter, a conductor film is formed which fills in the contact holes and extends over the upper surface of second interlayer insulating film 420. Thereafter, a resist film (not shown) having a pattern is formed on this conductor film by photolithography. Using this resist film as a mask, a part of the conductor film is removed by etching. Thereafter the resist film is removed. As a result, connecting contacts 422a–422d and connecting contacts 422g are formed which fill the contact holes and extend over second interlayer insulating film 420.

Figure 51:
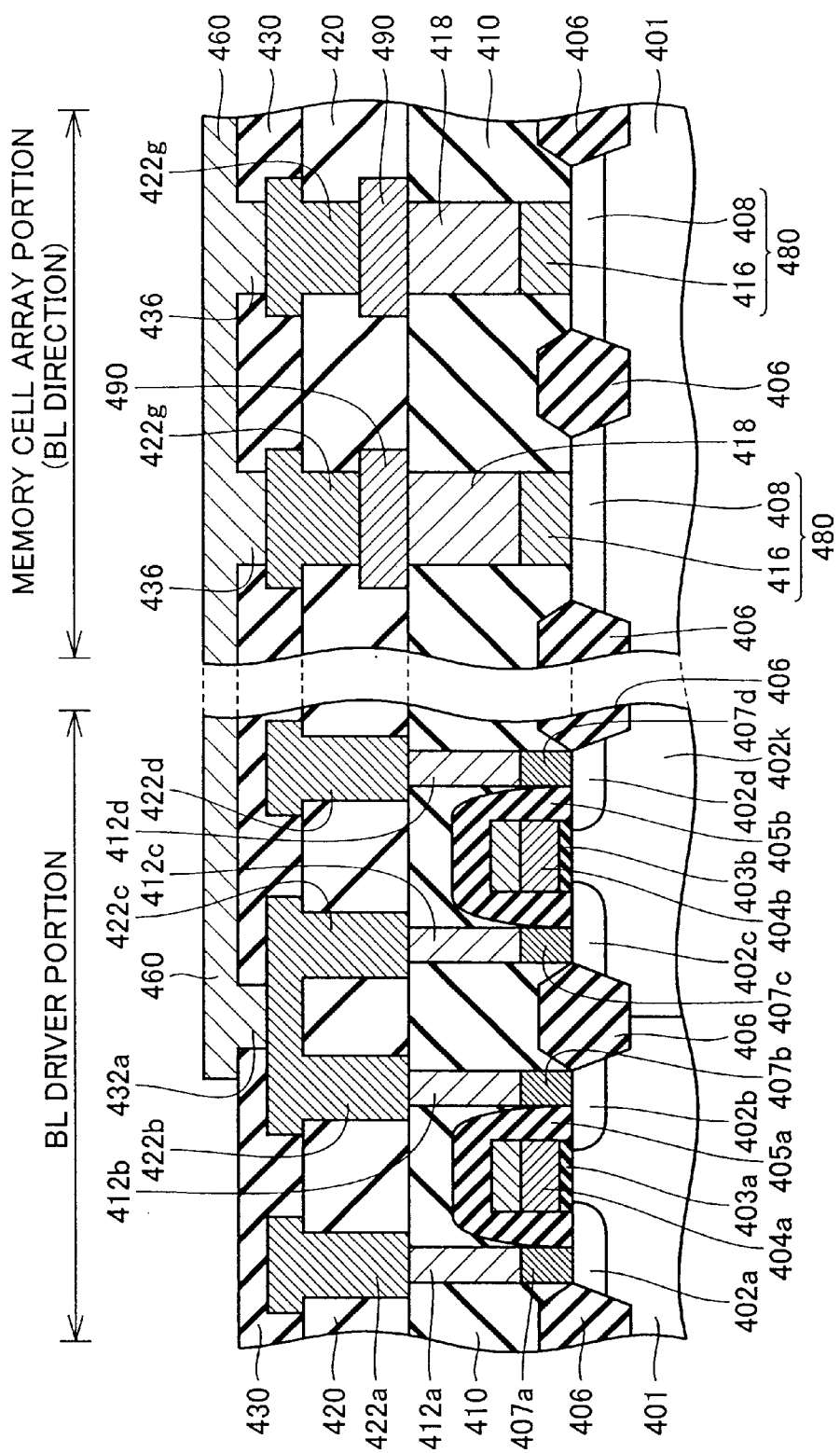

Then, as shown in FIG. 51, third interlayer insulating film 430 is formed to cover second interlayer insulating film 420. A resist film (not shown) having a pattern is formed on third interlayer insulating film 430 by photolithography. Using this resist film as a mask, a part of third interlayer insulating film 430 is removed by etching. Thereafter the resist film is removed. As a result, contact holes are formed in third interlayer insulating film 430.

Thereafter, a conductor film is formed which fills in the contact holes and extends over the upper surface of third interlayer insulating film 430. Thereafter, a resist film (not shown) having a pattern is formed on this conductor film by photolithography. Using this resist film as a mask, a part of the conductor film is removed by etching. Thereafter the resist film is removed. As a result, in third interlayer insulating film 430, a connecting contact 432a and connecting contact 436 are formed which fill the contact holes and extend over the third interlayer insulating film 430. Furthermore, in the memory cell array portion, bit line 460 is formed on connecting contact 436.

Thereafter, passivation film 440 is formed to cover the entire surface of third interlayer insulating film 430. Through the steps described above, nonvolatile semiconductor memory device 1G having the structure shown in FIG. 44 results.

To sum up the characteristic steps of the method of manufacturing nonvolatile semiconductor memory device 1G as shown in FIGS. 45 to 51 in accordance with the present invention, the present method includes the steps of forming n-type diffusion region 408 functioning as a word line as a second conductive line on the main surface of silicon substrate 401 as a semiconductor substrate, forming p-type silicon layer 416 as a first semiconductor layer in the main surface of silicon substrate 401 by the epitaxial growth method, forming TMR element 490 as a memory element electrically connected to p-type silicon layer 416, and forming bit line 460 as a first conductive line on TMR element 490.

Through the steps described above, the nonvolatile semiconductor memory device having reduced areas and excellent characteristics can be manufacturized with a high production yield.

Eighth Embodiment

The pn junction diode used in the present invention is not limited to MRAM and may be applied as a switching element for a memory element nonvolatally holding data in accordance with variations in resistance values.

Figure 52:
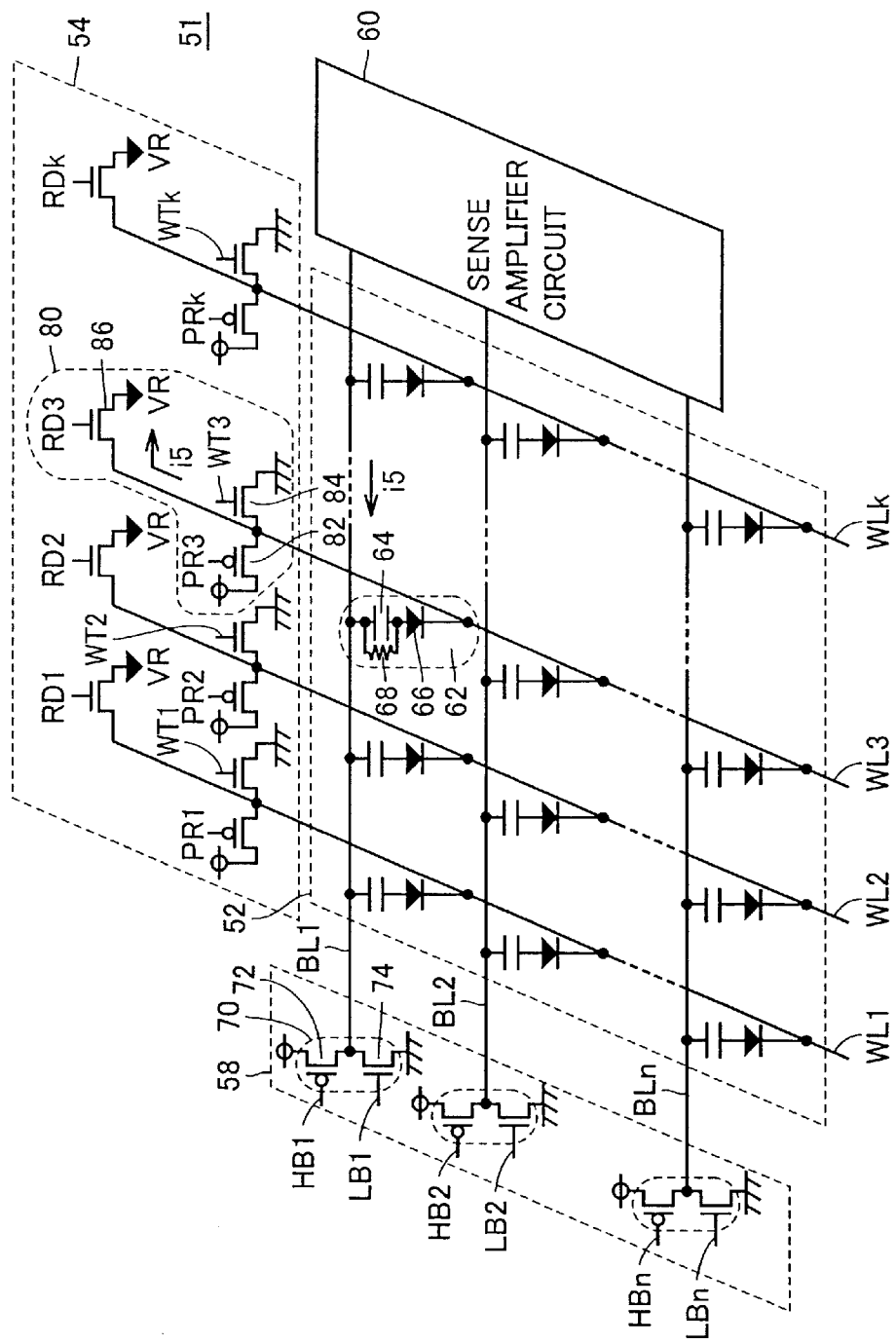
FIG. 52 is a circuit diagram showing a configuration of a main part of a nonvolatile semiconductor memory device in an eighth embodiment of the present invention.

Referring to FIG. 52, a nonvolatile semiconductor memory device 51 includes a memory array 52, a BL driver 58, a WL Driver 54, and a sense amplifier circuit 60.

Memory cell array 52 includes word lines WL1–WLk, bit lines BL1–BLn provided to intersect word lines WL1–WLk, and a plurality of memory cells respectively provided at k×n intersection portions of word lines WL1–WLk and bit lines BL1–BLn. Each memory cell includes an anti-fuse and a diode connected in series between a corresponding bit line and a corresponding word line. A structure of a memory cell, denoted with a reference numeral 62, provided at the intersection portion of bit line BL1 and word line WL3 will be described by way of representation.

Memory cell 62 includes an anti-fuse element 64 as a capacitive memory element and a diode 66 connected in series between bit line BL1 and word line WL3. Diode 66 is connected to have the forward direction from the anti-fuse element toward word line WL3. It is noted that memory cell 62 is shown to have a resistor 68 connected to couple between the electrodes of the anti-fuse as an equivalent circuit where anti-fuse 64 is broken down. Of course, resistor 68 does not exist where anti-fuse 64 is not broken down.

The use of diode 66 as an access element can largely reduce the memory cell area as compared with the use of a transistor as an access element. Furthermore, since the element having a stable pn junction as described above is used as diode 66, the current flowing in the memory cell can be stabilized.

BL driver 58 includes a plurality of drive circuits provided corresponding to the respective bit lines.

As a representative of a plurality of drive circuits, a drive circuit corresponding to bit line BL1, denoted with a reference numeral 70, will be described in detail.

Drive circuit 70 includes a p-channel MOS transistor 72 connected between a power supply node and bit line BL1 for receiving a control signal HB1 at its gate, and an n-channel MOS transistor 74 connected between bit line BL1 and a ground node for receiving a control signal LB1 at its gate. The other bit lines BL2–BLn are also provided with drive circuits having a similar configuration. Specifically, bit line BL2 is provided with a drive circuit receiving control signals HB2, LB2. Bit line BLn is correspondingly provided with a drive circuit receiving control signals HBn, LBn.

WL driver 54 includes a plurality of drive circuits respectively corresponding to word lines WL1–WLk. As a representative of a plurality of drive circuits, a drive circuit provided corresponding to WL3, denoted with a reference numeral 80, will be described in detail.

Drive circuit 80 includes a p-channel MOS transistor 82 connected between a power supply node and word line WL3 for receiving a signal PR3 at its gate, an n-channel MOS transistor 84 connected between word line WL3 and a ground node for receiving a signal WT3 at its gate, and an n-channel MOS transistor 86 connected between word line WL3 and a node receiving a read potential VR for receiving a signal RD3 at its gate.

The other word lines WL1, WL2, WL4–WLk are also provided with drive circuits having a similar configuration. Note that a drive circuit connected to word line WL1 receives control signals PR1, WT1, RD1. A drive circuit corresponding to word line WL2 receives control signals PR2, WT2, RD2. A drive circuit corresponding to word line WLk receives control signals PRk, WTk, RDk.

A write operation in memory cell 62 will now be described.

At standby, bit lines BL1–BLn are precharged to a power supply potential VCC, and word lines WL1–WLk are also precharged to power supply potential VCC so that current does not flow in each memory cell.

When a write into memory cell 62, that is programming of the anti-fuse is performed, control signal WT3 is set to H level and select word line WL3 is set to a ground potential. Then, control signal HB1 is activated to L level and bit line BL1 receives power supply potential VCC.

As a sufficient potential difference is applied at the opposite ends of anti-fuse 64, anti-fuse 64 is broken down and a current path is formed by resistor 68 as an equivalent circuit. Word lines WL1, WL2, WL4–WLk are set to power supply potential VCC that is equal to a potential of bit line BL1 by signals PR1, PR2, PR4–PRk being set to L level, so that the anti-fuses in the other memory cells connected to bit line BL1 are not broken down. Furthermore, bit lines BL2–BLn are set to the ground potential by BL driver 58 such that the other memory cells connected to word line WL3 are not broken down.

Alternatively, the resistance of the anti-fuse element may be changed by setting the selected word line at the ground potential and increasing the voltage of the non-selected bit line at a potential higher than power supply potential VCC in writing data to apply a high electric field to the anti-fuse element.

The operation of reading information held in memory cell 62 will now be described.

In reading data, word line WL3 is set to a read potential VR that is slightly lower than power supply potential VCC as a precharge level. This is set by activating control signal RD3 to H level, rendering n-channel MOS transistor 84 conductive, inactivating control signal PR3 to H level, and rendering p-channel MOS transistor 82 non-conductive.

On the other hand, a read current i5 flows from sense amplifier circuit 60 into bit line BL1. BL driver 58 is inactivated and isolated from bit lines BL1–BLn. The sense amplifier circuit passes read current i5 selectively into bit line BL1 and in resistor 68, so that the current flows via word line WL3 through n-channel MOS transistor 86 toward the node receiving read potential VR. Whether anti-fuse 64 is broken down or not can be detected by sense amplifier circuit 60 detecting whether this current flows or not.

It is noted that although in the foregoing description, the bit line or the word line is precharged to power supply potential VCC level at standby, it may be precharged to the ground potential. In other words, an equivalent potential may be set such that no potential difference occurs between a bit line and a word line.

Although in the first to fourth embodiments described above, an access diode is stacked below TMR element and the cathode of the access diode is connected to TMR element, the access diode may be stacked above TMR element and the anode of the access diode may be connected to TMR element.

Although the first to eighth embodiments described above, TMR element that is a magneto-resistance effect element is employed as a memory element and an anti-fuse element is employed as a capacitive memory element by way of illustration, the present invention is not limited thereto and may be applied to Ovonic Unified Memories (OUM) using a phase-transition element as another memory element.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device comprising:

a semiconductor substrate having a main surface;

a first conductive line positioned above the main surface of said semiconductor substrate;

a second conductive line provided to intersect said first conductive line; and a memory cell positioned at or in proximity to a region where said first conductive line and said second conductive line intersect, and having one end electrically connected to said first conductive line and the other end electrically connected to said second conductive line, wherein said memory cell includes a memory element and an access diode electrically connected in series, and said access diode includes a semiconductor layer recrystallized by melting-recrystallization and has a pn junction inside the semiconductor layer.

2. The nonvolatile semiconductor memory device according to claim 1, wherein said recrystallized semiconductor layer has a grain having a grain size larger than 100 nm.

3. The nonvolatile semiconductor memory device according to claim 1, wherein
   n of said first conductive lines (where n is an integer of two or more) are arranged approximately parallel where said semiconductor substrate is seen from above,
   k of said second conductive lines (where k is an integer of two or more) are arranged approximately parallel where said semiconductor substrate is seen from above, and
   each said memory cell is arranged at or in proximity to each of n×k intersection regions where these n first conductive lines and k second conductive lines intersect.

4. The nonvolatile semiconductor memory device according to claim 3, further comprising a circuit portion formed of a transistor, wherein
   said circuit portion and said memory cell are arranged in a stacked manner above the main surface of said semiconductor substrate.

5. The nonvolatile semiconductor memory device according to claim 3, wherein
   said memory cell is arranged in a stacked manner above the main surface of said semiconductor substrate.

6. A nonvolatile semiconductor memory device comprising:
   a semiconductor substrate having a main surface;
   a first conductive line positioned above the main surface of said semiconductor substrate;
   a second conductive line provided to intersect said first conductive line; and
   a memory cell positioned at or in proximity to a region where said first conductive line and said second conductive line intersect and having one end electrically connected to said first conductive line and the other end electrically connected to said second conductive line, wherein
   said memory cell includes a memory element and an access diode electrically connected in series, and
   said access diode has a first semiconductor layer selectively grown on the main surface of said semiconductor substrate by epitaxial growth and has a pn junction within the first semiconductor layer or at an interface between the first semiconductor layer and said semiconductor substrate.

7. The nonvolatile semiconductor memory device according to claim 6, wherein
   n of said first conductive lines (where n is an integer of two or more) are arranged approximately parallel where said semiconductor substrate is seen from above,
   k of said second conductive lines (where k is an integer of two or more) are arranged approximately parallel where said semiconductor substrate is seen from above, and
   each said memory cell is arranged at or in proximity to each of n×k intersection regions where these n first conductive lines and k second conductive lines intersect.

8. The nonvolatile semiconductor memory device according to claim 7, further comprising k line-selecting diodes each electrically connected to each of said k second conductive lines and the ground potential, wherein
   each of said line-selecting diodes has a second semiconductor layer selectively grown on the main surface of said semiconductor substrate by epitaxial growth and has a pn junction within the second semiconductor layer or at an interface between the second semiconductor layer and said semiconductor substrate.

* * * * *